US010645547B2

(12) United States Patent
Gunasekara et al.

(10) Patent No.: US 10,645,547 B2
(45) Date of Patent: May 5, 2020

(54) APPARATUS AND METHODS FOR PROVIDING WIRELESS SERVICE IN A VENUE

(71) Applicant: CHARTER COMMUNICATIONS OPERATING, LLC, St. Louis, MO (US)

(72) Inventors: Don Gunasekara, Reston, VA (US); Venkata Ramana Divvi, Herndon, VA (US); Ahmed Bencheikh, Lorton, VA (US)

(73) Assignee: CHARTER COMMUNICATIONS OPERATING, LLC, St. Louis, MO (US)

( * ) Notice: Subject to any disclaimer, the term of this patent is extended or adjusted under 35 U.S.C. 154(b) by 60 days.

(21) Appl. No.: 15/612,630

(22) Filed: Jun. 2, 2017

(65) Prior Publication Data
US 2018/0352386 A1    Dec. 6, 2018

(51) Int. Cl.
*H04W 68/00*    (2009.01)
*H04W 4/33*    (2018.01)
(Continued)

(52) U.S. Cl.
CPC .......... *H04W 4/33* (2018.02); *G06F 17/5004* (2013.01); *G06Q 10/02* (2013.01); *H04B 17/27* (2015.01);
(Continued)

(58) Field of Classification Search
CPC ... H04W 4/043; H04W 24/08; H04W 16/225; H04B 17/3912; G06F 17/5004; G06Q 10/02
See application file for complete search history.

(56) References Cited

U.S. PATENT DOCUMENTS

| 5,313,454 A | 5/1994 | Bustini et al. |
| 5,369,707 A | 11/1994 | Follendore, III |

(Continued)

FOREIGN PATENT DOCUMENTS

| EP | 1139198 A2 | 10/2001 |
| EP | 2113860 A1 | 11/2009 |

(Continued)

OTHER PUBLICATIONS

Deering et al., Internet Protocol, Version 6 (Ipv6) Specification, IETF RFC 2460 (Dec. 1998).
(Continued)

*Primary Examiner* — Barry W Taylor
(74) *Attorney, Agent, or Firm* — Gazdzinski & Associates, PC

(57) ABSTRACT

Apparatus and methods for monitoring a wireless network such as a WLAN to characterize a venue or other area. In one embodiment, the network comprises a WLAN which includes one or more access points (APs) in data communication with a controller, which in turn communicates with managed network entities via a backhaul connection. The controller s is configured to monitor the operation of the network components including the APs, as well as one or more fixed or mobile sensors. In one variant, the sensors provide data relating to wireless signal performance at their current location, which can be provided to a cloud-based evaluation process for enhanced characterization of the venue in conjunction with the AP-derived data. In the exemplary embodiment, logic operative to run on the system includes automated seating allocation suggestions, thereby providing end users with a better quality experience.

26 Claims, 20 Drawing Sheets

(51) Int. Cl.

| | | |
|---|---|---|
| *H04W 24/08* | (2009.01) | |
| *H04B 17/391* | (2015.01) | |
| *G06F 17/50* | (2006.01) | |
| *G06Q 10/02* | (2012.01) | |
| *H04B 17/27* | (2015.01) | |
| *H04B 17/29* | (2015.01) | |
| *H04W 4/38* | (2018.01) | |
| *H04W 48/20* | (2009.01) | |

(52) U.S. Cl.
CPC ......... *H04B 17/29* (2015.01); *H04B 17/3912* (2015.01); *H04W 4/38* (2018.02); *H04W 24/08* (2013.01); *H04W 48/20* (2013.01)

(56) References Cited

U.S. PATENT DOCUMENTS

| | | |
|---|---|---|
| 5,528,284 A | 6/1996 | Iwami et al. |
| 5,577,209 A | 11/1996 | Boyle et al. |
| 5,708,961 A | 1/1998 | Hylton et al. |
| 5,715,403 A | 2/1998 | Stefik |
| 5,774,170 A | 6/1998 | Hite et al. |
| 5,787,172 A | 7/1998 | Arnold |
| 5,818,438 A | 10/1998 | Howe et al. |
| 5,828,832 A | 10/1998 | Holden et al. |
| 5,862,312 A | 1/1999 | Mann et al. |
| 5,870,474 A | 2/1999 | Wasilewski et al. |
| 5,878,324 A | 3/1999 | Borth et al. |
| 5,897,635 A | 4/1999 | Torres et al. |
| 5,926,205 A | 7/1999 | Krause et al. |
| 5,935,206 A | 8/1999 | Dixon et al. |
| 5,982,412 A | 11/1999 | Nulty |
| 6,002,393 A | 12/1999 | Hite et al. |
| 6,009,103 A | 12/1999 | Woundy |
| 6,092,178 A | 7/2000 | Jindal et al. |
| 6,128,316 A | 10/2000 | Takeda et al. |
| 6,134,532 A | 10/2000 | Lazarus et al. |
| 6,148,400 A | 11/2000 | Arnold |
| 6,154,844 A | 11/2000 | Touboul et al. |
| 6,157,719 A | 12/2000 | Wasilewski et al. |
| 6,167,432 A | 12/2000 | Jiang |
| 6,167,521 A | 12/2000 | Smith et al. |
| 6,169,728 B1 | 1/2001 | Perreault et al. |
| 6,181,697 B1 | 1/2001 | Nurenberg et al. |
| 6,211,901 B1 | 4/2001 | Imajima et al. |
| 6,212,636 B1 | 4/2001 | Boyle et al. |
| 6,219,710 B1 | 4/2001 | Gray et al. |
| 6,219,840 B1 | 4/2001 | Corrigan et al. |
| 6,233,341 B1 | 5/2001 | Riggins |
| 6,233,687 B1 | 5/2001 | White |
| 6,240,553 B1 | 5/2001 | Son et al. |
| 6,249,680 B1 | 6/2001 | Wax et al. |
| 6,256,393 B1 | 7/2001 | Safadi et al. |
| 6,259,701 B1 | 7/2001 | Shur et al. |
| 6,266,421 B1 | 7/2001 | Domyo et al. |
| 6,330,609 B1 | 12/2001 | Garofalakis et al. |
| 6,353,626 B1 | 3/2002 | Sunay et al. |
| 6,378,130 B1 | 4/2002 | Adams |
| 6,434,141 B1 | 8/2002 | Oz et al. |
| 6,456,716 B1 | 9/2002 | Arnold |
| 6,463,585 B1 | 10/2002 | Hendricks et al. |
| 6,498,783 B1 | 12/2002 | Lin |
| 6,519,062 B1 | 2/2003 | Yoo |
| 6,523,696 B1 | 2/2003 | Saito et al. |
| 6,590,865 B1 | 7/2003 | Ibaraki et al. |
| 6,601,171 B1 | 7/2003 | Carter et al. |
| 6,640,145 B2 | 10/2003 | Hoffberg et al. |
| 6,657,991 B1 | 12/2003 | Akgun et al. |
| 6,687,735 B1 | 2/2004 | Logston et al. |
| 6,694,145 B2 | 2/2004 | Riikonen et al. |
| 6,711,148 B1 | 3/2004 | Hills |
| 6,718,551 B1 | 4/2004 | Swix et al. |
| 6,738,978 B1 | 5/2004 | Hendricks et al. |
| 6,742,116 B1 | 5/2004 | Matsui et al. |
| 6,760,768 B2 | 7/2004 | Holden et al. |
| 6,763,391 B1 | 7/2004 | Ludtke |
| 6,782,550 B1 | 8/2004 | Cao |
| 6,785,810 B1 | 8/2004 | Lirov et al. |
| 6,788,676 B2 | 9/2004 | Partanen et al. |
| 6,799,047 B1 | 9/2004 | Bahl et al. |
| 6,807,573 B2 | 10/2004 | Saito et al. |
| 6,813,505 B2 | 11/2004 | Walley et al. |
| 6,842,783 B1 | 1/2005 | Boivie et al. |
| 6,859,535 B1 | 2/2005 | Tatebayashi et al. |
| 6,891,841 B2 | 5/2005 | Leatherbury et al. |
| 6,898,708 B2 | 5/2005 | Hori et al. |
| 6,910,064 B1 | 6/2005 | Astarabadi et al. |
| 6,925,257 B2 | 8/2005 | Yoo |
| 6,944,150 B1 | 9/2005 | McConnell et al. |
| 6,948,183 B1 | 9/2005 | Peterka |
| 6,954,632 B2 | 10/2005 | Kobayashi |
| 6,957,261 B2 | 10/2005 | Lortz |
| 6,957,328 B2 | 10/2005 | Goodman et al. |
| 6,973,576 B2 | 12/2005 | Giobbi |
| 6,975,730 B1 | 12/2005 | Kuroiwa et al. |
| 6,985,355 B2 | 1/2006 | Allirot |
| 6,986,156 B1 | 1/2006 | Rodriguez et al. |
| 6,996,544 B2 | 2/2006 | Sellars et al. |
| 7,006,881 B1 | 2/2006 | Hoffberg et al. |
| 7,007,170 B2 | 2/2006 | Morten |
| 7,009,972 B2 | 3/2006 | Maher et al. |
| 7,016,963 B1 | 3/2006 | Judd et al. |
| 7,017,189 B1 | 3/2006 | Demello et al. |
| 7,027,460 B2 | 4/2006 | Iyer et al. |
| 7,039,048 B1 | 5/2006 | Monta et al. |
| 7,054,443 B1 | 5/2006 | Jakubowski et al. |
| 7,054,902 B2 | 5/2006 | Toporek et al. |
| 7,055,040 B2 | 5/2006 | Klemba et al. |
| 7,065,216 B1 | 6/2006 | Benaloh et al. |
| 7,068,639 B1 | 6/2006 | Varma et al. |
| 7,069,449 B2 | 6/2006 | Weaver et al. |
| 7,069,573 B1 | 6/2006 | Brooks et al. |
| 7,072,950 B2 | 7/2006 | Toft |
| 7,073,199 B1 | 7/2006 | Raley |
| 7,075,945 B2 | 7/2006 | Arsenault et al. |
| 7,086,077 B2 | 8/2006 | Giammaressi |
| 7,092,397 B1 | 8/2006 | Chandran et al. |
| 7,099,308 B2 | 8/2006 | Merrill et al. |
| 7,103,181 B2 | 9/2006 | Ananth |
| 7,106,382 B2 | 9/2006 | Shiotsu |
| 7,107,326 B1 | 9/2006 | Fijolek et al. |
| 7,143,431 B1 | 11/2006 | Eager et al. |
| 7,149,772 B1 | 12/2006 | Kalavade |
| 7,154,912 B2 | 12/2006 | Chong et al. |
| 7,165,268 B1 | 1/2007 | Moore et al. |
| 7,174,126 B2 | 2/2007 | McElhatten et al. |
| 7,174,127 B2 | 2/2007 | Otten et al. |
| 7,174,371 B2 | 2/2007 | Elo et al. |
| 7,174,385 B2 | 2/2007 | Li |
| 7,194,756 B2 | 3/2007 | Addington et al. |
| 7,209,458 B2 | 4/2007 | Ahvonen et al. |
| 7,225,333 B2 | 5/2007 | Peinado et al. |
| 7,228,427 B2 | 6/2007 | Fransdonk |
| 7,228,555 B2 | 6/2007 | Schlack |
| 7,237,112 B1 | 6/2007 | Ishiguro et al. |
| 7,242,960 B2 | 7/2007 | Van Rooyen et al. |
| 7,248,694 B2 | 7/2007 | Husemann et al. |
| 7,254,608 B2 | 8/2007 | Yeager et al. |
| 7,257,227 B2 | 8/2007 | Chen et al. |
| 7,266,726 B1 | 9/2007 | Ladd et al. |
| 7,289,534 B1 | 10/2007 | Bailey et al. |
| 7,299,502 B2 | 11/2007 | Schmeling et al. |
| 7,305,460 B2 | 12/2007 | Park |
| 7,308,415 B2 | 12/2007 | Kimbrel et al. |
| 7,313,611 B1 | 12/2007 | Jacobs et al. |
| 7,324,531 B2 | 1/2008 | Cho |
| 7,325,073 B2 | 1/2008 | Shao et al. |
| 7,330,483 B1 | 2/2008 | Peters, Jr. et al. |
| 7,330,967 B1 | 2/2008 | Pujare et al. |
| 7,334,044 B1 | 2/2008 | Allen |
| 7,340,759 B1 | 3/2008 | Rodriguez |
| 7,346,688 B2 | 3/2008 | Allen et al. |
| 7,353,543 B2 | 4/2008 | Ohmori et al. |
| 7,363,371 B2 | 4/2008 | Kirby et al. |

(56) References Cited

U.S. PATENT DOCUMENTS

| | | |
|---|---|---|
| 7,373,506 B2 | 5/2008 | Asano et al. |
| 7,376,386 B2 | 5/2008 | Phillips et al. |
| 7,376,976 B2 | 5/2008 | Fierstein et al. |
| 7,379,494 B2 | 5/2008 | Raleigh et al. |
| 7,409,546 B2 | 8/2008 | Platt |
| 7,457,520 B2 | 11/2008 | Rossetti et al. |
| 7,464,179 B2 | 12/2008 | Hodges et al. |
| 7,472,280 B2 | 12/2008 | Giobbi |
| 7,486,869 B2 | 2/2009 | Alexander et al. |
| 7,487,363 B2 | 2/2009 | Alve et al. |
| 7,506,367 B1 | 3/2009 | Ishibashi |
| 7,567,565 B2 | 7/2009 | La Joie |
| 7,577,118 B2 | 8/2009 | Haumonte et al. |
| 7,592,912 B2 | 9/2009 | Hasek et al. |
| 7,602,820 B2 | 10/2009 | Helms et al. |
| 7,673,004 B1 | 3/2010 | Sherstinsky et al. |
| 7,690,020 B2 | 3/2010 | Lebar |
| 7,693,171 B2 | 4/2010 | Gould |
| 7,707,644 B2 | 4/2010 | Choi et al. |
| 7,721,314 B2 | 5/2010 | Sincaglia et al. |
| 7,730,321 B2 | 6/2010 | Gasparini et al. |
| 7,742,074 B2 | 6/2010 | Minatogawa |
| 7,752,617 B2 | 7/2010 | Blinick et al. |
| 7,757,101 B2 | 7/2010 | Nonaka et al. |
| 7,783,891 B2 | 8/2010 | Perlin et al. |
| 7,809,942 B2 | 10/2010 | Baran et al. |
| 7,860,507 B2 | 12/2010 | Kalika et al. |
| 7,865,440 B2 | 1/2011 | Jaquette |
| 7,870,599 B2 | 1/2011 | Pemmaraju |
| 7,925,592 B1 | 4/2011 | Issa et al. |
| 7,930,558 B2 | 4/2011 | Hori |
| 7,930,715 B2 | 4/2011 | Hendricks et al. |
| 7,954,131 B2 | 5/2011 | Cholas et al. |
| 7,983,418 B2 | 7/2011 | Oyama et al. |
| 8,041,785 B2 | 10/2011 | Mazur et al. |
| 8,084,792 B2 | 12/2011 | Lehmann et al. |
| 8,166,508 B2 | 4/2012 | Mitsuji et al. |
| 8,181,262 B2 | 5/2012 | Cooper et al. |
| 8,234,387 B2 | 7/2012 | Bradley et al. |
| 8,280,982 B2 | 10/2012 | La Joie et al. |
| 8,306,634 B2 | 11/2012 | Nguyen et al. |
| 8,332,370 B2 | 12/2012 | Gattegno et al. |
| 8,341,242 B2 | 12/2012 | Dillon et al. |
| 8,442,265 B1 | 5/2013 | Bosworth et al. |
| 8,583,484 B1 | 11/2013 | Chalawsky et al. |
| 8,713,623 B2 | 4/2014 | Brooks |
| 8,842,615 B1 | 9/2014 | Kalbag et al. |
| 8,862,155 B2 | 10/2014 | Stern et al. |
| 8,866,911 B1 | 10/2014 | Sivertsen |
| 8,898,270 B1 | 11/2014 | Stack et al. |
| 9,003,436 B2 | 4/2015 | Tidwell et al. |
| 9,027,062 B2 | 5/2015 | Patel et al. |
| 9,071,859 B2 | 6/2015 | Lajoie |
| 9,115,997 B2 | 8/2015 | Poduri et al. |
| 9,215,423 B2 | 12/2015 | Kimble et al. |
| 9,300,919 B2 | 3/2016 | Cholas et al. |
| 9,609,617 B2 | 3/2017 | Arslan et al. |
| 9,648,466 B2 | 5/2017 | Aström et al. |
| 9,906,838 B2 | 2/2018 | Cronk et al. |
| 2001/0004768 A1 | 6/2001 | Hodge et al. |
| 2001/0014946 A1 | 8/2001 | Ichinoi et al. |
| 2001/0019614 A1 | 9/2001 | Madoukh et al. |
| 2001/0029581 A1 | 10/2001 | Knauft |
| 2001/0030785 A1 | 10/2001 | Pangrac et al. |
| 2001/0053223 A1 | 12/2001 | Ishibashi et al. |
| 2001/0053226 A1 | 12/2001 | Akins et al. |
| 2001/0056541 A1 | 12/2001 | Matsuzaki et al. |
| 2002/0013772 A1 | 1/2002 | Peinado |
| 2002/0026575 A1 | 2/2002 | Wheeler et al. |
| 2002/0027883 A1 | 3/2002 | Belaiche |
| 2002/0032754 A1 | 3/2002 | Logston et al. |
| 2002/0049902 A1 | 4/2002 | Rhodes |
| 2002/0054589 A1 | 5/2002 | Ethridge et al. |
| 2002/0055978 A1 | 5/2002 | Joon-Bo et al. |
| 2002/0056125 A1 | 5/2002 | Hodge et al. |
| 2002/0059619 A1 | 5/2002 | Lebar |
| 2002/0062440 A1 | 5/2002 | Akama |
| 2002/0063621 A1 | 5/2002 | Tseng et al. |
| 2002/0066033 A1 | 5/2002 | Dobbins et al. |
| 2002/0077984 A1 | 6/2002 | Ireton |
| 2002/0087976 A1 | 7/2002 | Kaplan et al. |
| 2002/0123928 A1 | 9/2002 | Eldering et al. |
| 2002/0126654 A1 | 9/2002 | Preston et al. |
| 2002/0129358 A1 | 9/2002 | Buehl et al. |
| 2002/0129378 A1 | 9/2002 | Cloonan et al. |
| 2002/0147771 A1 | 10/2002 | Traversat et al. |
| 2002/0152299 A1 | 10/2002 | Traversat et al. |
| 2002/0152393 A1 | 10/2002 | Thoma et al. |
| 2002/0183985 A1 | 12/2002 | Hori et al. |
| 2002/0188744 A1 | 12/2002 | Mani |
| 2002/0188869 A1 | 12/2002 | Patrick |
| 2002/0199105 A1 | 12/2002 | Ishiguro et al. |
| 2003/0002862 A1 | 1/2003 | Rodriguez et al. |
| 2003/0005453 A1 | 1/2003 | Rodriguez et al. |
| 2003/0007516 A1 | 1/2003 | Abramov et al. |
| 2003/0009681 A1 | 1/2003 | Harada et al. |
| 2003/0021421 A1 | 1/2003 | Yokota et al. |
| 2003/0041336 A1 | 2/2003 | Del Sordo et al. |
| 2003/0046560 A1 | 3/2003 | Inomata et al. |
| 2003/0046704 A1 | 3/2003 | Laksono et al. |
| 2003/0048380 A1 | 3/2003 | Tamura |
| 2003/0056217 A1 | 3/2003 | Brooks |
| 2003/0061619 A1 | 3/2003 | Giammaressi |
| 2003/0069965 A1 | 4/2003 | Ma et al. |
| 2003/0071117 A1 | 4/2003 | Meade |
| 2003/0074571 A1 | 4/2003 | Fujiwara et al. |
| 2003/0084003 A1 | 5/2003 | Pinkas et al. |
| 2003/0097340 A1 | 5/2003 | Okamoto et al. |
| 2003/0099212 A1 | 5/2003 | Anjum et al. |
| 2003/0114162 A1 | 6/2003 | Chheda et al. |
| 2003/0115267 A1 | 6/2003 | Hinton et al. |
| 2003/0139980 A1 | 7/2003 | Hamilton |
| 2003/0140227 A1 | 7/2003 | Asano et al. |
| 2003/0163697 A1 | 8/2003 | Pabla et al. |
| 2003/0163739 A1 | 8/2003 | Armington et al. |
| 2003/0165241 A1 | 9/2003 | Fransdonk |
| 2003/0166401 A1 | 9/2003 | Combes et al. |
| 2003/0174838 A1 | 9/2003 | Bremer |
| 2003/0179773 A1 | 9/2003 | Mocek et al. |
| 2003/0187799 A1 | 10/2003 | Sellars et al. |
| 2003/0205763 A1 | 11/2003 | Park et al. |
| 2003/0208763 A1 | 11/2003 | McElhatten et al. |
| 2003/0208767 A1 | 11/2003 | Williamson et al. |
| 2003/0217137 A1 | 11/2003 | Roese et al. |
| 2003/0217365 A1 | 11/2003 | Caputo |
| 2004/0019691 A1 | 1/2004 | Daymond et al. |
| 2004/0024688 A1 | 2/2004 | Bi et al. |
| 2004/0034877 A1 | 2/2004 | Nogues |
| 2004/0045032 A1 | 3/2004 | Cummings et al. |
| 2004/0045035 A1 | 3/2004 | Cummings et al. |
| 2004/0045037 A1 | 3/2004 | Cummings et al. |
| 2004/0078602 A1 | 4/2004 | Rothbarth et al. |
| 2004/0088558 A1 | 5/2004 | Candelore |
| 2004/0106403 A1 | 6/2004 | Mori et al. |
| 2004/0109569 A1 | 6/2004 | Ellison et al. |
| 2004/0117836 A1 | 6/2004 | Karaoguz et al. |
| 2004/0123129 A1 | 6/2004 | Ginter et al. |
| 2004/0128499 A1 | 7/2004 | Peterka et al. |
| 2004/0133907 A1 | 7/2004 | Rodriguez et al. |
| 2004/0133923 A1 | 7/2004 | Watson et al. |
| 2004/0137918 A1 | 7/2004 | Varonen et al. |
| 2004/0146006 A1 | 7/2004 | Jackson |
| 2004/0181800 A1 | 9/2004 | Rakib et al. |
| 2004/0187159 A1 | 9/2004 | Gaydos et al. |
| 2004/0193609 A1 | 9/2004 | Phan et al. |
| 2004/0193680 A1 | 9/2004 | Gibbs et al. |
| 2004/0224425 A1 | 11/2004 | Gjerde et al. |
| 2004/0240478 A1 | 12/2004 | Goren et al. |
| 2004/0250273 A1 | 12/2004 | Swix et al. |
| 2004/0260798 A1 | 12/2004 | Addington et al. |
| 2004/0261093 A1 | 12/2004 | Rebaud et al. |
| 2004/0268386 A1 | 12/2004 | Logan et al. |
| 2005/0005287 A1 | 1/2005 | Claussen |
| 2005/0007278 A1 | 1/2005 | Anson et al. |

(56) References Cited

U.S. PATENT DOCUMENTS

| | | |
|---|---|---|
| 2005/0015810 A1 | 1/2005 | Gould et al. |
| 2005/0021985 A1 | 1/2005 | Ono et al. |
| 2005/0022227 A1 | 1/2005 | Shen et al. |
| 2005/0034171 A1 | 2/2005 | Benya |
| 2005/0039205 A1 | 2/2005 | Riedl |
| 2005/0039212 A1 | 2/2005 | Baran et al. |
| 2005/0049886 A1 | 3/2005 | Grannan et al. |
| 2005/0055220 A1 | 3/2005 | Lee et al. |
| 2005/0060742 A1 | 3/2005 | Riedl et al. |
| 2005/0060745 A1 | 3/2005 | Riedl et al. |
| 2005/0065888 A1 | 3/2005 | Benaloh |
| 2005/0086683 A1 | 4/2005 | Meyerson |
| 2005/0086691 A1 | 4/2005 | Dudkiewicz et al. |
| 2005/0091173 A1 | 4/2005 | Alve |
| 2005/0097006 A1 | 5/2005 | Nyako |
| 2005/0108763 A1 | 5/2005 | Baran et al. |
| 2005/0111844 A1 | 5/2005 | Compton et al. |
| 2005/0114686 A1 | 5/2005 | Ball et al. |
| 2005/0114900 A1 | 5/2005 | Ladd et al. |
| 2005/0125832 A1 | 6/2005 | Jost et al. |
| 2005/0138357 A1 | 6/2005 | Swenson et al. |
| 2005/0168323 A1 | 8/2005 | Lenoir et al. |
| 2005/0169468 A1 | 8/2005 | Fahrny et al. |
| 2005/0172127 A1 | 8/2005 | Hartung et al. |
| 2005/0176444 A1 | 8/2005 | Tanaka |
| 2005/0177740 A1 | 8/2005 | Athaide et al. |
| 2005/0177741 A1 | 8/2005 | Chen et al. |
| 2005/0177855 A1 | 8/2005 | Maynard et al. |
| 2005/0182931 A1 | 8/2005 | Robert et al. |
| 2005/0188210 A1 | 8/2005 | Perlin et al. |
| 2005/0190912 A1 | 9/2005 | Hopkins et al. |
| 2005/0195975 A1 | 9/2005 | Kawakita |
| 2005/0198693 A1 | 9/2005 | Choi et al. |
| 2005/0268107 A1 | 12/2005 | Harris et al. |
| 2005/0271133 A1 | 12/2005 | Waxman |
| 2005/0273629 A1 | 12/2005 | Abrams et al. |
| 2005/0278259 A1 | 12/2005 | Gunaseelan et al. |
| 2005/0289618 A1 | 12/2005 | Hardin |
| 2005/0289619 A1 | 12/2005 | Melby |
| 2006/0002551 A1 | 1/2006 | Brown et al. |
| 2006/0004662 A1 | 1/2006 | Nadalin et al. |
| 2006/0008256 A1 | 1/2006 | Khedouri et al. |
| 2006/0020786 A1 | 1/2006 | Helms et al. |
| 2006/0020950 A1 | 1/2006 | Ladd et al. |
| 2006/0021004 A1 | 1/2006 | Moran et al. |
| 2006/0036750 A1 | 2/2006 | Ladd et al. |
| 2006/0041903 A1 | 2/2006 | Kahn et al. |
| 2006/0047801 A1 | 3/2006 | Haag et al. |
| 2006/0047957 A1 | 3/2006 | Helms et al. |
| 2006/0064583 A1 | 3/2006 | Birnbaum et al. |
| 2006/0095940 A1 | 5/2006 | Yearwood |
| 2006/0130099 A1 | 6/2006 | Rooyen |
| 2006/0130107 A1 | 6/2006 | Gonder et al. |
| 2006/0130113 A1 | 6/2006 | Carlucci et al. |
| 2006/0136964 A1 | 6/2006 | Diez et al. |
| 2006/0137005 A1 | 6/2006 | Park |
| 2006/0137015 A1 | 6/2006 | Fahrny et al. |
| 2006/0148362 A1 | 7/2006 | Bridges |
| 2006/0149850 A1 | 7/2006 | Bowman |
| 2006/0154674 A1 | 7/2006 | Landschaft et al. |
| 2006/0161635 A1 | 7/2006 | Lamkin et al. |
| 2006/0165090 A1 | 7/2006 | Kalliola et al. |
| 2006/0165197 A1 | 7/2006 | Morita et al. |
| 2006/0168219 A1 | 7/2006 | Ahluwalia et al. |
| 2006/0171390 A1 | 8/2006 | La Joie |
| 2006/0171423 A1 | 8/2006 | Helms et al. |
| 2006/0179138 A1 | 8/2006 | Van Gassel et al. |
| 2006/0184972 A1 | 8/2006 | Rafey et al. |
| 2006/0187900 A1 | 8/2006 | Akbar |
| 2006/0200856 A1 | 9/2006 | Salowey et al. |
| 2006/0206712 A1 | 9/2006 | Dillaway et al. |
| 2006/0209799 A1 | 9/2006 | Gallagher et al. |
| 2006/0212400 A1 | 9/2006 | Kamperman et al. |
| 2006/0218604 A1 | 9/2006 | Riedl et al. |
| 2006/0218632 A1 | 9/2006 | Corley et al. |
| 2006/0236131 A1 | 10/2006 | Vauclair |
| 2006/0248553 A1 | 11/2006 | Mikkelson et al. |
| 2006/0248555 A1 | 11/2006 | Eldering |
| 2006/0253328 A1 | 11/2006 | Kohli et al. |
| 2006/0253864 A1 | 11/2006 | Easty |
| 2006/0259927 A1 | 11/2006 | Acharya et al. |
| 2006/0277569 A1 | 12/2006 | Smith |
| 2006/0291506 A1 | 12/2006 | Cain |
| 2007/0011335 A1 | 1/2007 | Burns et al. |
| 2007/0019645 A1 | 1/2007 | Menon |
| 2007/0022459 A1 | 1/2007 | Gaebel, Jr. et al. |
| 2007/0022469 A1 | 1/2007 | Cooper et al. |
| 2007/0033531 A1 | 2/2007 | Marsh |
| 2007/0046791 A1 | 3/2007 | Wang et al. |
| 2007/0049245 A1 | 3/2007 | Lipman |
| 2007/0067851 A1 | 3/2007 | Fernando et al. |
| 2007/0076728 A1 | 4/2007 | Rieger et al. |
| 2007/0079381 A1 | 4/2007 | Hartung et al. |
| 2007/0089127 A1 | 4/2007 | Flickinger et al. |
| 2007/0094691 A1 | 4/2007 | Gazdzinski |
| 2007/0098178 A1 | 5/2007 | Raikar |
| 2007/0113243 A1 | 5/2007 | Brey |
| 2007/0115900 A1 | 5/2007 | Liang et al. |
| 2007/0121678 A1 | 5/2007 | Brooks et al. |
| 2007/0124488 A1 | 5/2007 | Baum et al. |
| 2007/0157295 A1 | 7/2007 | Mangalore et al. |
| 2007/0174888 A1 | 7/2007 | Rubinstein |
| 2007/0192615 A1 | 8/2007 | Varghese et al. |
| 2007/0195727 A1 | 8/2007 | Kinder et al. |
| 2007/0204314 A1 | 8/2007 | Hasek et al. |
| 2007/0206799 A1 | 9/2007 | Wingert et al. |
| 2007/0209059 A1 | 9/2007 | Moore et al. |
| 2007/0217436 A1 | 9/2007 | Markley et al. |
| 2007/0219910 A1 | 9/2007 | Martinez |
| 2007/0220024 A1 | 9/2007 | Putterman et al. |
| 2007/0233857 A1 | 10/2007 | Cheng et al. |
| 2007/0250872 A1 | 10/2007 | Dua |
| 2007/0250880 A1 | 10/2007 | Hainline |
| 2007/0261116 A1 | 11/2007 | Prafullchandra et al. |
| 2007/0266395 A1 | 11/2007 | Lee et al. |
| 2007/0276925 A1 | 11/2007 | La Joie et al. |
| 2007/0276926 A1 | 11/2007 | LaJoie et al. |
| 2007/0294178 A1 | 12/2007 | Pinder et al. |
| 2008/0008321 A1 | 1/2008 | Gagnon et al. |
| 2008/0008371 A1 | 1/2008 | Woods et al. |
| 2008/0021836 A1 | 1/2008 | Lao |
| 2008/0022012 A1 | 1/2008 | Wang |
| 2008/0037493 A1 | 2/2008 | Morton |
| 2008/0046542 A1 | 2/2008 | Sano et al. |
| 2008/0059804 A1 | 3/2008 | Shah et al. |
| 2008/0066112 A1 | 3/2008 | Bailey et al. |
| 2008/0084887 A1* | 4/2008 | Proctor .................. H04W 4/029 370/395.21 |
| 2008/0091805 A1 | 4/2008 | Malaby et al. |
| 2008/0091807 A1 | 4/2008 | Strub et al. |
| 2008/0098212 A1 | 4/2008 | Helms et al. |
| 2008/0101460 A1 | 5/2008 | Rodriguez |
| 2008/0103976 A1 | 5/2008 | Read et al. |
| 2008/0103977 A1 | 5/2008 | Khosravy et al. |
| 2008/0104634 A1 | 5/2008 | Gajdos et al. |
| 2008/0109307 A1 | 5/2008 | Ullah |
| 2008/0112405 A1 | 5/2008 | Cholas et al. |
| 2008/0117920 A1 | 5/2008 | Tucker |
| 2008/0123862 A1 | 5/2008 | Rowley |
| 2008/0133551 A1 | 6/2008 | Wensley et al. |
| 2008/0134274 A1 | 6/2008 | Derrenberger et al. |
| 2008/0141317 A1 | 6/2008 | Radloff et al. |
| 2008/0141353 A1 | 6/2008 | Brown |
| 2008/0148362 A1 | 6/2008 | Gilder et al. |
| 2008/0155059 A1 | 6/2008 | Hardin et al. |
| 2008/0155614 A1 | 6/2008 | Cooper et al. |
| 2008/0162353 A1 | 7/2008 | Tom et al. |
| 2008/0165460 A1 | 7/2008 | Whitby-Strevens |
| 2008/0177998 A1 | 7/2008 | Apsangi et al. |
| 2008/0182591 A1 | 7/2008 | Krikorian |
| 2008/0183705 A1 | 7/2008 | Shivaji-Rao et al. |
| 2008/0188253 A1* | 8/2008 | Chong .................. H04W 16/22 455/504 |
| 2008/0192820 A1 | 8/2008 | Brooks et al. |

(56) References Cited

U.S. PATENT DOCUMENTS

| | | |
|---|---|---|
| 2008/0212945 A1 | 9/2008 | Khedouri et al. |
| 2008/0222684 A1 | 9/2008 | Mukraj et al. |
| 2008/0229354 A1 | 9/2008 | Morris et al. |
| 2008/0235746 A1 | 9/2008 | Peters et al. |
| 2008/0244667 A1 | 10/2008 | Osborne |
| 2008/0256510 A1 | 10/2008 | Auerbach |
| 2008/0270307 A1 | 10/2008 | Olson et al. |
| 2008/0273591 A1 | 11/2008 | Brooks et al. |
| 2008/0282299 A1 | 11/2008 | Koat et al. |
| 2008/0288618 A1 | 11/2008 | Vardi et al. |
| 2009/0007234 A1 | 1/2009 | Birger et al. |
| 2009/0013210 A1 | 1/2009 | McIntosh et al. |
| 2009/0025027 A1 | 1/2009 | Craner |
| 2009/0025075 A1 | 1/2009 | Chow et al. |
| 2009/0028182 A1 | 1/2009 | Brooks et al. |
| 2009/0031371 A1 | 1/2009 | Munsell et al. |
| 2009/0064251 A1 | 3/2009 | Savoor et al. |
| 2009/0083813 A1 | 3/2009 | Dolce et al. |
| 2009/0094648 A1 | 4/2009 | Patel et al. |
| 2009/0098861 A1 | 4/2009 | Kalliola et al. |
| 2009/0100459 A1 | 4/2009 | Riedl et al. |
| 2009/0102983 A1 | 4/2009 | Malone et al. |
| 2009/0116587 A1 | 5/2009 | Kwasinski et al. |
| 2009/0119751 A1 | 5/2009 | Koga |
| 2009/0125374 A1 | 5/2009 | Deaton et al. |
| 2009/0151006 A1 | 6/2009 | Saeki et al. |
| 2009/0170479 A1 | 7/2009 | Jarenskog |
| 2009/0182815 A1 | 7/2009 | Czechowski, III et al. |
| 2009/0185576 A1 | 7/2009 | Kisel et al. |
| 2009/0187939 A1 | 7/2009 | Lajoie |
| 2009/0201917 A1 | 8/2009 | Maes et al. |
| 2009/0210899 A1 | 8/2009 | Lawrence-Apfelbaum et al. |
| 2009/0210912 A1 | 8/2009 | Cholas et al. |
| 2009/0225760 A1 | 9/2009 | Foti |
| 2009/0244290 A1 | 10/2009 | McKelvey et al. |
| 2009/0265750 A1 | 10/2009 | Jones et al. |
| 2009/0282241 A1 | 11/2009 | Prafullchandra et al. |
| 2009/0282449 A1 | 11/2009 | Lee |
| 2009/0292922 A1 | 11/2009 | Park |
| 2009/0293101 A1 | 11/2009 | Carter et al. |
| 2010/0014496 A1 | 1/2010 | Kalika et al. |
| 2010/0030578 A1 | 2/2010 | Siddique et al. |
| 2010/0031299 A1 | 2/2010 | Harrang et al. |
| 2010/0042478 A1 | 2/2010 | Reisman |
| 2010/0070867 A1 | 3/2010 | Lemmers |
| 2010/0081416 A1 | 4/2010 | Cohen |
| 2010/0082983 A1 | 4/2010 | Shah et al. |
| 2010/0083329 A1 | 4/2010 | Joyce et al. |
| 2010/0088236 A1 | 4/2010 | Karabulut et al. |
| 2010/0088292 A1 | 4/2010 | Tirpak et al. |
| 2010/0106846 A1 | 4/2010 | Noldus et al. |
| 2010/0122288 A1 | 5/2010 | Minter et al. |
| 2010/0131973 A1 | 5/2010 | Dillon et al. |
| 2010/0138900 A1 | 6/2010 | Peterka et al. |
| 2010/0150027 A1 | 6/2010 | Atwal et al. |
| 2010/0151816 A1 | 6/2010 | Besehanic et al. |
| 2010/0159951 A1 | 6/2010 | Shkedi |
| 2010/0167743 A1 | 7/2010 | Palanki et al. |
| 2010/0169977 A1 | 7/2010 | Dasher et al. |
| 2010/0185855 A1 | 7/2010 | Margolus et al. |
| 2010/0198888 A1 | 8/2010 | Blomstedt et al. |
| 2010/0217837 A1 | 8/2010 | Ansari et al. |
| 2010/0251305 A1 | 9/2010 | Kimble et al. |
| 2010/0287609 A1 | 11/2010 | Gonzalez et al. |
| 2010/0309051 A1 | 12/2010 | Moshfeghi |
| 2010/0312826 A1 | 12/2010 | Sarosi et al. |
| 2010/0313225 A1 | 12/2010 | Cholas et al. |
| 2010/0313226 A1 | 12/2010 | Cholas et al. |
| 2011/0015989 A1 | 1/2011 | Tidwell et al. |
| 2011/0034179 A1 | 2/2011 | David et al. |
| 2011/0071841 A1 | 3/2011 | Fomenko et al. |
| 2011/0078721 A1 | 3/2011 | Wang et al. |
| 2011/0093900 A1 | 4/2011 | Patel et al. |
| 2011/0098076 A1 | 4/2011 | Kim et al. |
| 2011/0103374 A1 | 5/2011 | Lajoie et al. |
| 2011/0107389 A1 | 5/2011 | Chakarapani |
| 2011/0112717 A1 | 5/2011 | Resner |
| 2011/0116428 A1 | 5/2011 | Seong |
| 2011/0138064 A1 | 6/2011 | Rieger et al. |
| 2011/0163888 A1 | 7/2011 | Goedde |
| 2011/0164753 A1 | 7/2011 | Dubhashi et al. |
| 2011/0167440 A1 | 7/2011 | Greenfield |
| 2011/0169977 A1 | 7/2011 | Masuda |
| 2011/0197070 A1 | 8/2011 | Mizrah |
| 2011/0206136 A1 | 8/2011 | Bekedam et al. |
| 2011/0213688 A1 | 9/2011 | Santos et al. |
| 2011/0219229 A1 | 9/2011 | Cholas et al. |
| 2011/0225619 A1 | 9/2011 | Kesireddy et al. |
| 2011/0235577 A1 | 9/2011 | Hintermeister et al. |
| 2011/0247029 A1 | 10/2011 | Yarvis et al. |
| 2011/0252236 A1 | 10/2011 | De Atley et al. |
| 2011/0252243 A1 | 10/2011 | Brouwer et al. |
| 2011/0286437 A1 | 11/2011 | Austin et al. |
| 2012/0008786 A1 | 1/2012 | Cronk et al. |
| 2012/0011567 A1 | 1/2012 | Cronk et al. |
| 2012/0023535 A1 | 1/2012 | Brooks et al. |
| 2012/0030716 A1 | 2/2012 | Zhang et al. |
| 2012/0046049 A1 | 2/2012 | Curtis et al. |
| 2012/0054785 A1 | 3/2012 | Yang et al. |
| 2012/0079531 A1 | 3/2012 | Hasek et al. |
| 2012/0079546 A1 | 3/2012 | Kalidindi et al. |
| 2012/0115501 A1 | 5/2012 | Zheng |
| 2012/0151549 A1 | 6/2012 | Kumar et al. |
| 2012/0159603 A1 | 6/2012 | Queck |
| 2012/0167173 A1 | 6/2012 | Nadalin et al. |
| 2012/0202447 A1 | 8/2012 | Edge et al. |
| 2012/0203822 A1 | 8/2012 | Floyd et al. |
| 2012/0222081 A1 | 8/2012 | Schaefer et al. |
| 2012/0278654 A1 | 11/2012 | Shen et al. |
| 2012/0291062 A1 | 11/2012 | Pearson et al. |
| 2012/0302259 A1 | 11/2012 | Busch |
| 2012/0330759 A1 | 12/2012 | Aggarwal et al. |
| 2013/0016648 A1 | 1/2013 | Koskela et al. |
| 2013/0017794 A1 | 1/2013 | Kloper et al. |
| 2013/0045681 A1 | 2/2013 | Dua |
| 2013/0046623 A1 | 2/2013 | Moritz et al. |
| 2013/0081097 A1 | 3/2013 | Park et al. |
| 2013/0095848 A1 | 4/2013 | Gold et al. |
| 2013/0100818 A1 | 4/2013 | Qiu et al. |
| 2013/0132789 A1 | 5/2013 | Watford et al. |
| 2013/0145152 A1 | 6/2013 | Maino et al. |
| 2013/0176885 A1 | 7/2013 | Lee et al. |
| 2013/0235774 A1 | 9/2013 | Jo et al. |
| 2013/0254787 A1 | 9/2013 | Cox et al. |
| 2013/0260820 A1 | 10/2013 | Schmandt et al. |
| 2013/0308622 A1 | 11/2013 | Uhlik |
| 2013/0317892 A1 | 11/2013 | Heerboth et al. |
| 2013/0347089 A1 | 12/2013 | Bailey et al. |
| 2014/0010219 A1 | 1/2014 | Dor et al. |
| 2014/0046624 A1 | 2/2014 | Miettinen |
| 2014/0066098 A1 | 3/2014 | Stern et al. |
| 2014/0106779 A1* | 4/2014 | Arslan .................. G01S 5/0252 455/456.1 |
| 2014/0177611 A1 | 6/2014 | Corrales Lopez |
| 2014/0213256 A1 | 7/2014 | Meylan et al. |
| 2014/0215506 A1 | 7/2014 | Kalmes et al. |
| 2014/0242991 A1 | 8/2014 | Yanover et al. |
| 2014/0274110 A1* | 9/2014 | Mehta .................. H04W 4/043 455/456.1 |
| 2014/0280901 A1 | 9/2014 | Balachandran et al. |
| 2014/0281489 A1 | 9/2014 | Peterka et al. |
| 2014/0282721 A1 | 9/2014 | Kuncl et al. |
| 2014/0283137 A1 | 9/2014 | Rebaud et al. |
| 2014/0288980 A1* | 9/2014 | Lee ....................... G06Q 10/02 705/5 |
| 2014/0309868 A1 | 10/2014 | Ricci |
| 2014/0328257 A1 | 11/2014 | Kamlani |
| 2014/0359649 A1 | 12/2014 | Cronk et al. |
| 2015/0036514 A1 | 2/2015 | Zhu et al. |
| 2015/0058883 A1 | 2/2015 | Tidwell et al. |
| 2015/0058909 A1 | 2/2015 | Miller et al. |
| 2015/0094098 A1 | 4/2015 | Stern et al. |
| 2015/0103685 A1 | 4/2015 | Butchko et al. |
| 2015/0106501 A1 | 4/2015 | Malets et al. |

(56) References Cited

U.S. PATENT DOCUMENTS

| | | | |
|---|---|---|---|
| 2015/0106846 A1 | 4/2015 | Chen et al. | |
| 2015/0146537 A1 | 5/2015 | Panaitopol et al. | |
| 2015/0156129 A1 | 6/2015 | Tsuruoka et al. | |
| 2015/0189377 A1 | 7/2015 | Wheatley et al. | |
| 2015/0215367 A1 | 7/2015 | Hayes et al. | |
| 2015/0288617 A1 | 10/2015 | Dasher et al. | |
| 2015/0288732 A1 | 10/2015 | Phillips et al. | |
| 2015/0305082 A1 | 10/2015 | Elliott et al. | |
| 2015/0365833 A1 | 12/2015 | Stafford et al. | |
| 2016/0019103 A1 | 1/2016 | Basra | |
| 2016/0066234 A1 | 3/2016 | Cho et al. | |
| 2016/0119939 A1 | 4/2016 | Himayat | |
| 2016/0127185 A1 | 5/2016 | McAllister | |
| 2016/0242071 A1 | 8/2016 | Chen et al. | |
| 2016/0261986 A1* | 9/2016 | Nord | H04W 4/023 |
| 2016/0301525 A1 | 10/2016 | Canard et al. | |
| 2016/0315672 A1 | 10/2016 | Patwardhan | |
| 2016/0316334 A1* | 10/2016 | Lection | H04W 4/029 |
| 2017/0099327 A1 | 4/2017 | Negalaguli et al. | |
| 2017/0164378 A1 | 6/2017 | Gunasekara et al. | |
| 2017/0164416 A1 | 6/2017 | Yeddala et al. | |
| 2017/0208632 A1 | 7/2017 | Gunasekara et al. | |
| 2017/0223536 A1 | 8/2017 | Gupta et al. | |
| 2017/0257750 A1 | 9/2017 | Gunasekara et al. | |
| 2017/0265084 A1 | 9/2017 | Clegg | |
| 2017/0303138 A1* | 10/2017 | Barmettler | H04W 16/18 |
| 2017/0366983 A1 | 12/2017 | Gunasekara et al. | |
| 2018/0132060 A1* | 5/2018 | Dhulipalla | H04W 4/029 |
| 2018/0218464 A1* | 8/2018 | Anzalota | G06Q 50/14 |

FOREIGN PATENT DOCUMENTS

| | | |
|---|---|---|
| GB | 2381709 A | 5/2003 |
| JP | H08263440 A | 10/1996 |
| JP | 2000156676 A | 6/2000 |
| JP | 2000332746 A | 11/2000 |
| JP | 2001243707 A | 9/2001 |
| JP | 2001274786 A | 10/2001 |
| JP | 2001274788 A | 10/2001 |
| JP | 2001285821 A | 10/2001 |
| JP | 2002163396 A | 6/2002 |
| JP | 2002352094 A | 12/2002 |
| JP | 2003058657 A | 2/2003 |
| JP | 2003162600 A | 6/2003 |
| JP | 2003233690 A | 8/2003 |
| JP | 2003248508 A | 9/2003 |
| JP | 2003296484 A | 10/2003 |
| JP | 2003348508 A | 12/2003 |
| JP | 2004030111 A | 1/2004 |
| JP | 2004072721 A | 3/2004 |
| JP | 2004120736 A | 4/2004 |
| JP | 2004120738 A | 4/2004 |
| JP | 2004303111 A | 10/2004 |
| JP | 2005506627 A | 3/2005 |
| JP | 2005519365 A | 6/2005 |
| JP | 2005519501 A | 6/2005 |
| JP | 2005339093 A | 12/2005 |
| JP | 2006185473 A | 7/2006 |
| JP | 2006311267 A | 11/2006 |
| JP | 2007020144 A | 1/2007 |
| JP | 2008005047 A | 1/2008 |
| JP | 2008015936 A | 1/2008 |
| JP | 2008021293 A | 1/2008 |
| JP | 2008507905 A | 3/2008 |
| JP | 2008167018 A | 7/2008 |
| JP | 2008186272 A | 8/2008 |
| JP | 2008206039 A | 9/2008 |
| JP | 2009071786 A | 4/2009 |
| JP | 2009515238 A | 4/2009 |
| JP | 2009176060 A | 8/2009 |
| JP | 2009211632 A | 9/2009 |
| JP | 2010502109 A | 1/2010 |
| JP | 2010079902 A | 4/2010 |
| JP | 2012505436 A | 3/2012 |
| JP | 2012523614 A | 10/2012 |
| WO | WO-0103410 A1 | 1/2001 |
| WO | WO-0110125 A1 | 2/2001 |
| WO | WO-0137479 A1 | 5/2001 |
| WO | WO-0169842 A1 | 9/2001 |
| WO | WO-0177778 A2 | 10/2001 |
| WO | WO-0213032 A1 | 2/2002 |
| WO | WO-0221841 A1 | 3/2002 |
| WO | WO-0242966 A1 | 5/2002 |
| WO | WO-02080556 A1 | 10/2002 |
| WO | WO-03038704 A1 | 5/2003 |
| WO | WO-03087799 A1 | 10/2003 |
| WO | WO-03093944 A2 | 11/2003 |
| WO | WO-2004027622 A2 | 4/2004 |
| WO | WO-2005015422 A1 | 2/2005 |
| WO | WO-2006020141 A2 | 2/2006 |
| WO | WO-2008080556 A1 | 7/2008 |
| WO | WO-2009020476 A2 | 2/2009 |
| WO | WO-2012021245 A1 | 2/2012 |

OTHER PUBLICATIONS

Internet Protocol DARPA Internet Program Protocol Specification, IETF RFC 791 (Sep. 1981).

5C Digital Transmission Content Protection White Paper, Hitachi, Ltd., et al., dated Jul. 14, 1998, 15 pages.

Cantor, et al., Assertions and Protocols for the OASIS Security Assertion Markup Language (SAML) V2.0, OASIS Standard, Mar. 15, 2005. Document ID: saml-core-2.0-os (http://docs.oasis-open.org/security/saml/v2.0/saml-core-2.0-os.pdf).

Cantor, et al., Bindings for the OASIS Security Assertion Markup Language (SAML) V2.0, OASIS Standard, Mar. 2005, Document ID saml-bindings-2.0-os ,(http://docs.oasis-open.org/security/saml/v2.0/saml-bindings-2.0-os.pdf).

Cisco Intelligent Network Architecture for Digital Video—SCTE Cable-Tec Expo 2004 information page, Orange County Convention Center, Jun. 2004, 24 pages.

DCAS Authorized Service Domain, Version 1.2, dated Nov. 4, 2008, 58 pages.

DCAS Licensed Specification Abstracts, CableLabs Confidential Information, Jan. 12, 2006, 4 pages.

DVB (Digital Video Broadcasting), DVB Document A045 Rev. 3, Jul. 2004, "Head-end Implementation of SimulCrypt," 289 pages.

DVB (Digital Video Broadcasting); DVB SimulCrypt; Part 1: "Head-end architecture and synchronization" Technical Specification—ETSI TS 101 197 V1.2.1 (Feb. 2002), 40 pages.

Federal Information Processing Standards Publication, US FIPS PUB 197, Nov. 26, 2001, "Advanced Encryption Standards (AES)," 47 pages.

Gomez, Conserving Transmission Power in Wireless Ad Hoc Networks, 2001, Network Protocols.

Gupta V., et al., "Bit-Stuffing in 802.11 Beacon Frame: Embedding Non-Standard Custom Information," International Journal of Computer Applications, Feb. 2013, vol. 63 (2), pp. 6-12.

High-bandwidth Digital Content Protection System, Revision 1.091, dated Apr. 22, 2003, Digital Content Protection LLC Draft, 78 pages.

Kanouff, Communications Technology: Next-Generation Bandwidth Management—The Evolution of the Anything-to-Anywhere Network, 8 pages, Apr. 1, 2004.

Marusic, et al., "Share it!—Content Transfer in Home-to-Home Networks." IEEE MELECON 2004, May 12-15, 2004, Dubrovnik, Croatia.

Media Server; 1 Device Template Version 1.01 Jun. 25, 2002.

Miao, et al., "Distributed interference-aware energy-efficient power optimization," IEEE Transactions on Wireless Communications, Apr. 2011, vol. 10 (4), pp. 1323-1333.

Motorola DOCSIS Cable Module DCM 2000 specifications, 4 pages, copyright 2001.

OpenCable Application Platform Specification, OCAP 2.0 Profile, OC-SP-OCAP2.0-I01-020419, Apr. 19, 2002.

OpenCable Application Platform Specifications, OCAP Extensions, OC-SP-OCAP—HNEXT-I03-080418, 2005-2008.

OpenCable Host Device, Core Functional Requirements, OC-SP-HOST-CFR-I13-030707, Jul. 7, 2003.

(56) References Cited

OTHER PUBLICATIONS

OpenCable, HOST-POD Interface Specification, OC-SP-HOSTPOD-IF-I13-030707, Jul. 7, 2003.

OpenCable Specification, Home Networking Protocol 2.0, OC-SP-HNP2.0-I01-08418, 2007.

OpenCable Specifications, Home Networking Security Specification, OC-SP-HN-SEC-DO1-081027, draft (Oct. 27, 2008).

OpenVision Session Resource Manager—Open Standards-Based Solution Optimizes Network Resources by Dynamically Assigning Bandwidth in the Delivery of Digital Services article, 2 pages, (copyright 2006), (http://www.imake.com/hopenvision).

Primergy BX300 Switch Blade user's manual, Fujitsu Corp., Sep. 30, 2002, first edition, pp. 1 to 20.

Real System Media Commerce Suite (Technical White Paper), at http://docs.real.com/docs/drm/DRM.sub-WP1.pdf, 12 pages, Nov. 2001.

Van Moffaert, A., et al. ("Digital Rights Management: DRM is a key enabler for the future growth of the broadband access market and the telecom/networking market in general", Alcatel Telecommunications Review, Alcatel, Paris Cedex FR, Apr. 1, 2003, XP007005930ISSN; 8 pages.

Zhang, et al., "A Flexible Content Protection System for Media-On-Demand" Multimedia Software Engineering, 2002 Proceedings. Fourth International Symposium on Dec. 11-13, 2002, Piscataway, NJ, USAA, IEEE, Dec. 11, 2002, pp. 272-277, XP010632760ISBN: 978-07695-1857-2.

\* cited by examiner

APPARATUS AND METHODS FOR PROVIDING WIRELESS SERVICE IN A VENUE

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Technological Field

The present disclosure relates generally to the field of wireless networks, and specifically in one or more exemplary embodiments to apparatus and methods for monitoring radio frequency (RF) conditions in a venue and determining wireless coverage as a function of location and/or time within the venue via, inter alia, utilization of an associated managed content provider network.

2. Description of Related Technology

In many public and private locations/venues, such as e.g., sports arenas, conference or convention centers, hotels, concert halls, airports, etc., wireless networks are provided for connection of end-user devices (e.g., mobile and/or personal computing devices such as smartphones, tablets, laptops, etc.) to data delivery networks, including unmanaged networks such as the Internet. One technology that enables a user to engage in such wireless communication is Wi-Fi® (IEEE Std. 802.11), which has become the de facto standard for wireless networking in consumer electronics. Wi-Fi enables convenient access to networks (e.g., the Internet, intranets, other interconnected devices) via at least one access point ("AP," also colloquially referred to as "hotspots") to client devices within the AP's coverage area.

Typical wireless APs have an effective connectivity range on the order of one hundred (100) feet, depending on factors such as the presence or absence of buildings or other structures (and their materials of construction), and other interfering emitters. The optimal location of the wireless interface (e.g., an access point (AP), wireless access point (WAP), router, etc.) is sometimes a three-dimensional spatial problem, as client devices that will communicate with the wireless interface may be located on the same floor of a building or structure (in any azimuth direction), and also on different floors above and below the wireless interface's position. In addition, at any of the locations where a client device is located, other local factors affecting the device's ability to communicate with the wireless interface may also exist, such as radio frequency (RF) signal path loss/attenuation (such as due to interposed materials, instruments, etc.), ionosphere signal reflections and refractions (e.g., atmospheric ducting), and fading (which degrades the radio signals due to rapid fluctuations of the amplitudes, phases, or multipath delays of a radio signal over a short period or short travel distance due to interfering environment). Moreover, interference from other RF or electromagnetic sources such as other wireless-enabled devices in the same frequency band, non-communication interference sources (e.g., microwave ovens), solar radiation, and so forth can further attenuate or disrupt WLAN and similar signals.

Additionally, the characteristics of a wireless interface such as an AP (as well as the corresponding client devices) are such that they may have directional RF properties due to, e.g., variances in antenna gain in different directions, obstruction by internal components of the device, etc.

In the exemplary context of a concert venue (e.g., music hall or the like), the construction of the venue including the stage, electrical or electronic musical instruments or equipment on the stage or proximate thereto, and other RF or electromagnetic sources in the audience or on stage have an effect on the spatial distribution of RF signals around the stage (and the venue generally). For example, the construction of the stage involves the use of different materials such as concrete, brick, dry-wall, wood, glass, metal framing, etc., that each may have different attenuation properties at exemplary radio frequencies used in wireless systems (e.g., 2.4 GHz, 3.6 GHz and 5 GHz). Also, signals at these frequencies create multi-path propagation throughout the venue, especially with other factors of interference and at increasing distances from the wireless interface, and can be quite unpredictable. Thus, all the locations within the venue (including those where user wireless devices may be used) are individually different in terms of the propagation path to and from the wireless interface, and hence signal strength at that location.

Currently, seating allocations and ticket prices within venues do not take into account wireless coverage; while some venues may have "cell free" zones or the like (i.e., areas where one can or cannot use their wireless device), such considerations are based on other factors, such as not disturbing others within the venue. Even in venues where there is no assigned seating (such as for example a convention center), there is no consideration of particular locations within the venue and the variations in RF signal performance as a function thereof. Typically, in the case of Wi-Fi, the venue event organizer will place several APs throughout various locations in the venue, such that at least a majority of two-dimensional area within the venue (i.e., floor space) is covered by at least one AP, but no spatial "heat mapping" for RF signals is conducted, nor is any differentiation between locations with better or worse coverage made.

Additionally, even when the placement of wireless interface(s) such as WLAN APs within a venue is optimized for the particular attributes of that venue (e.g., based on construction materials of the building, particular shapes and placement of the building components, etc.), the connectivity and multi-path propagation throughout the venue will be affected by the interfering emitters that are introduced during the performance or event (e.g., by the introduction of an audience or other participants with their own potentially interfering devices), and/or during the pre-staging phase of the performance/event (e.g., instrument set-up, sound checks, etc.). Even at open-seating type events such as auto or trade shows, any modeling or planning the venue operator might perform prior to the event itself may be somewhat obsolete at the time of the event, due to the introduction of vehicles, personal electronic devices, demonstration devices, etc., and in some cases variation of the presence, location, and/or operation of these items over the course of the event duration.

Hence, a customer/audience member/participant is typically unable to determine the wireless coverage they will receive during an event when signing up, selecting a seating location, and/or purchasing a ticket for a performance or event. For example, a user may purchase a comparatively expensive ticket to be closer to the performers on the stage, only to realize they have limited or no wireless connectivity, and therefore cannot post images or videos of the performance to social media, etc. Similarly, a vendor may select a booth location at a trade show with the expectation that they will have sufficient wireless bandwidth to conduct their demonstrations, only to find out during the event that the bandwidth is insufficient. This effect may also exist for vehicles at an auto show, which are now increasingly incorporating indigenous WLAN capability (some which are capable of accessing a local non-vehicle provided hotspot); poor WLAN connectivity and performance can make demonstrating the attributes of the vehicle's telematics system (e.g., rapid access to Internet data while in the vehicle) difficult at best.

Moreover, the characteristics of a given venue may significantly change as a function of the type of event hosted in the venue. As alluded to above, equipment and material placement within the venue may significantly alter the RF propagation characteristics for various frequency bands, such that during one type of event (e.g., a trade show with no assigned seating and comparatively static displays) the RF performance in the desired bands is sufficient at a given location, whereas that same location may have unacceptable performance under during another type of event (e.g., concert with removable seating, stage, etc. added inside the venue, and a higher per-areas user density (and hence user personal wireless device density).

Accordingly, the foregoing issues result in a frustrating experience for the end user, whose concern is to maintain connectivity to the wireless network and backhaul, especially when such user has no visibility into temporal or spatial variations in the quality of their network service.

To these ends, improved solutions are needed for more precise and anticipatory mechanisms to identify and characterize available seating or other local areas having certain prescribed levels of wireless performance within the venue of interest, and notification of end users thereof. Specifically, what are needed are methods and apparatus to monitor RF conditions associated with wireless networks, and utilize various information (including RF condition information, as well as historical data relating to similar events) to determine spatial characterizations of the venue, such as for seating or other placement allocations).

SUMMARY

The present disclosure addresses the foregoing needs by providing, inter alia, methods and apparatus for monitoring a wireless network, and providing information relating to wireless connectivity as a function of spatial and/or temporal variations in the wireless signal environment.

In one aspect of the present disclosure, a method of notifying at least one client device of one or more locations with a desired wireless performance characteristic is provided. In one embodiment, the method includes: receiving information relating to the wireless performance characteristic; processing at least a portion of the received information relative to one or more locations; and notifying one or more entities of the processed at least the portion of the information.

In one variant, the processing comprises generating one or more "heat-maps", and the information includes data related to RF conditions associated with the one or more particular spatial locations within an enclosed or at least partly enclosed venue.

In another aspect, an apparatus for use within a content delivery network is provided. In one embodiment, the apparatus includes: a processor apparatus in data communication with one or more network interfaces; and a non-transitory computer-readable storage apparatus in data communication with the processor apparatus and comprising one or more computer programs, the one or more computer programs comprising a plurality of instructions. In one variant, the instructions are configured to, when executed on the processor apparatus: receive at least data associated with one or more locations within a venue; use the at least data to generate one or more data structures; and transmit the one or more data structures via the one or more network interfaces. In one implementation, the one or more locations is/are associated to at least one sensor within a range of connectivity of one or more wireless access points.

In another aspect, a system for use within a wireless content delivery network is provided. In one embodiment, the system comprises a network-based controller in operative communication with one or more wireless access points (e.g., Wi-Fi APs) disposed at various locations associated with a venue.

In a further aspect, a non-transitory computer-readable apparatus is disclosed. In one embodiment, the apparatus includes a storage medium having at least one computer program disposed thereon, the at least one computer program configured to, when executed on a computerized processing apparatus, provide one or more proximate client devices with information relating to one or more locations and wireless network connectivity associated therewith.

In another embodiment, the at least one computer program is configured to, when executed, cause a mobile wireless user device to: issue a message to request data relating to wireless LAN (WLAN) interface performance at one or more locations within the venue, the request issued to a networked server device; provide location-related data to the networked server device, the location-related data relating to a current location of the mobile device; receive, from the networked server device, the data relating to wireless LAN (WLAN) interface performance at one or more locations within the venue; and receive, from the networked server device, data indicating the availability for use of at least one of the one or more locations.

In one variant, the issuance of the message comprises a message comprising an API call sent via a wireless interface of the mobile device, such as a wireless interface of the mobile device other than a WLAN interface of the mobile device.

In another variant, the at least one computer program is further configured to, when executed: receive a message issued from a WLAN access point (AP) within the venue, the received message configured to cause a WLAN interface of the mobile device to invoke a prescribed action, the prescribed action enabling the networked server device to further evaluate wireless LAN (WLAN) interface performance within the venue. In one implementation, the prescribed action comprises: sensing one or more RF parameters using the WLAN interface of the mobile device; and transmitting data relating to the sensed one or more RF parameters to the WLAN AP.

In a further variant, the at least one computer program is rendered as an application program ("app") downloadable to a user mobile device and compatible with the operating system thereof; the app enables the mobile device to extract information from one or more data structures for use (e.g., display, storage, etc.). The app may include, inter alia, a virtual wallet wherein virtual coupons, rewards, points, currency, etc. can be stored and later negotiated with e.g., merchants, such as for goods or services (e.g., upgrades to seating with better wireless connectivity).

In a further aspect an application programming interface (API) useful with a mobile wireless device is disclosed. In one embodiment, the API comprises an interface accessible via a network address such as a URL and that can be called by e.g., an app on the aforementioned mobile device in order to obtain seating location data for one or more locations that enhance or improve performance for the user's mobile device WLAN interface.

In yet a further aspect, a wireless-enabled client device is disclosed. In one embodiment, the client device comprises a Wi-Fi-enabled smartphone or tablet or laptop computer with an application program operative to run thereon.

In another aspect, a method of optimizing user wireless "experience" within a venue is disclosed. In a further aspect, a method of characterizing a venue on a per-event or per-event category basis is disclosed.

In a further aspect, a method and apparatus for pre-calculation and determination of the energy losses (in dB or dBm) due to interference is disclosed.

In a further aspect, a method of dynamically and automatically providing venue location assignments to a user within the venue using a computerized system is disclosed. In one embodiment, the method includes: obtaining at the computerized system a request for evaluation from a mobile device of the user, the mobile device located at a first location within the venue; based at least on the received request, obtaining first data relating to radio frequency (RF) signal performance within the venue under a current configuration of the venue; based at least one the first data, generating a spatial model of the venue, the spatial model identifying variations in the RF performance as a function of at least two dimensions; based at least on the spatial model, identifying at least one second location of the venue with a predicted level of RF performance greater than that of the first location; and notifying, via the computerized system, the mobile device of the second location.

In one variant, the obtaining first data relating to radio frequency (RF) signal performance within the venue under a current configuration of the venue comprises utilizing at least a plurality of wireless access points disposed at prescribed locations within the venue to report, in real time, data relating to at least one RF performance parameter, and the identifying at least one second location of the venue with a predicted level of RF performance greater than that of the first location based at least on the spatial model, comprises correlating at least the prescribed locations to locations of seating within the venue.

In a further aspect, network apparatus configured to enable dynamic user-specific location allocation to obtain a desired level of WLAN performance is disclosed. In one embodiment, the network apparatus includes: computerized controller apparatus configured to control operation of a plurality of WLAN access points (APs) operative within a venue so as to obtain location-specific WLAN operating data from the plurality of APs; and computerized processing apparatus in data communication with the computerized controller apparatus and configured to: obtain the location-specific WLAN operating data; correlate the location-specific WLAN operating data to prescribed locations within the venue; estimate WLAN performance at other locations within the venue based at least on the location-specific WLAN operating data and the correlation; evaluate the estimated WLAN performance associated with at least one of the other locations against a current location of a user mobile device; and based at least on the evaluation, cause transmission of data to the user mobile device relating to the estimated WLAN performance associated with the at least one other location. In one variant, the controller apparatus is further configured to control operation of a plurality of radio frequency sensors operative within the venue so as to obtain location-specific RF parametric data from the plurality of sensors; and the computerized processing apparatus is further configured to utilize the location specific RF parametric data as part of the estimation of WLAN performance.

In a further aspect, a method of characterizing the radio frequency (RF) environment of a venue as a function of an event within the venue is disclosed. In one embodiment, the method includes: obtaining first data relating to radio frequency (RF) signal propagation within the venue under a first configuration of the venue; altering the configuration of at least a portion of the venue, the alteration degrading the RF signal propagation in at least one aspect; obtaining second data relating to radio frequency (RF) signal propagation within the venue under the altered configuration; analyzing the first data and the second data to identify one or more effects of the altered configuration as a function of location within the venue; generating data describing the identified one or more effects as a function of location within the venue; and utilizing the generated data at another venue to predict effects on RF signal propagation under an altered configuration of the another venue. These and other aspects shall become apparent when considered in light of the disclosure provided herein.

Figure 1:
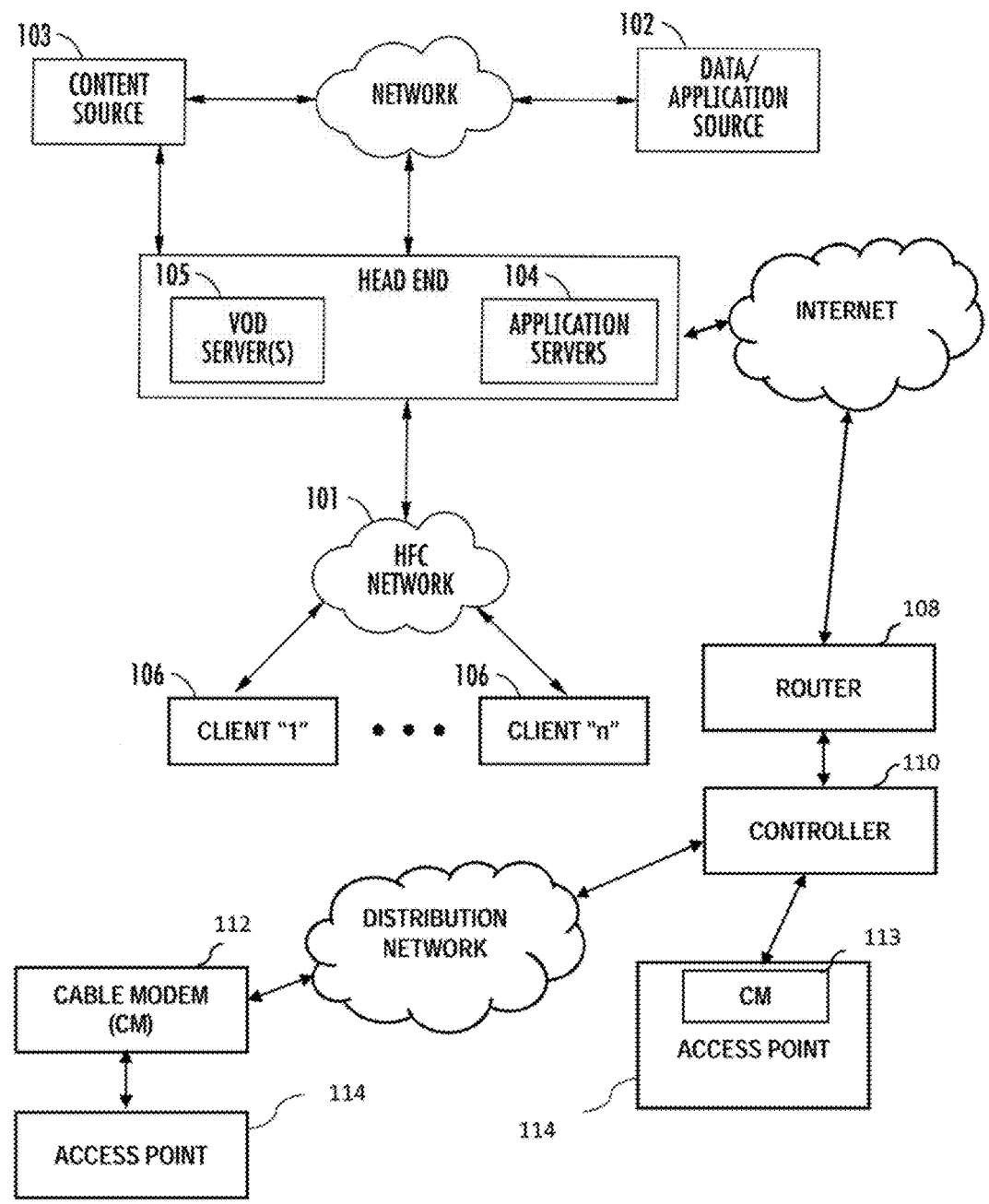
FIG. 1 is a functional block diagram illustrating an exemplary hybrid fiber network configuration useful with various aspects of the present disclosure.

All figures © Copyright 2017 Time Warner Cable Enterprises, LLC. All rights reserved.

DETAILED DESCRIPTION

Reference is now made to the drawings wherein like numerals refer to like parts throughout.

As used herein, the term "access point" refers generally and without limitation to a network node which enables communication between a user or client device and another entity within a network, such as for example a Wi-Fi AP, or a Wi-Fi-Direct enabled client or other device, and which may be acting as a Group Owner (GO).

As used herein, the term "application" refers generally and without limitation to a unit of executable software that implements a certain functionality or theme. The themes of applications vary broadly across any number of disciplines and functions (such as on-demand content management, e-commerce transactions, brokerage transactions, home entertainment, calculator etc.), and one application may have more than one theme. The unit of executable software generally runs in a predetermined environment; for example, the unit could include a downloadable Java Xlet™ that runs within the JavaTV™ environment.

As used herein, the term "client device" includes, but is not limited to, set-top boxes (e.g., DSTBs), gateways, modems, personal computers (PCs), and minicomputers, whether desktop, laptop, or otherwise, and mobile devices such as handheld computers, PDAs, personal media devices (PMDs), tablets, "phablets", smartphones, and vehicle infotainment or similar systems.

As used herein, the term "codec" refers to a video, audio, or other data coding and/or decoding algorithm, process or apparatus including, without limitation, those of the MPEG (e.g., MPEG-1, MPEG-2, MPEG-4/H.264, H.265, etc.), Real (RealVideo, etc.), AC-3 (audio), DiVX, XViD/ViDX, Windows Media Video (e.g., WMV 7, 8, 9, 10, or 11), ATI Video codec, or VC-1 (SMPTE standard 421M) families.

As used herein, the term "computer program" or "software" is meant to include any sequence or human or machine cognizable steps which perform a function. Such program may be rendered in virtually any programming language or environment including, for example, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.) and the like.

As used herein, the term "DOCSIS" refers to any of the existing or planned variants of the Data Over Cable Services Interface Specification, including for example DOCSIS versions 1.0, 1.1, 2.0, 3.0 and 3.1.

As used herein, the term "headend" or "backend" refers generally to a networked system controlled by an operator (e.g., an MSO) that distributes programming to MSO clientele using client devices. Such programming may include literally any information source/receiver including, inter alia, free-to-air TV channels, pay TV channels, interactive TV, over-the-top services, streaming services, and the Internet.

As used herein, the terms "Internet" and "internet" are used interchangeably to refer to inter-networks including, without limitation, the Internet. Other common examples include but are not limited to: a network of external servers, "cloud" entities (such as memory or storage not local to a device, storage generally accessible at any time via a network connection, and the like), service nodes, access points, controller devices, client devices, etc.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, "flash" memory (e.g., NAND/NOR), 3D memory, and PSRAM.

As used herein, the terms "microprocessor" and "processor" or "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable computer fabrics (RCFs), array processors, secure microprocessors, and application-specific integrated circuits (ASICs). Such digital processors may be contained on a single unitary IC die, or distributed across multiple components.

As used herein, the terms "MSO" or "multiple systems operator" refer to a cable, satellite, or terrestrial network provider having infrastructure required to deliver services including programming and data over those mediums.

As used herein, the terms "network" and "bearer network" refer generally to any type of telecommunications or data network including, without limitation, hybrid fiber coax (HFC) networks, satellite networks, telco networks, and data networks (including MANs, WANs, LANs, WLANs, internets, and intranets). Such networks or portions thereof may utilize any one or more different topologies (e.g., ring, bus, star, loop, etc.), transmission media (e.g., wired/RF cable, RF wireless, millimeter wave, optical, etc.) and/or communications or networking protocols (e.g., SONET, DOCSIS, IEEE Std. 802.3, ATM, X.25, Frame Relay, 3GPP, 3GPP2, WAP, SIP, UDP, FTP, RTP/RTCP, H.323, etc.).

As used herein, the term "network interface" refers to any signal or data interface with a component or network including, without limitation, those of the FireWire (e.g., FW400, FW800, etc.), USB (e.g., USB 2.0, 3.0. OTG), Ethernet (e.g., 10/100, 10/100/1000 (Gigabit Ethernet), 10-Gig-E, etc.), MoCA, Coaxsys (e.g., TVnet™), radio frequency tuner (e.g., in-band or OOB, cable modem, etc.), LTE/LTE-A, Wi-Fi (802.11), WiMAX (802.16), Z-wave, PAN (e.g., 802.15), or power line carrier (PLC) families.

As used herein, the term "QAM" refers to modulation schemes used for sending signals over e.g., cable or other networks. Such modulation scheme might use any constellation level (e.g. QPSK, 16-QAM, 64-QAM, 256-QAM, etc.) depending on details of a network. A QAM may also refer to a physical channel modulated according to the schemes.

As used herein the terms "reboot" and "re-initialization" include, without limitation, both "soft" reboots (i.e., those targeted at reinitializing one or more host device software/firmware processes without electrical power-down), and "hard" reboots (i.e., those which may interrupt power to the host as a whole, or particular components thereof). In some cases, hard reboots are further characterized in that they require a manual intervention or trigger (e.g., a user has to physically depress a button, etc.) As used herein, the term "server" refers to any computerized component, system or entity regardless of form which is adapted to provide data, files, applications, content, or other services to one or more other devices or entities on a computer network.

As used herein, the term "storage" refers to without limitation computer hard drives, DVR device, memory, RAID devices or arrays, optical media (e.g., CD-ROMs, Laserdiscs, Blu-Ray, etc.), or any other devices or media capable of storing content or other information.

As used herein, the term "Wi-Fi" refers to, without limitation and as applicable, any of the variants of IEEE-Std. 802.11 or related standards including 802.11 a/b/g/n/s/v/ac or 802.11-2012/2013, as well as Wi-Fi Direct (including inter alia, the "Wi-Fi Peer-to-Peer (P2P) Specification", incorporated herein by reference in its entirety).

As used herein, the term "wireless" means any wireless signal, data, communication, or other interface including without limitation Wi-Fi, Bluetooth, 3G (3GPP/3GPP2), HSDPA/HSUPA, TDMA, CDMA (e.g., IS-95A, WCDMA, etc.), FHSS, DSSS, GSM, PAN/802.15, WiMAX (802.16), 802.20, Zigbee®, Z-wave, narrowband/FDMA, OFDM, PCS/DCS, LTE/LTE-A, analog cellular, CDPD, satellite systems, millimeter wave or microwave systems, acoustic, and infrared (i.e., IrDA).

Overview

As noted above, a typical wireless local area network (WLAN) is configured to provide network connectivity (e.g., to the Internet) via a service provider network, so as to deliver data and provide access to network services to nearby client devices (smartphone, laptop, desktop, tablet, etc.) via one or more wireless access points (APs).

The data may travel through multiple network entities, such as a cable modem (CM) or satellite modem, intermediary entities (e.g., data center, backhaul infrastructure), AP controller, cable modem termination system (CMTS), and other backend apparatus.

An end user utilizing the wireless network may experience degradation or loss of service via the network, including chronically low data rates, for various reasons relating to propagation losses or interference such as from venue construction and placement of structures therein, the presence of musical instruments or an audience, and other interferers.

The present disclosure accordingly provides apparatus and methods to, in a substantially automated fashion, dynamically monitor RF conditions in the hosting environment via, e.g., sensors and even the APs themselves, and characterize the venue spatially, including in three dimensions if required. Such characterization enables the network operator, venue operator, or a proxy thereof, to select and assign use of the space to venue users or clients for an event (e.g., seating locations to the audience of a concert) so as to, inter alia, avoid or minimize loss of user experience during the user's presence at the event. Moreover, the apparatus and methods described herein enable characterization and cataloging of various types of events, and the data associated therewith, so as to enable subsequent use by a computerized controller apparatus (or event operator) for seating or other location-based allocations.

By providing the aforementioned capabilities for data monitoring, characterization, cataloging, and location allocation, event organizers are able to account for the Quality Of Wireless (QoW) for event participants in different areas at a venue (and as a function of time and/or the type of event). Such capabilities also advantageously support different business models, such as incorporation of different classes for categorized seating or other location-specific plans (i.e., for ticket subscriptions with respective price ranges, trade show booth or vehicle location allocations, etc.).

Conversely, the methods and apparatus described herein may be used to inform or drive decisions on AP placement within the venue, and/or placement or configuration of components or portions of the venue structure (including user or spectator seating or display location). For example, all else being equal, it would be best to have bandwidth demand spread out more evenly throughout the venue (as opposed to clustering at one or a few locations), so as to mitigate inter-user device interference to the maximum extent practical. While WLAN standards have protocols to deal with multiple user contention, at some point too many users in a localized spatial region will reduce user experience for all of the user devices involved, due in part to the medium-sharing nature of WLAN multi-user access models, and each individual user device itself causing interference for other nearby devices.

Detailed Description of Exemplary Embodiments

Exemplary embodiments of the apparatus and methods of the present disclosure are now described in detail. While these exemplary embodiments are described in the context of the previously mentioned Wi-Fi WLAN(s) associated with a managed network (e.g., hybrid fiber coax (HFC) cable architecture having a multiple systems operator (MSO), digital networking capability, IP delivery capability, and a plurality of client devices), the general principles and advantages of the disclosure may be extended to other types of wireless networks and architectures that are configured to deliver digital data (e.g., text, images, video, and/or audio). Such other wireless networks or architectures may be broadband, narrowband, or otherwise, the following therefore being merely exemplary in nature.

It will also be appreciated that while described generally in the context of a network providing service to a customer or end user (i.e., within a prescribed venue), the present disclosure may be readily adapted to other types of environments including, e.g., commercial/retail or enterprise domain (e.g., businesses), and government/military applications. Myriad other applications are possible.

Also, while certain aspects are described primarily in the context of the well-known Internet Protocol (described in, inter alia, *Internet Protocol DARPA Internet Program Protocol Specification, IETF RCF* 791 (September 1981) and Deering et al., *Internet Protocol, Version 6 (Ipv6) Specification*, IETF RFC 2460 (December 1998), each of which is incorporated herein by reference in its entirety), it will be appreciated that the present disclosure may utilize other types of protocols (and in fact bearer networks to include other internets and intranets) to implement the described functionality.

Other features and advantages of the present disclosure will immediately be recognized by persons of ordinary skill in the art with reference to the attached drawings and detailed description of exemplary embodiments as provided herein.

Service Provider Network—

FIG. 1 illustrates a typical service provider network configuration useful with the features of the wireless network described herein. This service provider network 100 is used in one embodiment of the disclosure to provide backbone and Internet access from the service provider's wireless access points (e.g., Wi-Fi APs operated or maintained by the service provider or its customers/subscribers), one or more cable modems (CMs) in data communication therewith, or even third party access points accessible to the service provider via e.g., an interposed network such as the Internet (e.g., with appropriate permissions from the access point owner/operator/user).

As opposed to an unmanaged network, the managed service-provider network of FIG. 1 advantageously allows, inter alia, control and management of a given user's access (such user which may be a network subscriber, or merely an incidental/opportunistic user of the service) via the wireless access point(s), including imposition and/or reconfiguration of various access "rules" or other configurations applied to the wireless access points. For example, the service provider network 100 allows components at the venue of interest (e.g., Wi-Fi APs and any supporting infrastructure such as routers, switches, etc.) to be remotely reconfigured by the network MSO, based on e.g., prevailing operational conditions in the network, changes in user population and/or makeup of users at the venue, business models (e.g., to maximize profitability or provide other benefits such as enhanced user experience, as described infra), etc.

In certain embodiments, the service provider network also advantageously permits the aggregation and/or analysis of subscriber- or account-specific data (including inter alia, particular mobile devices associated with such subscriber or accounts) as part of the provision of services to users under the exemplary delivery models described herein. As but one example, device specific IDs (e.g., MAC address or the like) can be cross-correlated to MSO subscriber data maintained at e.g., the network headend(s) so as to permit or at least facilitate, among other things, (i) user authentication; (ii) correlation of aspects of the event or venue to particular subscriber demographics, such as for delivery of targeted advertising; and (iii) determination of subscription level, and hence subscriber privileges and access to content/features. Moreover, device profiles for particular user devices can be maintained by the MSO, such that the MSO (or its automated proxy processes as described subsequently herein) can model the user device for wireless capabilities.

The wireless access points (see discussion of FIG. 1a infra) disposed at the venue(s) of interest can be coupled to the bearer managed network (FIG. 1) via, e.g., a cable modem termination system (CMTS) and associated local DOCSIS cable modem (CM), a wireless bearer medium (e.g., an 802.16 WiMAX system), a fiber-based system such as FiOS or similar, a third-party medium which the managed network operator has access to (which may include any of the foregoing), or yet other means.

The various components of the exemplary embodiment of the network 100 include (i) one or more data and application origination sources 102; (ii) one or more content sources 103, (iii) one or more application distribution servers 104; (iv) one or more VOD servers 105, (v) client devices and/or Customer Premises Equipment (CPE) 106, (vi) one or more routers 108, (vii) one or more wireless access point controllers 110 (may be placed more locally as shown or in the headend or core" portion of network), (viii) one or more cable modems 112, and/or (ix) one or more access points 114 (which may or may not include embedded cable modems 113 as shown). The application server(s) 104, VOD servers 105 and CPE/client device(s) 106 are connected via a bearer (e.g., HFC) network 101. A simple architecture comprising one of each of certain components 102, 103, 104, 105, 108, 110 is shown in FIG. 1 for simplicity, although it will be recognized that comparable architectures with multiple origination sources, distribution servers, VOD servers, controllers, and/or client devices (as well as different network topologies) may be utilized consistent with the present disclosure. For example, the headend architecture of FIG. 1a (described in greater detail below), or others, may be used.

It is also noted that cable network architecture is typically a "tree-and-branch" structure, and hence multiple tiered APs may be linked to each other or cascaded via such structure.

Figure 1A:
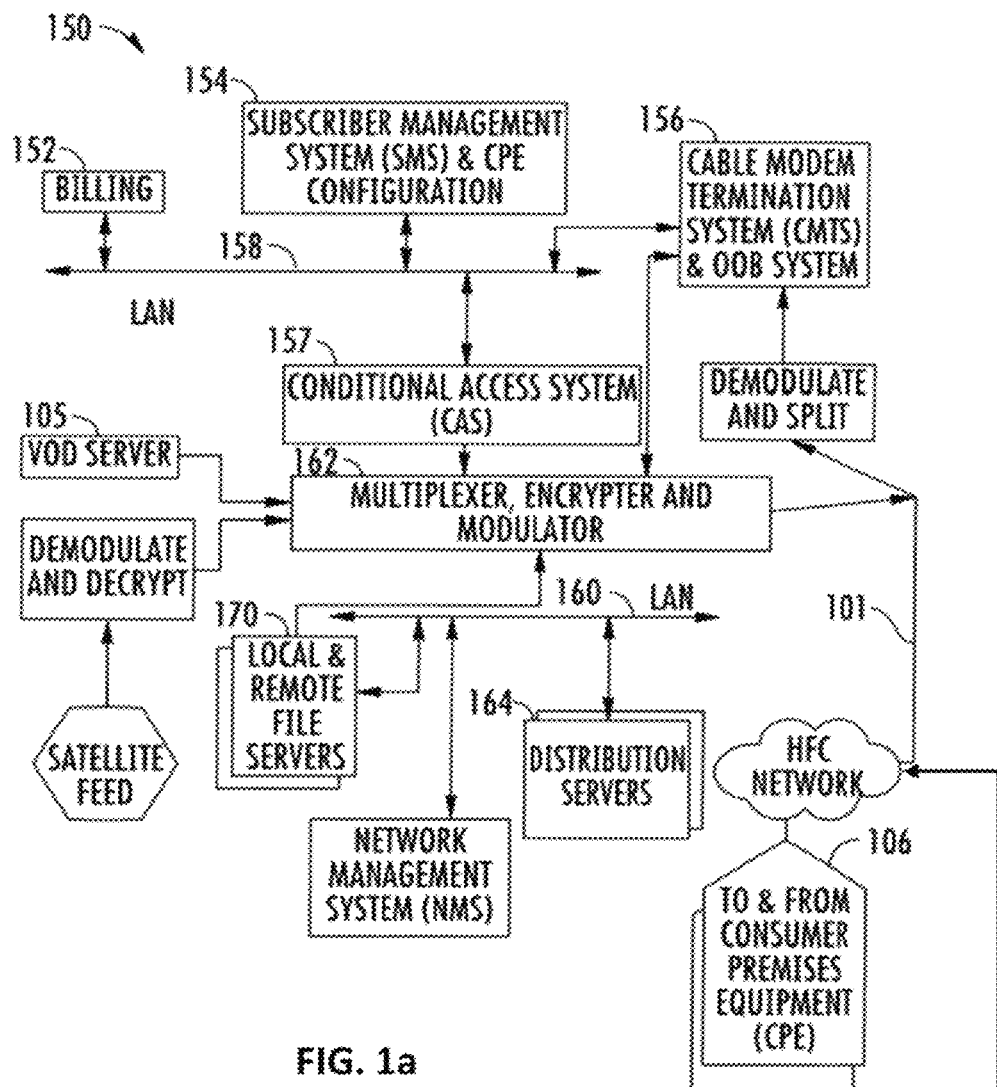
FIG. 1a is a functional block diagram illustrating one exemplary network headend configuration useful with various aspects of the present disclosure.
Figure 1A:
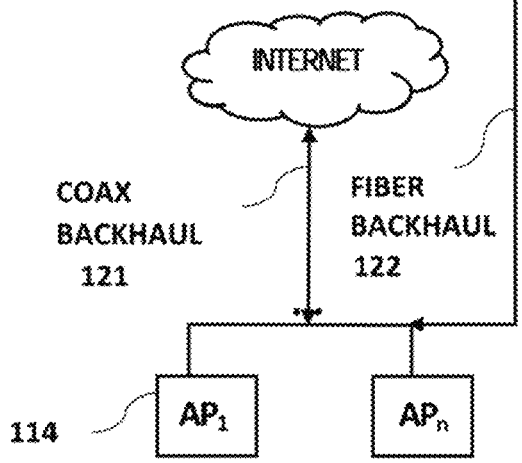

FIG. 1a shows one exemplary embodiment of a headend architecture. As shown in FIG. 1a, the headend architecture 150 comprises typical headend components and services including billing module 152, subscriber management system (SMS) and client/CPE configuration management module 154, cable modem termination system (CMTS) and OOB system 156, as well as LAN(s) 158, 160 placing the various components in data communication with one another. It will be appreciated that while a bar or bus LAN topology is illustrated, any number of other arrangements as previously referenced (e.g., ring, star, etc.) may be used consistent with the disclosure. It will also be appreciated that the headend configuration depicted in FIG. 1a is high-level, conceptual architecture, and that each MSO may have multiple headends deployed using custom architectures.

The exemplary architecture 150 of FIG. 1a further includes a conditional access system (CAS) 157 and a multiplexer-encrypter-modulator (MEM) 162 coupled to the HFC network 101 adapted to process or condition content for transmission over the network. The distribution servers 164 are coupled to the LAN 160, which provides access to the MEM 162 and network 101 via one or more file servers 170. The VOD servers 105 are coupled to the LAN 160 as well, although other architectures may be employed (such as for example where the VOD servers are associated with a core switching device such as an 802.3z Gigabit Ethernet device). As previously described, information is carried across multiple channels. Thus, the headend must be adapted to acquire the information for the carried channels from various sources. Typically, the channels being delivered from the headend 150 to the client devices/CPE 106 ("downstream") are multiplexed together in the headend, as previously described and sent to neighborhood hubs (as shown in the exemplary scheme of FIG. 1b) via a variety of interposed network components, including coaxial cable and fiber backhauls 121, 122.

Figure 1B:
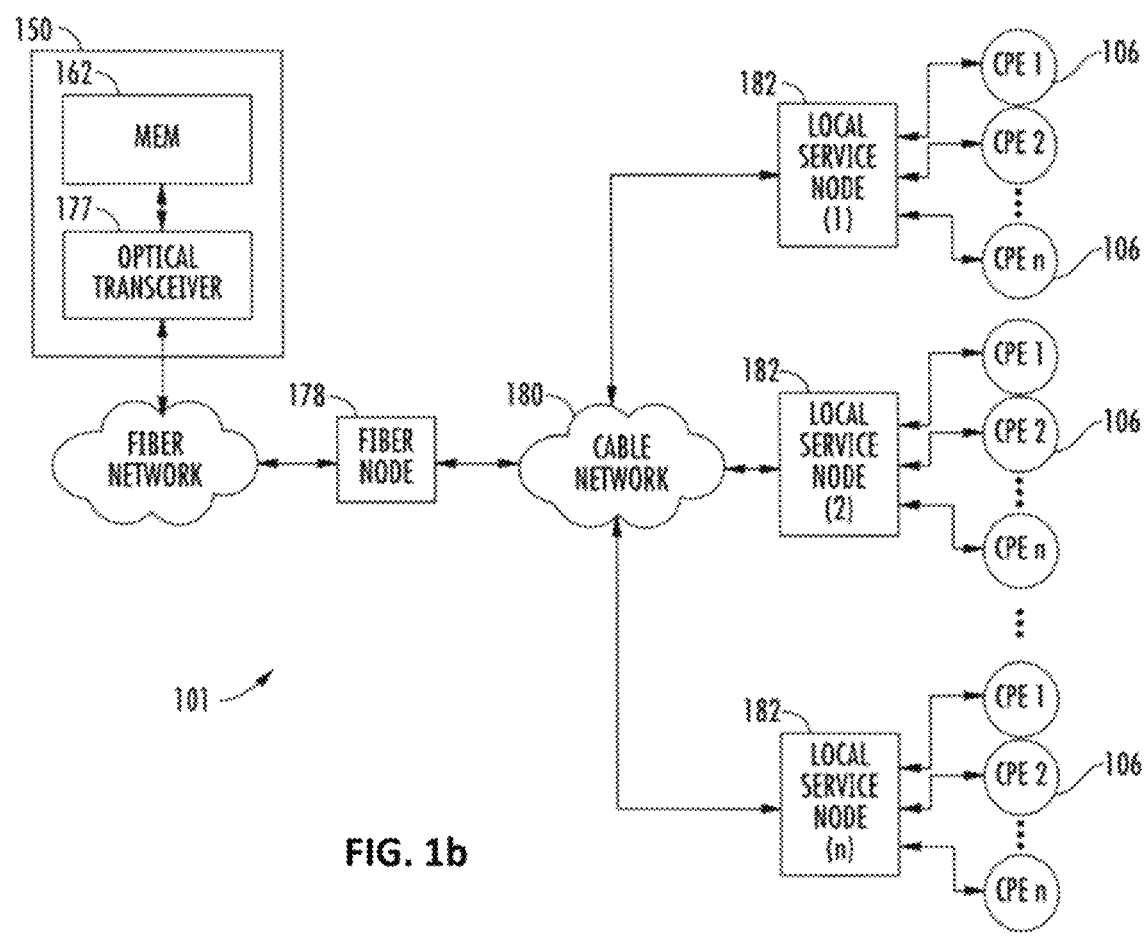
FIG. 1b is a functional block diagram illustrating one exemplary local service node configuration useful with various aspects of the present disclosure.

As shown in FIG. 1b, the network 101 of FIGS. 1 and 1a comprises a fiber/coax arrangement wherein the output of the MEM 162 of FIG. 1a is transferred to the optical domain (such as via an optical transceiver 177 at the headend or further downstream).

The optical domain signals are then distributed to a fiber node 178, which further distributes the signals over a cable distribution network 180 to a plurality of local servicing nodes 182. This provides an effective 1:N expansion of the network at the local service end. It will be appreciated that the CPE 106 shown in FIG. 1b may in fact comprise CMs or CMTS, or other devices such as the embedded cable modem AP 113, or wireless APs 202, 204, 206, 208 disposed within one or more venues, as described subsequently herein with respect to FIGS. 2-2a.

Figure 1C:
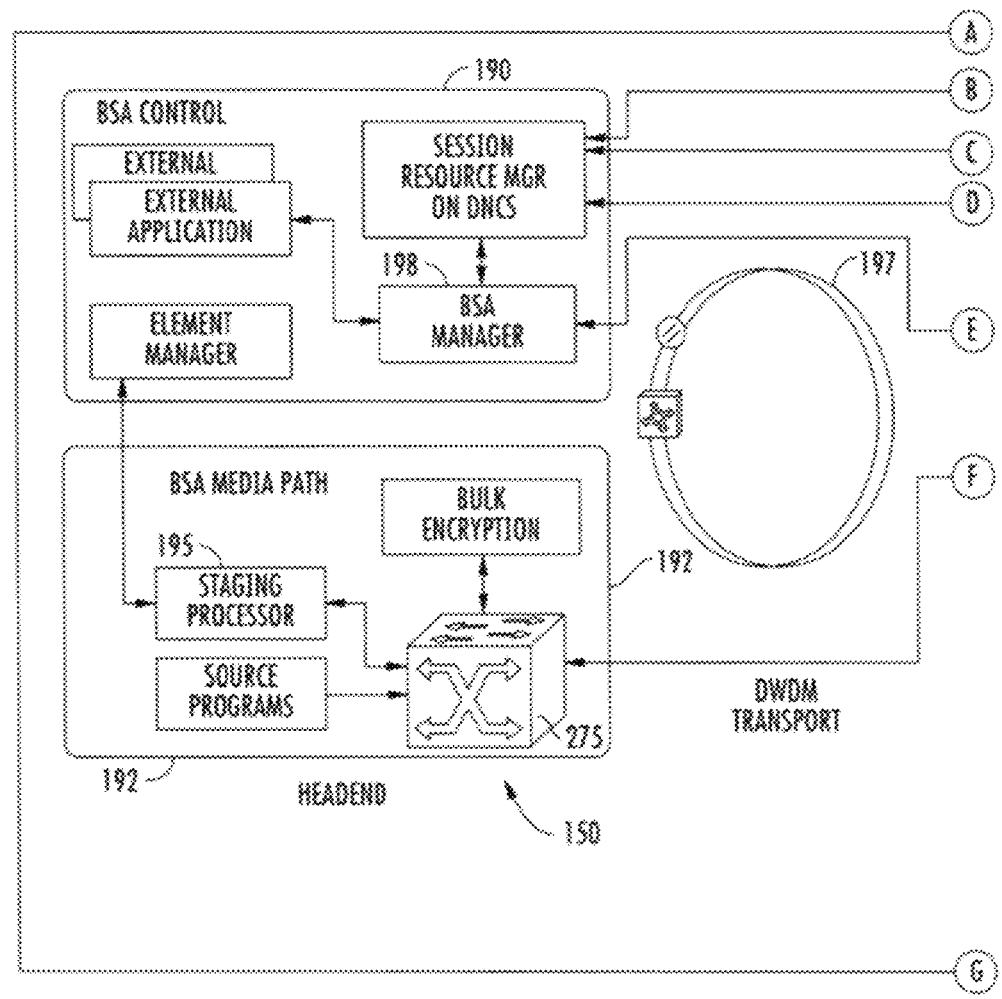
FIG. 1c is a functional block diagram illustrating one exemplary broadcast switched architecture (BSA) network useful with various aspects of the present disclosure.
Figure 1C:
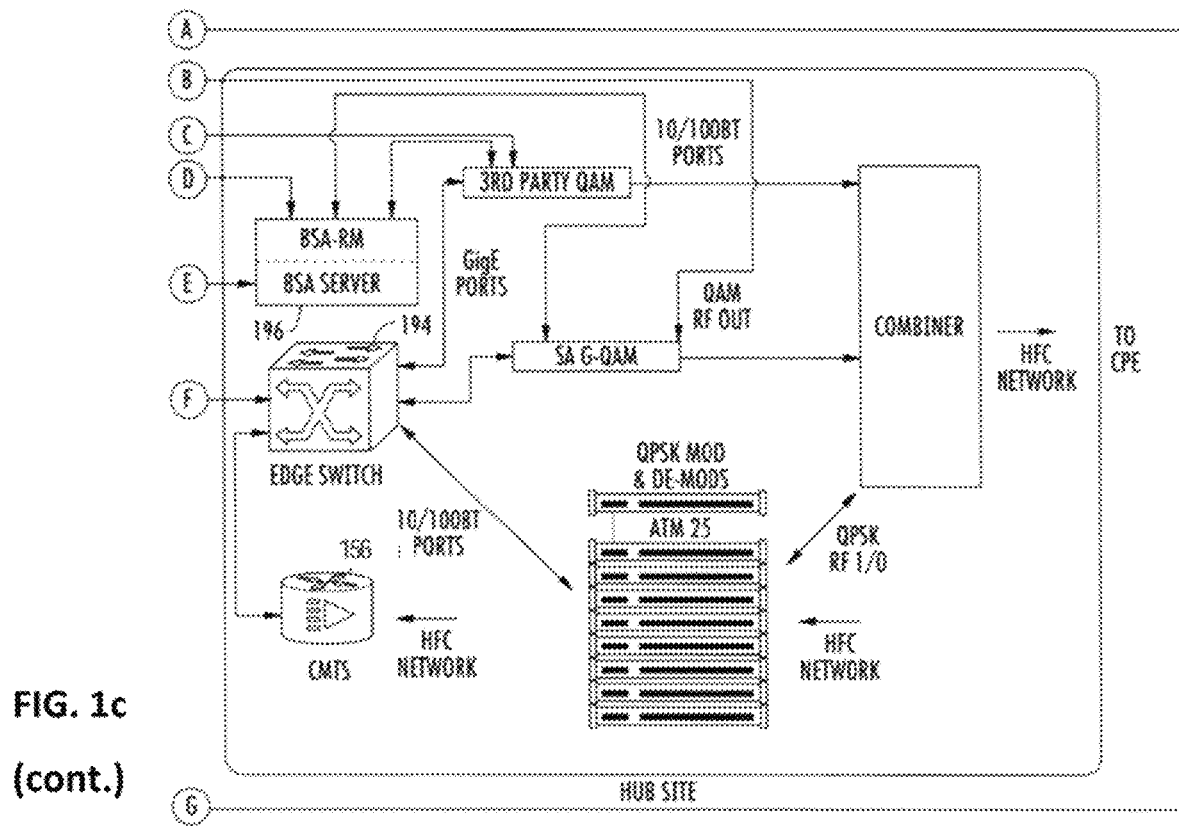

FIG. 1c illustrates an exemplary "switched" network architecture. Specifically, the headend 150 contains switched broadcast control 190 and media path functions 192; these element cooperating to control and feed, respectively, downstream or edge switching devices 194 at the hub site which are used to selectively switch broadcast streams to various service groups. Broadcast switched architecture (BSA) media path 192 may include a staging processor 195, source programs, and bulk encryption in communication with a switch 275. A BSA server 196 is also disposed at the hub site, and implements functions related to switching and bandwidth conservation (in conjunction with a management entity 198 disposed at the headend). An optical transport ring 197 is utilized to distribute the dense wave-division multiplexed (DWDM) optical signals to each hub in an efficient fashion.

In addition to "broadcast" content (e.g., video programming), the systems of FIGS. 1a and 1c (and 1d discussed below) also deliver Internet data services using the Internet protocol (IP), although other protocols and transport mechanisms of the type well known in the digital communication art may be substituted. One exemplary delivery paradigm comprises delivering MPEG-based video content, with the video transported to user client devices (including IP-based STBs or IP-enabled consumer devices) over the aforementioned DOCSIS channels comprising MPEG (or other video codec such as H.264 or AVC) over IP over MPEG. That is, the higher layer MPEG- or other encoded content is encapsulated using an IP protocol, which then utilizes an MPEG packetization of the type well known in the art for delivery over the RF channels. In this fashion, a parallel delivery mode to the normal broadcast delivery exists; i.e., delivery of video content both over traditional downstream QAMs to the tuner of the user's STB or other receiver device for viewing on the television, and also as packetized IP data over the DOCSIS QAMs to the user's client device or other IP-enabled device via the user's cable modem. Delivery in such packetized modes may be unicast, multicast, or broadcast.

Referring again to FIG. 1c, the IP packets associated with Internet services are received by the edge switch 194, and in one embodiment forwarded to the cable modem termination system (CMTS) 156. The CMTS examines the packets, and forwards packets intended for the local network to the edge switch 194. Other packets are discarded or routed to another component. As an aside, a cable modem is used to interface with a network counterpart (e.g., CMTS) so as to permit two-way broadband data service between the network and users within a given service group, such service which may be symmetric or asymmetric as desired (e.g., downstream bandwidth/capabilities/configurations may or may not be different than those of the upstream).

The edge switch 194 forwards the packets received from the CMTS 156 to the QAM modulator, which transmits the packets on one or more physical (QAM-modulated RF) channels to the CPE/client devices. The IP packets are typically transmitted on RF channels (e.g., DOCSIS QAMs) that are different that the RF channels used for the broadcast video and audio programming, although this is not a requirement. The client devices/CPE 106 are each configured to monitor the particular assigned RF channel (such as via a port or socket ID/address, or other such mechanism) for IP packets intended for the subscriber premises/address that they serve. For example, in one embodiment, a business customer premises obtains its Internet access (such as for a connected Wi-Fi AP) via a DOCSIS cable modem or other device capable of utilizing the cable "drop" to the premises (e.g., a premises gateway, etc.).

Figure 1D:
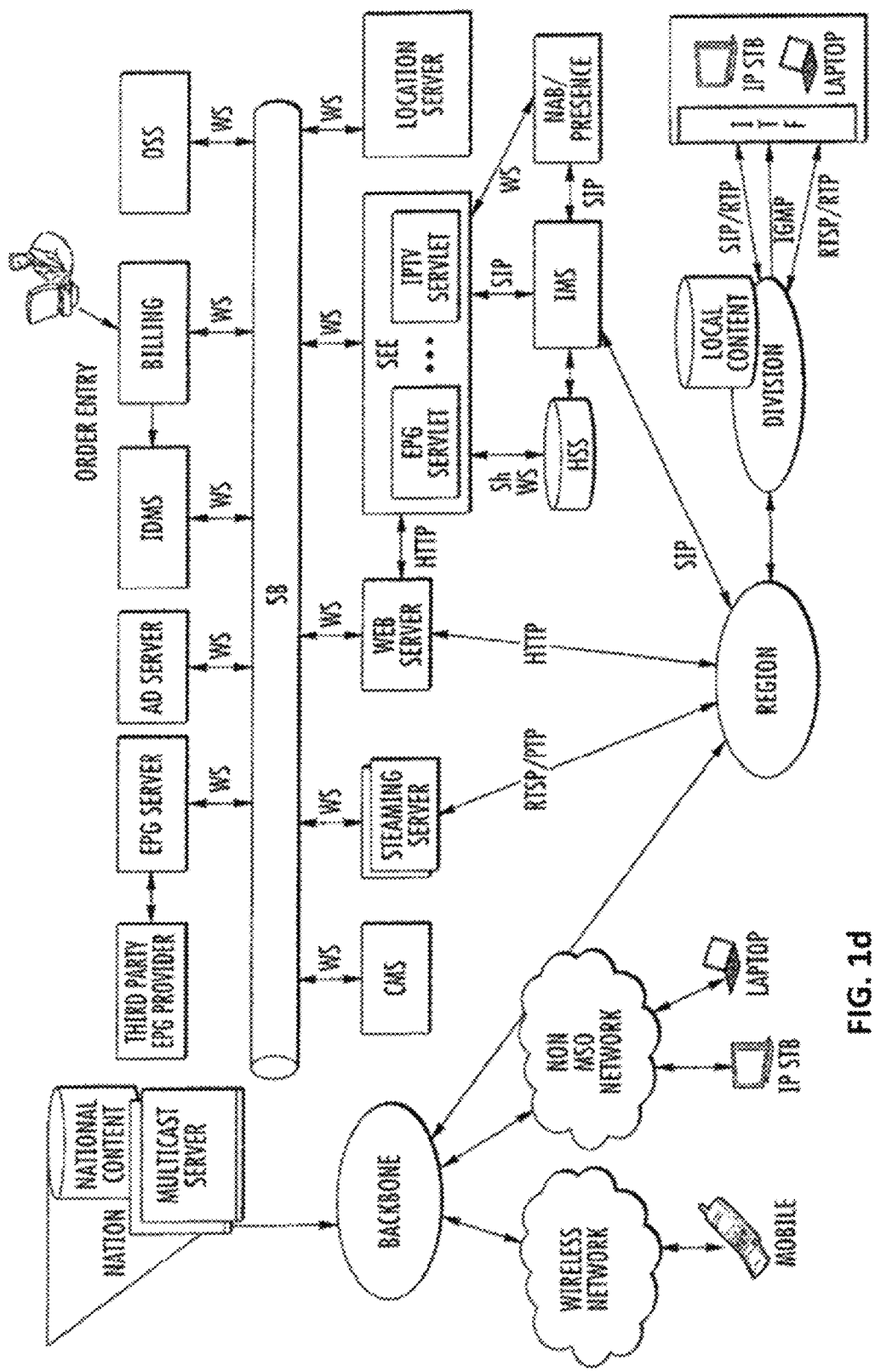
FIG. 1d is a functional block diagram illustrating one exemplary packetized content delivery network architecture useful with various aspects of the present disclosure.

While the foregoing network architectures described herein can (and in fact do) carry packetized content (e.g., IP over MPEG for high-speed data or Internet TV, MPEG2 packet content over QAM for MPTS, etc.), they are often not optimized for such delivery. Hence, in accordance with another embodiment of the disclosure, a "packet optimized" delivery network is used for carriage of the packet content (e.g., Internet data, IPTV content, etc.). FIG. 1d illustrates one exemplary implementation of such a network, in the context of a 3GPP IMS (IP Multimedia Subsystem) network with common control plane and service delivery platform (SDP), as described in co-owned U.S. patent application Ser. No. 12/764,746 filed Apr. 21, 2010 entitled "METHODS AND APPARATUS FOR PACKETIZED CONTENT DELIVERY OVER A CONTENT DELIVERY NETWORK," and issued as U.S. Pat. No. 10,264,029 on Apr. 16, 2019, incorporated herein by reference in its entirety. Such a network provides, inter alia, significant enhancements in terms of common control of different services, implementation and management of content delivery sessions according to unicast or multicast models, etc.; however, it is appreciated that the various features of the present disclosure are in no way limited to this or any of the other foregoing architectures.

It will be appreciated that the foregoing MSO or managed network can advantageously be leveraged for easy installation of the various APs (and/or any lower-level "children APs" as described in co-owned U.S. patent application Ser. No. 15/002,232 entitled "APPARATUS AND METHOD FOR WIRELESS NETWORK SERVICES IN MOVING VEHICLES" filed Jan. 20, 2016, and issued as U.S Pat. No. 9,918,345 on Mar. 13, 2018, incorporated herein by reference in its entirety) within a geographic region. Consider, for example, a MSO network that is already pervasive throughout a given area (i.e., the MSO has numerous customers, both business and residential and otherwise); in such networks, the MSO already has significant infrastructure deployed, at a very high level of granularity. Hence, if an AP needs to be placed at a given location in order to effect the coverage/operation for the Wi-Fi network described herein (e.g., for an impromptu concert or event held at a location not associated with any particular venue structure), the MSO can easily "tap off" the existing infrastructure in that area to enable the ad hoc AP placement. This may take the form of e.g., placement of an AP coincident with a given customer's extant equipment, and/or placement of new equipment that taps off a local service node.

It is also contemplated that the service provider may utilize or "piggyback" off the infrastructure of other service providers, utilities, etc. For instance, a third party service provider may have a high-bandwidth backhaul "drop" near a venue location desired by the MSO; the MSO can then lease, pay, rent, etc. that third party for temporary use of the drop (e.g., for the duration of the event, including setup). Similarly, traffic signal poles, lighting, bridges, tunnels, etc. all contain a wide variety of cabling, conduits, and other infrastructure which the (host) MSO could make use of so as to obviate having to perform a new installation (and all of the attendant costs and delays thereof).

Network addressing in such "composite" or "parent/child" scenarios may assign each node of a network with an address that is unique to that network; the address can be used to communicate (directly via peer-to-peer communications, or indirectly via a series of "hops") with the corresponding device. In more complex networks, multiple layers of indirection may be used to assist in address exhaustion (e.g., one address is logically divided into another range of network addresses). Common examples of network routing protocols include for example: Internet Protocol (IP), Internetwork Packet Exchange (IPX), and OSI-based network technologies (e.g., Asynchronous Transfer Mode (ATM), Synchronous Optical Networking (SONET), Synchronous Digital Hierarchy (SDH), Frame Relay).

Location Characterization and Advisor Architecture—

Figure 2:
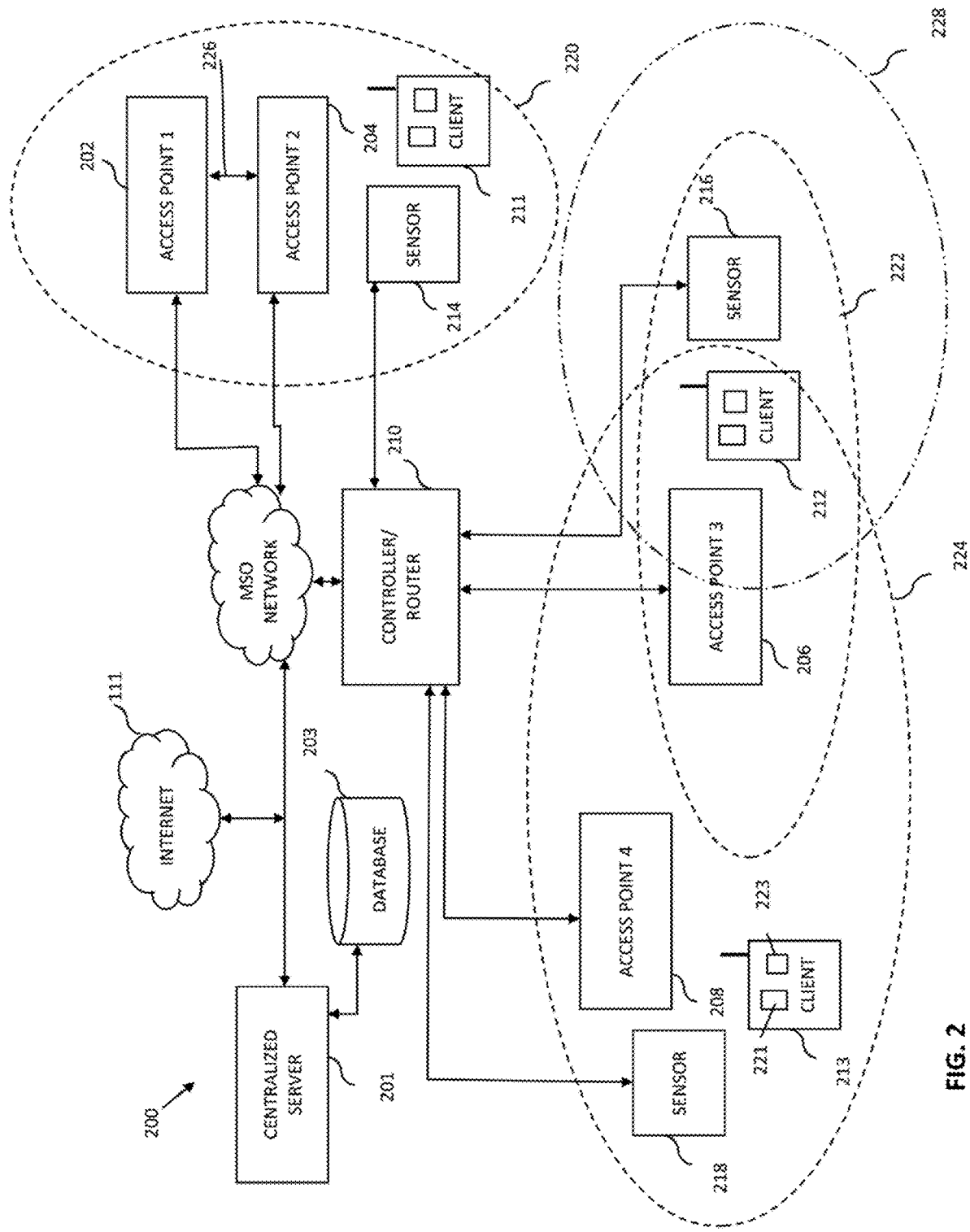
FIG. 2 is a functional block diagram of an exemplary embodiment of a wireless network infrastructure useful with various embodiments of the present disclosure.

FIG. 2 illustrates an exemplary embodiment of a network architecture 200 useful in characterizing and advising location of interest (such as for example seats or trade show booth or other locations) for users. As used in the present context, the term "users" may include without limitation end users (e.g., individuals, whether subscribers of the MSO network or not), venue operators, event providers/organizers, or even entities within the MSO itself (e.g., a particular department, system or processing entity).

As shown, the architecture generally includes a centralized (i.e., "cloud" based) server 201 (locally resident with an AP controller, or remotely at the backend or headend of the system), one or more access points 202, 204, 206, 208 in data communication with the central manager 201 (e.g., via existing network architectures including any wired or wireless Internet connection 111), as well as any number of client devices 212 (smartphones, laptops, tablets, watches, vehicles, etc.) which may or may not be within range of an AP that is served by the centralized server. Client devices may also have different capabilities (e.g., as "nodes" of the network themselves, as described in greater detail infra).

In certain embodiments, each AP 202, 204, 206, 208 is located within and/or services one or more areas within a venue (e.g., a building, room, or plaza for commercial, corporate, academic purposes, and/or any other space suitable for Wi-Fi access). Each AP is configured to provide wireless network coverage within its coverage or connectivity range 220, 222, 224. For example, a venue may have a wireless modem installed within the entrance thereof for prospective customers to connect to, including those in the parking lot via inter alia, their Wi-Fi enabled vehicles or personal devices of operators thereof.

In one implementation, the system and methods of the present disclosure include determining a desired or optimal installation configuration for one or more wireless interface devices (e.g., APs) within a premises or venue, such as for example using the methods and apparatus described in co-owned and co-pending U.S. patent application Ser. No. 14/534,067 filed Nov. 5, 2014 and entitled "METHODS AND APPARATUS FOR DETERMINING AN OPTIMIZED WIRELESS INTERFACE INSTALLATION CONFIGURATION". As disclosed therein, a network entity collects information relating to the type of services required, and generates a customer profile. The customer profile is then used to determine a number and type of wireless interface devices required. In one variant, a device chart is generated, which lists a plurality of combinations of categories of service and a respective plurality of device combinations needed to provide optimal (or at least to the desired level of) service thereto. The device chart is consulted to arrive at an appropriate installation work order, which is submitted for premises installation. As one exemplary use consistent with the present disclosure, the device chart, customer profile, etc. are used with the monitored RF condition and performance information, described herein, in order to, e.g., generate RF energy heat-maps for frequency bands of interest, which then can be utilized to determine seating placement, as well as equipment placement. In another example, an event organizer may use the device chart, customer profile, etc. to configure a seating chart for an event based on classes or categories (e.g., silver, gold, platinum), where the seating of the more expensive classes have more AP's associated thereto, or a more optimal AP configuration, such that e.g., the customer will receive better wireless connectivity depending on how much they pay for their seat(s), or based on subscriber level (e.g., for MSO-sponsored events). It will be appreciated that the foregoing examples represent examples of pre-planning of venue configuration, as opposed to post facto planning conducted based on a largely fixed or immutable configuration. Advantageously, the methods and apparatus of the present disclosure are adaptable to both; i.e., venue seating and component placement and configuration design, as well as optimization/mapping/allocation in cases where the configuration has already been established.

As discussed elsewhere herein, client devices may or may not be within the range serviced by AP(s). In one variant of the present disclosure, the range of the AP's is considered when determining seating allocations—i.e., the customers associated with client devices not within the range services by an AP would not pay as much as those within the range of one or more APs. Additionally, some client devices may be within the range, and thus serviced by, only one AP (e.g., a client device 213 located is within the range 224 of only access point 208), whereas some other client devices may be within range of two or more APs within a designated area (e.g., client device 212 in may be serviced by one or both of two AP's 206, 208 as the APs' respective ranges 222, 224 overlap). In one variant, APs 202, 204 may be in communication (e.g., via direct connection by way of e.g., Gigabit Ethernet or other wired connection, or even over Wi-Fi (e.g., Wi-Fi Direct), as indicated by overlapping connectivity ranges and connection 226). In one such implementation, a sub-network is created by utilizing the techniques to extend and enhance existing networks described in co-owned U.S. patent application Ser. No. 14/959,948 entitled "APPARATUS AND METHOD FOR WIRELESS NETWORK EXTENSIBILITY AND ENHANCEMENT" filed Dec. 4, 2015, and issued as U.S. Pat. No. 10,327,187 on Jun. 18, 2019, incorporated by reference in its entirety. The client device 211 may be serviced by AP 204, and thereby receive information stored at either or both APs 202, 204 even if AP 204 is out of range. Device 211 may also be serviced in a peer-to-peer sub-network, such as by receiving beacons and/or connecting (e.g., tethering or acting as a relay) with another client device (not shown) serviced by AP 204.

In the exemplary embodiment, one or more APs 202, 204 are directly communicative with processes of the backend (i.e., are not controlled by the controller 210), while one or more APs 206, 208 are connected to (and controlled at least in part by) the AP controller 210. In accordance with the discussion supra, APs 202, 204 possessing high processing capabilities may be better suited for direct data communication with the backend (e.g., centralized server 201), while the APs 206, 208 without as much processing power may have their load shifted away and toward controller 210 and/or centralized server 201. Various combinations of processing load may be allocated on a preset or dynamic basis.

In some embodiments, APs of different types, such as locally controlled APs 206, 208 (i.e., children APs) and non-locally controlled APs 202, 204 may transmit data (e.g., notifications derived from the controller 210 and/or centralized server 201) to/from a client device 211, 212, 213 within their connectivity range as is described in e.g., co-owned U.S. patent application Ser. No. 15/002,232, and that described in U.S. patent application Ser. No. 14/959,948, incorporated supra. The client devices 211, 212, 213 can be in range of an non-local or parent AP 204, 202 as well as a local or child AP 206, 208.

In an exemplary implementation, the client devices 211, 212, 213 each include both: (i) an application computer program 221 operative to run on the client and, inter alia, enable the user to request information on alternate locations, and receive the information for rendering on the display device of the client; and (ii) a position location apparatus 223, such as a GPS or A-GPS receiver that enables determination of the clients location, either by the client itself, or by an external entity such as the controller 210 or other "back end" process. It will be appreciated that position location determination techniques other than satellite-based (e.g., GPS) may be used, provided that such alternatives give sufficient spatial resolution. For example, to the degree that a client's association with two APs within the venue (or an AP and detection by a sensor, described infra) can resolve the client's location to say, within a couple feet, such technique may be used.

Note that different spatial resolutions may be dictated by different type of venues and/or events. For example, a spatial resolution of e.g., 10 feet (or more) may be sufficient for placement of a kiosk, vehicle, or booth at a trade show, in that less precision is required based on relative spacing of the individual placements, and other factors. However, for seating, a higher level of precision may be required (e.g., 2-3 feet), in that seating in a venue tends to be clustered more closely.

Likewise, the RF propagation characteristics of the venue within the frequency bands of interest may affect the requisite precision, such as where many walls, structures, or other intervening components exist, thereby making the spatial sensitivity (i.e., RF signal variation or performance as a function of placement) higher than might be experienced in the case of e.g., a large, open floor plan.

In one or more embodiments, AP's may provide various information via an open-access network such as a wireless local area network (WLAN), such as that described in co-owned U.S. patent application Ser. No. 15/063,314 filed Mar. 7, 2016 entitled "APPARATUS AND METHODS FOR DYNAMIC OPEN-ACCESS NETWORKS," and issued as U.S. Pat. No. 10,492,034 on Nov. 26, 2019, incorporated by reference in its entirety. In one embodiment, the information provided is contextually relevant to locations of respective users or devices receiving the information. As but one example, the information provided may relate to the availability of wireless performance enhancement via use of the API (i.e., advertising to the client the capability to potentially get better WLAN performance at a different location by accessing the designated API). In one implementation, the information is provisioned by a network entity (for example, from a service provider network operator) and provided to one or more access points (APs) of the service provider network. The information is bit-stuffed into Wi-Fi beacon frames or other data structures that are broadcast by the APs to nearby client devices. A receiving client device extracts the information using a protocol embodied in application software on the client (e.g., the app 221), and may also initiate a dedicated wireless connection with the AP for e.g., transmission of content related to the context and/or the bit-stuffed information, access of related Internet addresses, API calls, etc.

Now referring to the controller 210, in one or more embodiments, controller 210 is configured to dynamically monitor RF conditions and performance information in the hosting environment via use of the APs 202, 204, 206, 208 and/or the sensors 214, 216, 218.

In one variant, the APs 202, 204, 206, 208 are configured to send one or more RF key performance indicator (KPI) data sets or reports to the target devices/entities (e.g., the controller 210 and/or the centralized server 201). RF KPI reports can be used for one or more of the following: (i) monitoring and optimizing the radio network performance in order to provide better subscriber quality or to achieve better use of installed network resources; (ii) immediately detecting unacceptable performance-related issues in the network, which enables the operator to take rapid actions in order to preserve the quality of the existing network services; and (iii) providing radio frequency planners with detailed information, which will enable configuring the network parameters for optimum use.

In one variant, in order to accomplish the foregoing functions, the APs 202, 204, 206, 208 are configured to send various specific measures of link quality to the target devices/entities (e.g., the controller 210 and/or the centralized server 201) to be utilized thereby or passed to another network entity or process. Examples of link quality include, without limitation: received signal strength (RSS/RSSI), signal-to-noise ratio (SNR), carrier-to-noise ratio (CNR), signal-to-interference plus noise ratio (SINR), carrier-to-interference plus noise ratio (CINR), bit error rate (BER), block error rate (BLER), packet error rate (PER), Frame error rate (FER), etc. Such KPI reporting occurs, in the exemplary embodiment, upon transmission of a specific request from the controller 210 or the centralized server (such as during a profiling "session" as described with respect to FIG. 4b subsequently herein, wherein the AP is configured, based on the transmitted request, to implement a characterization/profiling algorithm and obtain data based thereon), although other schemes will be appreciated, including for example: (i) periodic polling by the controller/server; (ii) periodic reporting instigated by the AP according to a prescribed schedule; (iii) based on receipt of a user-invoked request for a new location/seat assignment via the client device app; and (iv) based on a user accessing the aforementioned "stuffed" beacon API link.

It will also be appreciated that the present disclosure contemplates, as part of the KPI reporting process: (i) calculation of the relevant parameters by the AP(s), and subsequent transmission to the controller and/or centralized server; (ii) collection of raw RF parametric data and transmission of that raw data upstream, and/or (iii) combinations of the foregoing (e.g., shared burden of calculation).

With respect to the sensors 214, 216, 218 (e.g., radio or modem ICs) shown in FIG. 2, these sensors are in one variant specifically located within one or more pre-designated areas, and within one or more ranges 220, 222, 224 (or portions of ranges 220, 222, 224) of the various AP's 202, 204, 206, 208. For example, the sensor 216 may be disposed such that its effective sensing range 228 is capable of monitoring the RF performance of portions of the effective ranges 222, 224 of the AP's 206, 208, respectively, as shown in FIG. 2. Contrasted to the APs, the sensors 214, 216, 218 in the exemplary embodiment are passive RF monitoring devices, and do not provide a wireless data connectivity function for users to e.g., the MSO backbone or the Internet. Rather, each sensor is configured to (i) receive data, including commands, from the controller 210/server 201, and (ii) collect and upload monitoring statistics or other relevant data to the server 201 and/or controller 210, each of (i) and (ii) which may occur via a wired or wireless link. For example, the sensors may include CAT-5/6 network capability (e.g., via an Ethernet or similar PHY), or alternatively may use a short-or-moderate range wireless link such as Bluetooth, ZigBee, or even Wi-Fi.

In another variant, the sensors 214, 216, 218 comprise substantially automated "user simulators" (in effect, pre-programmed virtual clients) that are configured to monitor and/or upload the wireless performance statistics either upon request or on an on-going basis (i.e., at regular intervals or continuously) before and/or during an event. To this end, the virtual clients may also be configured to associate with an AP and transact Wi-Fi (802.11) data with one or more of the APs, much as any other (actual) client device of a user might do during the event. Herein lies somewhat of a distinction between the virtual clients of the instant implementation and the sensors (alone) as described in the embodiment above; the latter merely (passively) collect RF data, such as RF emissions by the APs in the frequency band(s) of interest— "flies on the wall" as it were. Conversely, the virtual clients can also act as clients themselves; i.e., initiating and receiving actual Wi-Fi data communications (thereby simulating actual users using their Wi-Fi enabled clients at the virtual client location), as well as the aforementioned monitoring functions. Hence, the virtual clients provide an enhanced level of realism and accuracy to any simulations generated based on the monitored data; not only can they sense the relevant RF parameters at the prescribed locations, but they can also create data communications representative of actual users (including interference created thereby, carrier/medium access contention, etc.), thereby enabling a better simulation. Notably, the virtual clients can also be used in concert if desired; e.g., conduct Wi-Fi data transactions with the same or different APs simultaneously so as to more closely replicate actual RF spatial performance and propagation conditions during the incipient event.

Moreover, the sensors 214, 216, 218 enable selective polling (e.g., by a venue administrator) of a wireless performance/parameter status for a specific areas in the venue, such as via transmission of a request for data from the controller 210. Likewise, virtual client functionality can be requested on a per-sensor or per-area basis if desired.

In yet another aspect, the present disclosure contemplates creation and use of an Internet Of Things (IoT) formed by the sensors, such as by embedding the sensors 214, 216, 218 in musical instruments (e.g., drums, guitars, pianos, display terminals, amplifiers, sound system employed in the venue, etc.). Some of these sensors may be mobile, and hence used dynamically (whether before or during the event) for spatial RF parameter modeling or characterization. For instance, during a concert, some of the foregoing equipment may move during the performance, such as where the instrument is carried by a band member, the stage is configured to mechanically translate or move positions, props and artistic sets are changed between musical "sets" by the band, etc.). Hence, in such cases, the sensor devices 214, 216, 218 may be equipped with a PAN or other wireless modem as previously described (as well as the sensor functionality for the frequency band(s) of interest), such that each sensor can, when activated, sense the desired RF parameters at its current location, and transmit data relating thereto back to the controller 210 via the PAN interface.

It is noted that many musical instruments (e.g., guitars, microphones, etc.) may also include indigenous wireless capability of their own, such as for transmission of the musical or voice data generated by the instrument back to an digital processor/amplifier/mixer and the like, such that the musician is not tethered by a wireline interface (cord). See e.g., the exemplary Line 6 Relay G50 Digital Wireless Guitar System, and the Sony DWZ Series Digital Wireless Guitar Set, each of which utilize the 2.4 GHz ISM band. Hence, the present disclosure contemplates cases where the sensor 214, 216, 218 is in effect "competing" with multiple wireless interfaces, which feasibly could include: (i) the receiver apparatus for the monitored bands of interest (e.g., 2.4 GHz, 5 GHz for 802.11); (ii) the sensor wireless PAN interface to the controller 210 or other entity (e.g., 915 MHz or 2.4 GHz for ZigBee or Bluetooth), (iii) the indigenous wireless system of the musical instrument (ostensibly also operating in the 2.4 GHz band). While different MCS, spatial diversity (e.g., MIMO), and other schema are used in the different interfaces, it is none-the-less feasible that significant interference with the receiver interface (i.e., the monitored 802.11 bands) may occur, and hence the present disclosure contemplates using, inter alia, a "store and hold" time divided collection scheme for the sensors 214, 216, 218, such that the PAN interface is not utilized at the same time the receiver interface is collecting data. Alternatively, a CSMA/CD type approach can be utilized, such that the PAN interface will back off and not transmit data if it senses use of the relevant carrier by e.g., the musical instrument (or the APs, of any Wi-Fi enabled virtual or actual clients).

Additionally, in the exemplary embodiment, controller 210 is configured to forward information (e.g., RF key performance indicator (KPI) reports or data received from the AP's 202, 204, 206, 208 and/or performance reports or data received from the sensors 214, 216, 218) to the centralized server 201, including for storage on the database 203. In one variant, the database 203 is configured to store the various information described throughout the present disclosure, including for future planning such as venue/event characterization or modeling before the actual event. For example, the database 203, in one variant, stores historical data (e.g., date/time, network load, RF parametric, and event type data), and also real-time data (i.e., data monitored in real-time, during an event and/or before, such as during the pre-staging or pre-event performance phases) for events and venues. The database may also configured to store heat maps and throughput maps generated by e.g., the centralized server 201, or other processes more local to the venue(s) such as the controller 210. In another variant, centralized server 201 and/or database 203 may retrieve and correlate information (e.g., venue, time, load, and event type information) for one or more past events to use for e.g., seating or other types of location allocations for one or more future events of a similar kind.

In one embodiment, the centralized server 201 may notify an event organizer of the seating allocation indicating areas or seating with various levels of wireless coverage. The event organizer correlates the Quality Of Wireless (QoW) for the audience in different areas at the venues/stadiums/conference halls with different classes for categorized seating plans. That is, the ticket/subscription prices will depend at least in part on the QoW of the seats associated with the tickets. See, for example, FIG. 5, which illustrates exemplary categorized seating plans. With respect to the exemplary seating plan for the football game, "Category-1" tickets/seats may be priced high, where they have better wireless reception, and therefore user experience; whereas, "Category-2" tickets/seats may be priced medium, because user experience is best effort, meaning they may have poor/interrupted wireless experience due to change in wireless environment (no guarantee).

In another embodiment, the mobile devices (e.g., smartphones, tablets, laptops) may install the downloadable application or "app" 221 that allows the devices to be notified when seating with better wireless reception becomes available. In one implementation, a common protocol or compatible API (enabled by, e.g., an application available from the service provider operating the wireless infrastructure, the user's "host" service provider (e.g., an MSO) who has access to the AP/controller, etc. is used. While the present disclosure envisions a common protocol/API that is recognized across each of the AP controller, AP, and client device, those of ordinary skill in the related arts will readily appreciate, given the contents of the present disclosure, that recognition of various information (e.g., notifications, etc.) may not require such a shared protocol framework; for example, proprietary or "closed" protocols may be used between a 3 party service and $3^{rd}$ party client-side application, or the service provider, venue operator, and event provider if desired (see e.g., discussion of FIGS. 2b and 2c below). For instance, in one variant, only active subscribers of an MSO can negotiate better seating arrangements by virtue of an "entitlement"; e.g., by authenticating the user and/or user device as a registered MSO-authorized user/device via MAC address, password, etc.

Alternatively, the centralized server 201 may be configured to send or "push" notifications to subscribers or event organizers immediately and automatically once seating becomes available. In yet another variant, the centralized server 201 may notify selective clients of better seating opportunities, such as those clients that are in poor wireless connectivity areas (and hence have likely poor user experience), and who have opted in for such notifications.

Figure 2A:
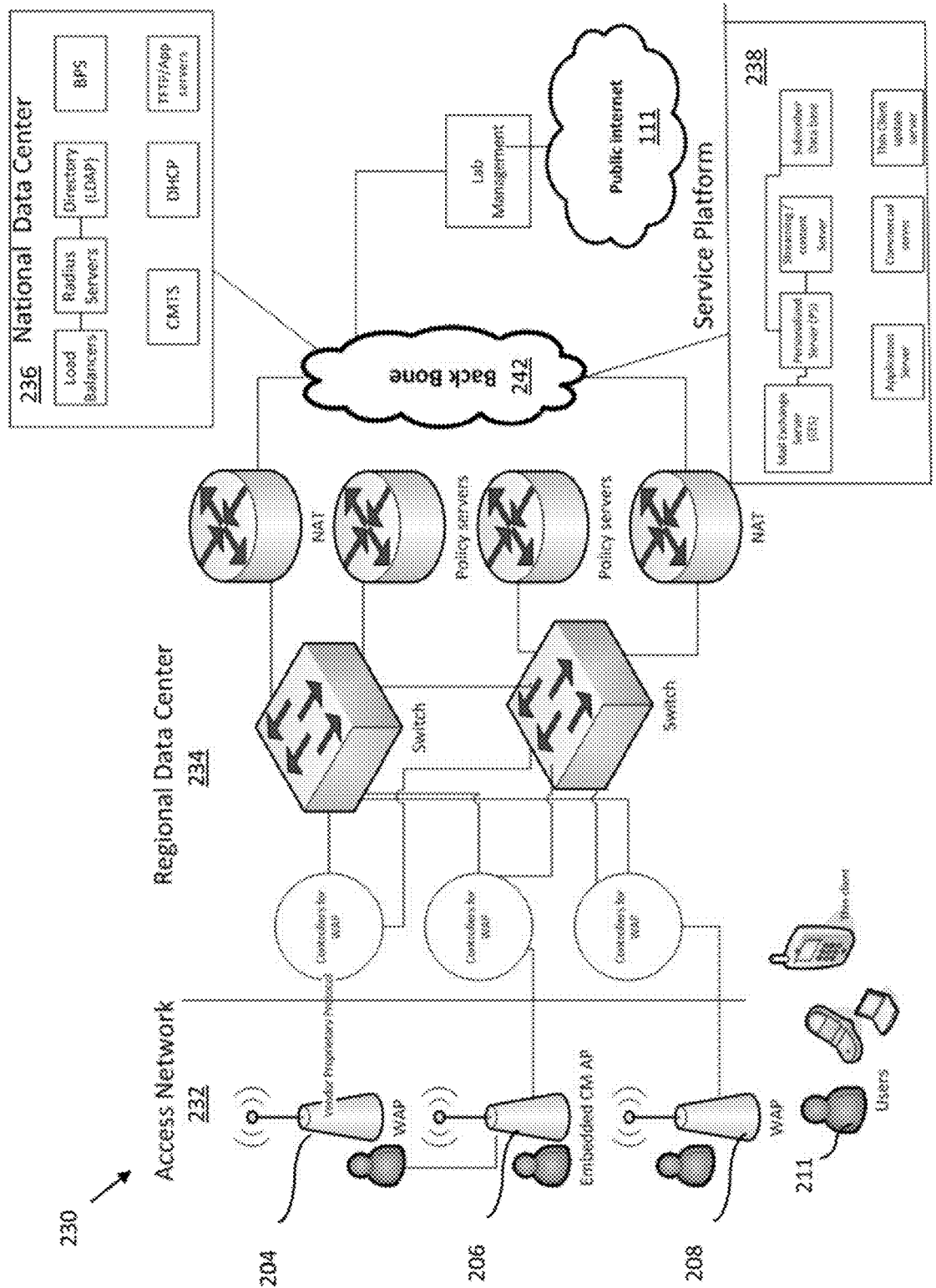
FIG. 2a is a functional block diagram of an exemplary embodiment of the infrastructure of FIG. 2, in the context of cable network architecture providing WLAN services within a venue.

FIG. 2a illustrates an exemplary cable network architecture for providing WLAN services within, e.g., a venue, which extends from user client devices within the venue to, inter alia, data centers. In the exemplary embodiment, the architecture 230 is divided into four main logical groups: an access network 232, a regional data center 234, a national data center 236, and a service platform 238. The access network 232 includes one or more APs (e.g., wireless APs 204, 206, 208) disposed within the venue, and end users 211 connected thereto via client devices. The regional data center 234 assists in providing services to the end users 241 by receiving, transmitting, and processing data between the access network 232 and the backbone 242 of the cable network. In one embodiment, the regional data center 234 is a local infrastructure that includes controllers (e.g., AP controllers), switches, policy servers and network address translators (NATs) in communication with the backbone 242. The regional data center 234 may be, for example, an intermediate data center on premises disposed away from the local APs and user premises (venue), and disposed within a larger infrastructure.

In the exemplary embodiment, the backbone 242 of the network enables data communication and services between the regional data center 234 and the national data center 236 via backhaul, and/or connection to the (public) Internet 111. In one implementation, the national data center 236 provides further top-level provisioning services to the regional data center 234 (e.g., load balancing, support of Trivial File Transfer Protocols (TFTP), Lightweight Directory Access Protocols (LDAP), and Dynamic Host Configuration Protocols (DHCP)), as well as providing the same to other data centers and/or access networks which may be part of the network operator's (e.g., MSO's) national-level architecture. The national data center 236 also houses in one embodiment more advanced backend apparatus (e.g., CMTS 156, AP controllers, Layer 3 switches, and servers for the provisioning services). In one embodiment, a separate service platform 238 may provide auxiliary services to the end users within the venue and subscribed to the MSO network provider, including access to mail exchange servers, remote storage, etc. Thus, it can be appreciated that myriad network nodes and entities, as well as connections therebetween, enable client devices (and ultimately end users 211) to maintain end-to-end connectivity across the network.

Figure 2B:
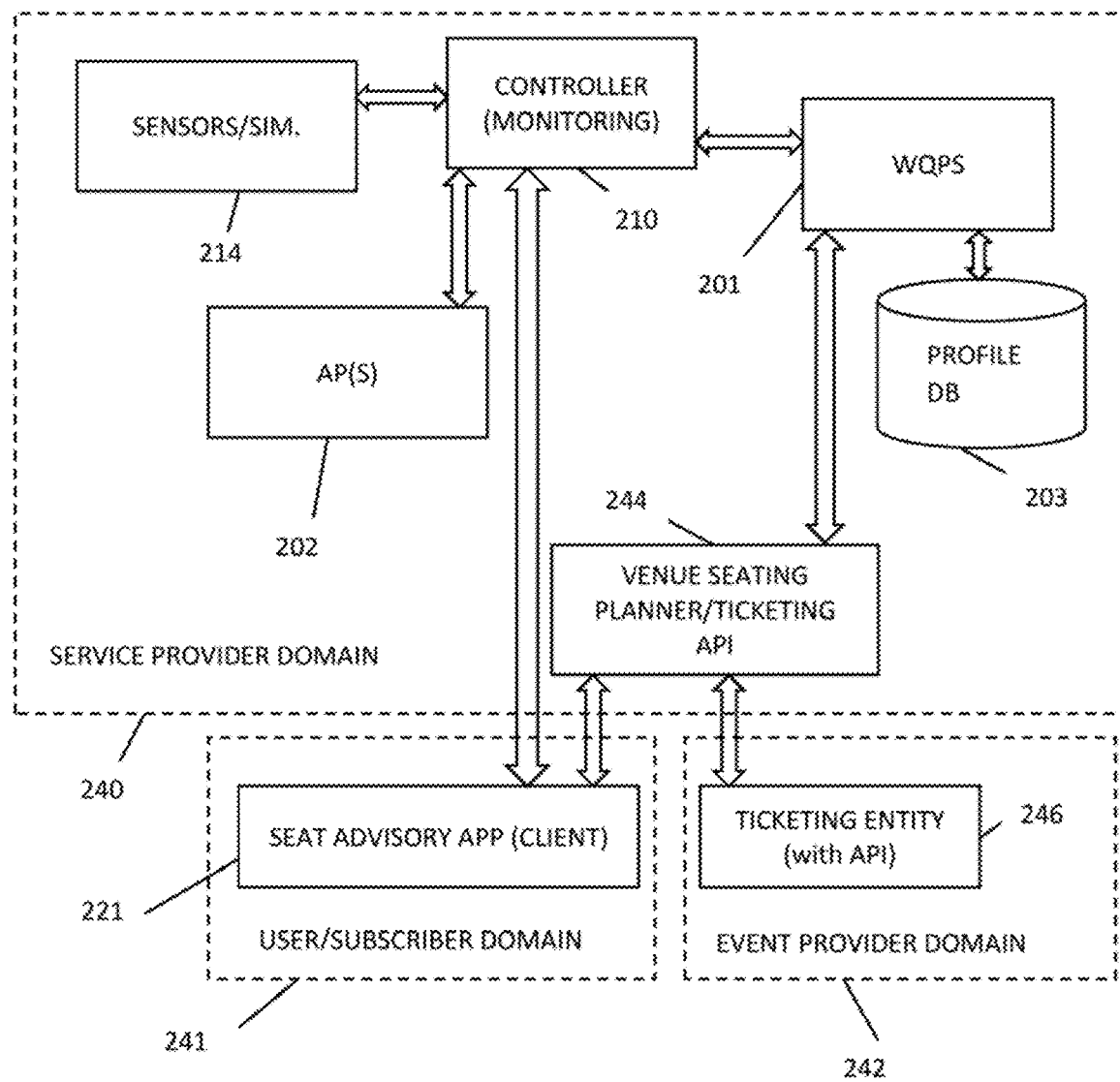
FIG. 2b is a logical block diagram showing logic-level communications between end user, service provider, and event provider domains according to one embodiment of the disclosure.

FIG. 2b is a logical block diagram showing logical flows between entities within different domains according to one embodiment of the system. As shown, the different domains in this embodiment include the service provider (e.g., MSO) domain 240, the user/subscriber domain 241, and the event provider domain 242. It should be noted that these domains are not necessarily physically separate or disparate regions or areas, but rather merely logical constructs indicating extent of control by the various entities, and in fact may overlap one another physically.

As shown in FIG. 2b, the service provider domain in this embodiment includes the controller 210 and server 201 (here, referred to as the Wireless Quality Profiling Server or WQPS) and associated profile database 203, as well as the sensor(s) 214, 216, 218 (if used) and the APs 202, 204, 206, 208. A venue location (e.g., seating) planner and ticketing API 244 is also part of the service provider domain; this API is used as a (virtual) access point by both the client app 221 and the ticketing entity 246 to exchange data with the service provider domain. For example, in one scenario (described in greater detail subsequently herein, the seat advisory app 221 makes an API call to the API 244 to invoke a "better seat" evaluation. The controller 210 responsively calls the app 221 to obtain the current physical location of the client device (e.g., via embedded GPS receiver), and the client provides the controller with the requested data. The controller 210 then conducts an evaluation (via the sensors/APs, WQPS, and data in the profile DB for the venue in question), and when determined that a better (i.e., better wireless performance seat) physically exists, then conducts a call to an API of the ticketing entity 246 to return data on what seats/locations are currently available. The returned data is then matched against the determined "better" wireless locations from the WQPS evaluation, and if the latter is also reflected in the returned available seat/location data, the user is notified via the client app 221.

The domain configuration of FIG. 2b notably places responsibility for operation of the sensors, APs, controller 210, and the development of the models and characterizations of certain venues on the MSO; logically, this makes sense if e.g., the venue utilizes the MSO's equipment such as APs, CMTS or cable drop, backhaul, etc. So, for instance, the MSO may install the APs, sensors, etc. within the venue at the venue owner's request, and maintain and utilize the system (based on requests from the venue owner and/or event provider) to characterize the venue pre-setup, post-setup (but pre-event), and/or during the event.

Moreover, the MSO in this embodiment maintains seat planning and selection cognizance, such that the ticketing entity 246 must make an API call to the MSO API 244 to check on seat allocations before issuing a ticket (i.e., so as to ensure that the MSO/WQPS has not allocated a seat desired by a non-MSO customer).

Figure 2C:
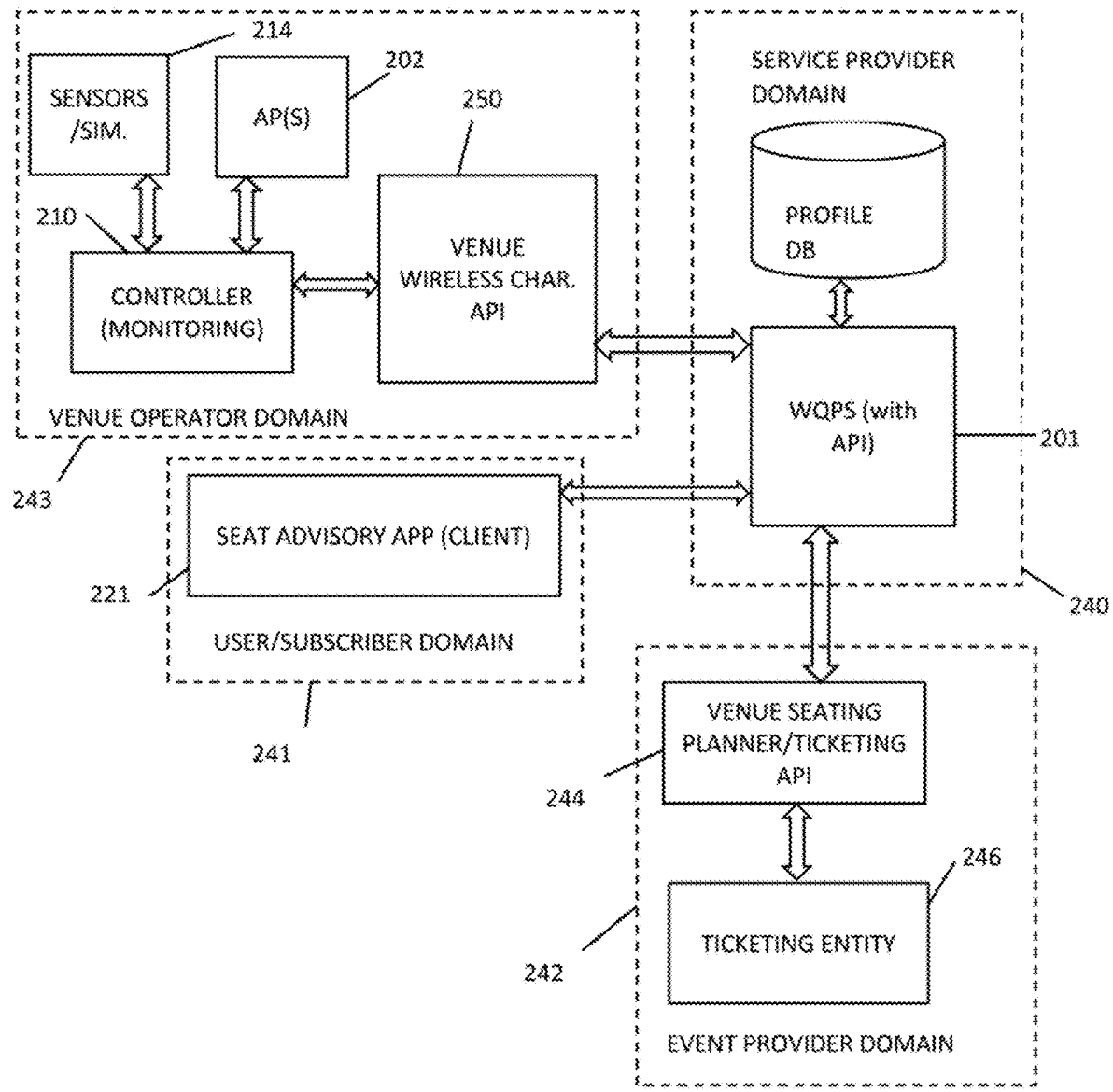
FIG. 2c is a logical block diagram showing logic-level communications between end user, service provider, venue operator, and event provider domains according to another embodiment of the disclosure.

In contrast, the domain configuration of FIG. 2c contemplates a more fragmented operational and business model, in that: (i) a separate venue operator domain 243 exists, and (ii) the venue seating planner API 244 is resident within the event provider domain 242 (and hence the MSO must make a call to the API 244 to check to see if a "better" seat identified by its algorithms is in fact available). Specifically, in this embodiment, the venue operator is responsible for maintaining the equipment on-site (e.g., via lease from the MSO, or separate acquisition). The venue operator maintains a venue wireless characterization API 250 (e.g., on an externally accessible server of the venue's computer network) such that the MSO can, at the behest of e.g., a user or MSO subscriber who is within the venue, call the API 250 to obtain wireless performance data obtained in situ at the venue (e.g., in real time, such as during an event which the user/subscriber is attending) and determine for the user/subscriber whether a "better" seat is currently available. In this paradigm, the MSO does not control the collection of data or operation of the sensors, but rather merely calls the APIs 250 to get the raw data results, which the WQPS 201 then uses to perform its own assessment based on, inter alia, knowledge of the venue obtained from the profile DB 203. The WQPS is also configured to call the event provider API with e.g., a location or seat number (once the determination is completed), to (i) check on availability, and (ii) upon confirmation from the client via the app 221, reserve or purchase the better seat immediately.

The foregoing configurations of FIGS. 2b and 2c are merely exemplary of some of the possible variants of resource allocation/cognizance within the system. Depending on the relationship between venue owner/operator, user/subscriber, service provider, and event provider, the various functions described above can be distributed and/or disposed at different logical locations (i.e., within different domains).

Methods—

Figure 3:
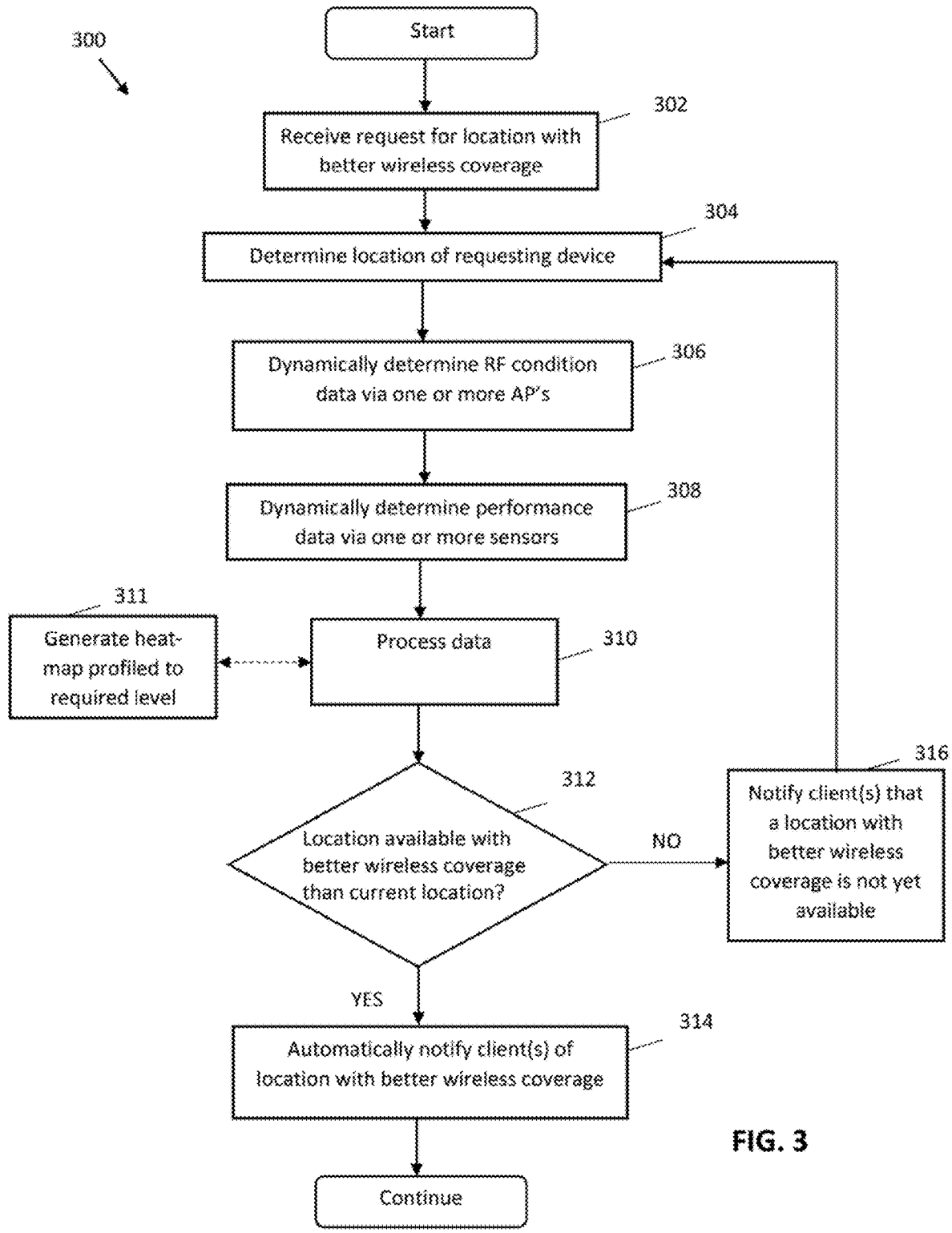
FIG. 3 is a logical flow diagram of an exemplary method for a controller to monitor a wireless network and notify one or more client devices regarding location data.
Figure 4:
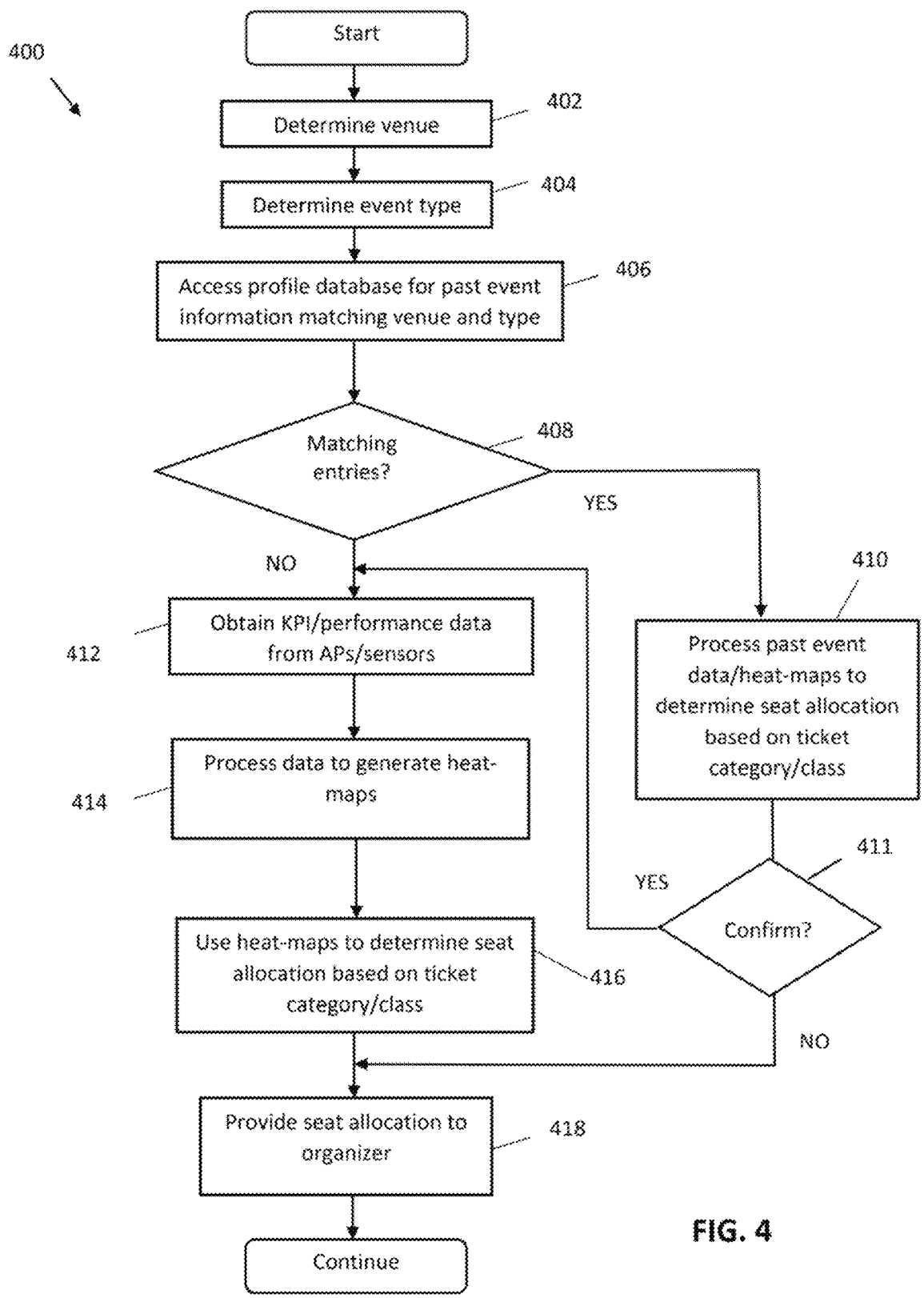
FIG. 4 is a logical flow diagram of an exemplary method for monitoring a wireless network, and utilizing profile data for one or more past events to provide location allocations, according to the present disclosure.
Figure 5:
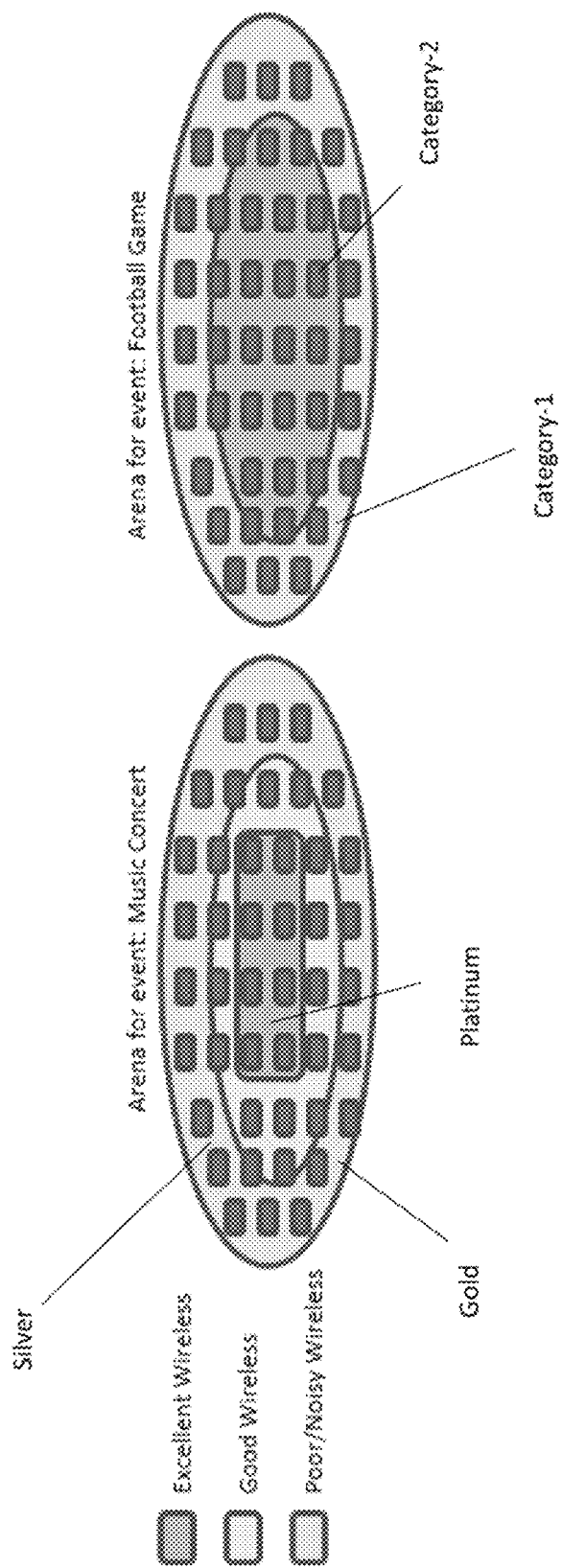
FIG. 5 is a graphical representation of exemplary seating organization/classification schemes consistent with the present disclosure.

Various methods of selecting and assigning seating via a network according to the present disclosure are now described with respect to FIGS. 3-5.

FIG. 3 illustrates an exemplary embodiment of a method 300 implemented by controller 210 (and/or centralized server 201, depending on particular implementation) to dynamically monitor a wireless network, and advise locations (e.g., seating) with better wireless coverage to one or more users of one or more respective client devices, such as upon request therefrom. It is noted that the wireless network useful with the method 300 is not limited to those embodied in FIGS. 2-2c herein, but rather may be used with any sufficiently provisioned wireless-enabled client device, and any architecture having sufficient data communication among nodes along with the requisite functionality described herein.

At step 302 of the method 300, the managing entity (i.e., controller 210 and/or centralized server 201) receives a request from one or more user client devices for a location or seating with better wireless coverage than the user's current position. The request may be sent to the controller 210 (and/or centralized server 201) via an application 221 downloaded on the client device, or through in-browser messaging (e.g., access by a mobile device browser of a specified URL).

In one alternative embodiment (illustrated in the method 320 of FIG. 3a), no request from a client is issued (and therefore, step 302 is obviated); rather, the controller 210 and/or centralized server 201 automatically advises e.g., seating with better wireless coverage to one or more selective users (such as those who are in a poor coverage or poor user experience impacted coverage area, or who have opted-in via their installed app 221 for notification or "push" data relating to possible upgrades).

At step 304 of the method 300, the location(s) of the one or more requesting client devices is determined. The location may be determined via use of, e.g., GPS/A-GPS or any other navigational technology well-known in the arts, as described elsewhere herein. In another variant, the user(s) of the one or more requesting client devices may input the seat number or location into the application 221 or in-browser messaging system, such as via a venue map displayed on a capacitive touch screen, or via text entry.

Figure 3A:
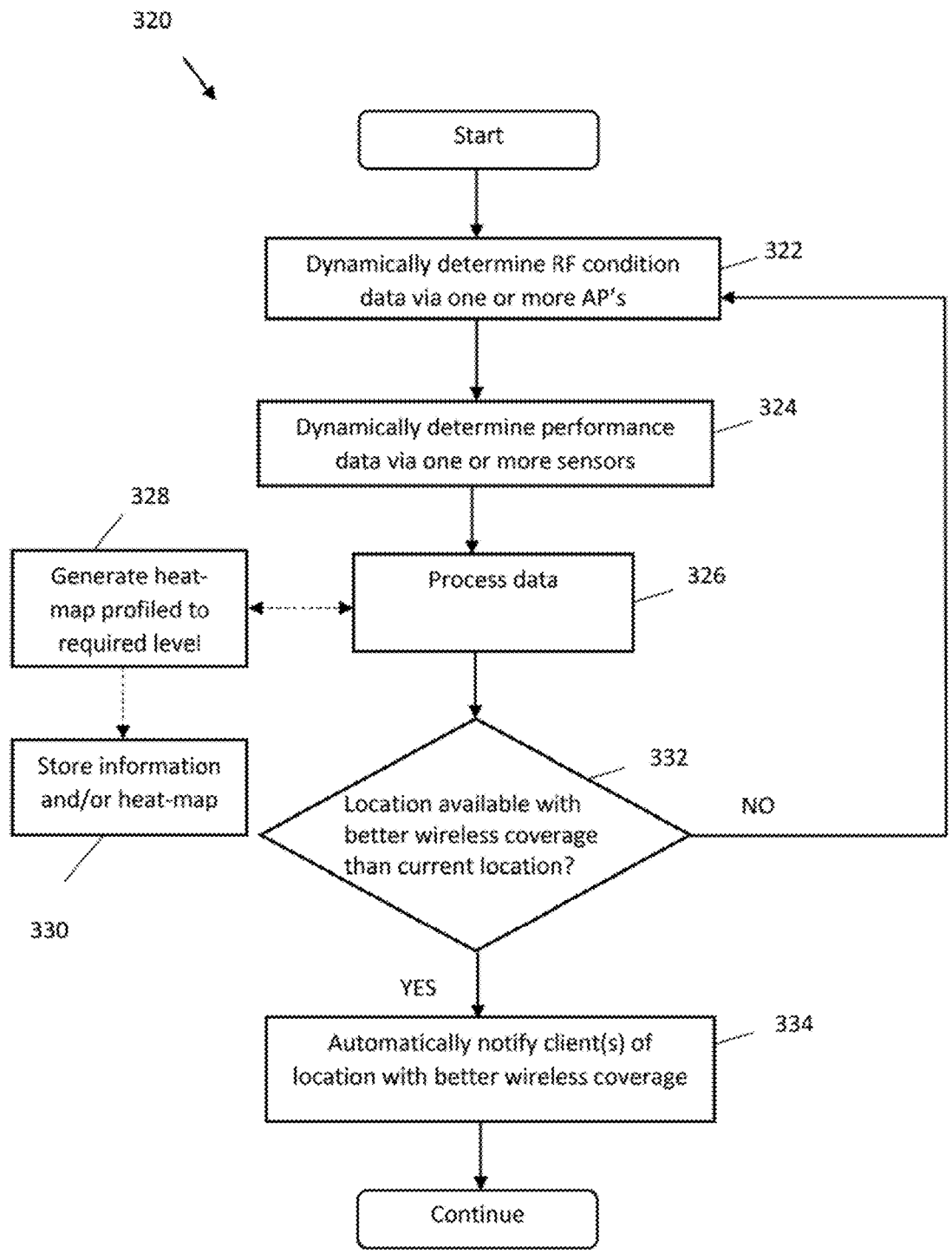
FIG. 3a is a logical flow diagram of another embodiment of the method for a controller to monitor a wireless network and notify one or more client devices regarding location data.

In one alternate implementation, the location of the one or more requesting client devices may be assumed to be the seat that the one or more requesting client devices already purchased, thereby obviating the need for step 304 (see FIG. 3a). For example, upon identification of the user (such as via authentication by password/login), or identification of the mobile device by e.g., MAC address, the user/client mobile device identity is used to automatically search records for that user relating to the event/venue in question (such as may be maintained in MSO or event provider databases), and any records identified are used as the presumed seating location.

At steps 306 and 308 of the method 300, one or more AP's 202, 204, 206, 208 and sensors 214, 216, 218 each transmit signals to the controller 210 (and/or centralized server 201) relating to monitored RF parameters of interest. In one variant, the APs' and/or sensors' signals may be sent to one or more upstream network entities in data communication therewith, e.g., cable modem, any backhaul entities (e.g., data centers or database 203), controller 210, CMTS, etc. In another variant, the AP's 202, 204, 206, 208 and sensors 214, 216, 218 may only send signals to the nearest upstream device, such as the controller 210 in FIG. 2.

In exemplary embodiments, the information sent by the AP's 202, 204, 206, 208 per step 306 comprises information relating to the status and/or the RF conditions of the respective AP's 202, 204, 2206, 208. For example, referring to FIG. 2, the AP 206 may send one or more RF KPI reports (discussed elsewhere herein) relating to its operating coverage area 222, to the requesting or aggregating upstream device( ) (e.g., controller 210 and/or centralized server 201), including information relating to link quality such as e.g., received signal strength (RSSI), signal-to-noise ratio (SNR), carrier-to-noise ratio (CNR), signal-to-interference plus noise ratio (SINR), carrier-to-interference plus noise ratio (CINR), bit error rate (BER), block error rate (BLER), packet error rate (PER), etc.

The information sent by the sensors 214, 216, 218 per step 308 may comprise, for example, data relating to: (i) purely passive RF observations by the sensor, such as e.g., RSS (relative index, or in dBm); (ii) the performance of wireless connectivity (e.g., provided by the one or more of the AP's within the sensors' 214, 216, 218 respective areas), such as BER, data rate, etc. obtained via data communications conducted between the AP and the sensors. In one variant, the information may comprise one or more performance reports obtained from the sensors 214, 216, 218 and correlated to wireless coverage of the one or more AP's 202, 204, 206, 208. For example, referring to FIG. 2, the sensor 216 may send one or more performance reports relating to that sensor's area 228, which includes portions of the coverage areas 222, 224 for the APs 206, 208, to the aggregating upstream device (e.g., controller 210 and/or centralized server 201).

The APs 202, 204, 206, 208 and/or sensors 214, 216, 218 are configured to elicit a reply or "ack" from the entity after receipt. In one exemplary embodiment, the signals/reports/ information are transmitted according to a periodic or aperiodic temporal schedule; i.e., a signal/report is sent at every predetermined interval (which may or may not be equal, and/or predicated on the occurrence of an event).

In another variant, the periodic signals are sent at a predetermined interval that may be modified by the AP, the controller 210, or the centralized server 201. Alternatively, the signals are sent at intervals depending on network conditions, e.g., traffic load, number of expected pings, expected network conditions (e.g., known offline connections in the network), size of network, time of day (e.g., peak hours). For instance, pings are sent at relatively longer intervals during peak times to keep traffic from being congested.

Accordingly, the signals/information from the one or more AP's 202, 204, 206, 208 and/or sensors 214, 216, 218 may be collected periodically (during certain intervals, or during times when sending such information will not dramatically affect, e.g., the load of the network), continuously, or upon request from the controller 210 and/or centralized server 201.

At step 310 of the method 300, the information (e.g., RF KPI reports and performance data) collected from the APs 202, 204, 206, 208 and/or sensors 214, 216, 218 is processed to determine whether there are any available alternate seats with better wireless coverage than the wireless coverage of the current seating of one or more requesting client devices (step 312). Any other information (e.g., real-time and/or historic data; historic data including, inter alia, correlated time, load, and event type data from one or more past event) may be used in the determination as well. In one variant, the controller 210, centralized server 201, and/or profiling database 203 utilizes artificial intelligence (AI) to correlate/ process the information in order to make the determination. In another variant, the controller 210, centralized server 201, and/or profiling database 203 are optionally configured to profile the RF status of the event at specific times or time periods. In one variant, the profiling comprises generating a heat-map (step 311). The heat-map is configured to resolve the spatial/volumetric heat map to the seat level (i.e., correlating RF conditions to individual seats in a floor plan; see FIG. 5 for exemplary floor plans).

Additionally, the controller 210 and/or centralized server 201 may optionally store the information (e.g., RF KPI reports from the AP's 202, 204, 206, 208, performance reports from sensors 214, 216, 218, and/or generated heat-map) in the profiling database 203 for future planning.

When available seating is found, per step 312, the controller 210 and/or centralized server 201 then automatically notifies the one or more requesting client devices of the location(s) with better wireless connectivity (step 314). Alternatively, the controller 210 and/or centralized server 201 may send notifications to selective clients, such as those in poor coverage/probable user experience impacted coverage areas (see FIG. 3A).

However, in some embodiments, when available seating is not found, per step 312, the controller 210 and/or centralized server 201 may notify the one or more requesting client devices that no locations with better wireless connectivity are available, and that the one or more requesting client devices will automatically be notified when available seating is found (per step 316). The process may then repeats back to either step 304 (dynamically determining the location(s) of the one or more requesting devices, assuming the client device may have moved), or to steps 306 and/or 308 (dynamically determining the RF condition and performance information, assuming the one or more requesting devices remain stationary, such as in the seat they originally purchased).

In the exemplary embodiment, heat-maps and/or any other information (e.g., RF condition, time, load, event type, real-time and/or historic) may be used to map seating arrangement based on classes or categories. In practice, the classes seating with better wireless coverage will typically be priced higher than the classes of seating with poorer wireless coverage. See FIG. 5 which illustrates two exemplary maps that may be generated in accordance with the present disclosure. The maps of FIG. 5 include one exemplary map for a music concert and another exemplary map for football game. In the exemplary map of the music concert in FIG. 5, there are three designated classes of seating: silver (with less capable wireless coverage), gold (with good wireless coverage), and platinum (with excellent wireless coverage).

In an example scenario, an audience member is seated in the auditorium at a silver category of seating, trying to upload/share a live video with friends/family, but the wireless user experience is very poor under current event conditions. The audience member becomes disappointed for not being able to share the event live streaming with friends/ family due to wireless connectivity issues. Therefore, the audience member invokes the (seat advisor) application consistent with the present disclosure from his/her mobile device. The system consistent with the present disclosure then provides better seating location(s) from the available un-occupied seats. The provision of better seating, in one variant, is in accordance with client's privileges/eligibility— i.e., if the available seating is in the platinum class of seating, the audience member may have to pay more in order to be able to sit in that class.

FIG. 3a illustrates another exemplary embodiment of a method 320 implemented by the controller 210 and/or centralized server 201 to monitor conditions of a wireless network, and provide location-based notifications to clients relating to wireless connectivity.

At steps 322 and 324, the controller 210 and/or centralized server 201 queries the APs and the sensors for their respective information (e.g., RF KPI reports from the AP's and the performance or other data reports from the sensors). As noted above, the signals/information from the one or more APs 202, 204, 206, 208 and/or sensors 214, 216, 218 may be collected periodically (during certain intervals, or during times when sending such information will not significantly load of the network), continuously, and/or upon affirmative request from the controller 210 and/or centralized server 201. Other schemes may be used as well consistent with the method 320 of FIG. 3a.

Per step 326, the received data from the APs and sensors is then processed by the designated processing entity (e.g., the centralized server 201) to characterize the RF spatial conditions of the relevant portions of the venue. In one variant, this data processing comprises algorithmically correlating the RF condition and performance information of the various areas of the venue with floor plans or other such descriptive data, so as to determine the relative or absolute wireless performance of a given location or feature of the venue (e.g., to a particular seat). Specifically, since the physical positions of the APs and presumably at least some of the sensors are known (and entered into the profile DB 203 of the architecture of FIG. 2), the monitoring data can be correlated to particular locations within the floor plan (or spatial volume) of the venue, which can then be correlated to locations of interest to users (such as seat locations, trade show booth locations, auto vehicle display locations, etc).

It will be appreciated that the data processing by the processing entity (e.g., server 201) may be conducted: (i) irrespective of available location, such as where a "heat map" (e.g., 2-D or 3-D plot of mean RSSI or other parameter of interest which is reflective of wireless coverage by an AP) is generated for all locations for which monitored data is available, irrespective of possible availability; alternatively (ii) after an availability filter is applied (i.e., mapping only those areas corresponding to currently available locations or seats), or (iii) combinations of the foregoing.

The availability of seating or other locations of interest may be determined via an occupancy tracker process implemented by the controller 210 and/or centralized server 201. In one embodiment, the occupancy tracker is merely configured to call to the relevant event provider API (see e.g., FIGS. 2b and 2c) with a seat number, upon which the API returns data on availability back to the calling tracker process (e.g., Y/N, or conditional Y/N with time or other condition specified). However, for less "Scripted" or rigid venues/events, such information may not be available on a per-seat or per-location basis. Hence, in an alternate embodiment, the occupancy tracker is configured to monitor the availability of seats via use of one or more of: cameras, sensors, GPS in audience mobile devices (such as via use of the location advisory application 221 running thereon), etc.

In one variant, at steps 328 and 330, the monitored RF performance data is stored in the profiling database 203 for future planning. The stored data may comprise e.g., any generated heat-maps, and any resolving the spatial/volumetric heat map to the prescribed level of resolution (e.g., correlating the monitoring data/heat map to individual seats in the venue floor plan) (step 328).

When available seating (with better wireless performance) is located, per step 332, the controller 210 and/or centralized server 201 then automatically notifies the one or more selective clients, such as those in coverage areas with performance below that associated with the identified available location or seating, per step 334. For example, if the analysis of the monitored data and heat map show that certain areas of the venue have performance levels of a given level or quality, all other areas greater than a prescribed value below that given level or quality (whether on an absolute or relative quantitative or qualitative scale) are identified algorithmically, and seats within those identified areas are candidates for further notification (e.g., by correlation of the seat number to a user ticket database, which can then be cross-correlated to the user's mobile device via e.g., the MSO's subscriber database). Alternatively, "stuffed" beacons as described elsewhere herein may be used to (selectively or non-selectively) notify users within a coverage area of a given AP that better coverage exists. The user's mobile device browser can also be used to provide such notifications, such as via an established HTTP/HTTPS session between the browser and the central server 201 or its proxy.

However, when performance-enhanced available seating is not found per step 332, the process returns to steps 322, 324, and 326 to dynamically monitor and process information relating to RF conditions of various areas of the venue and performance of one or more of the APs.

Figure 3B:
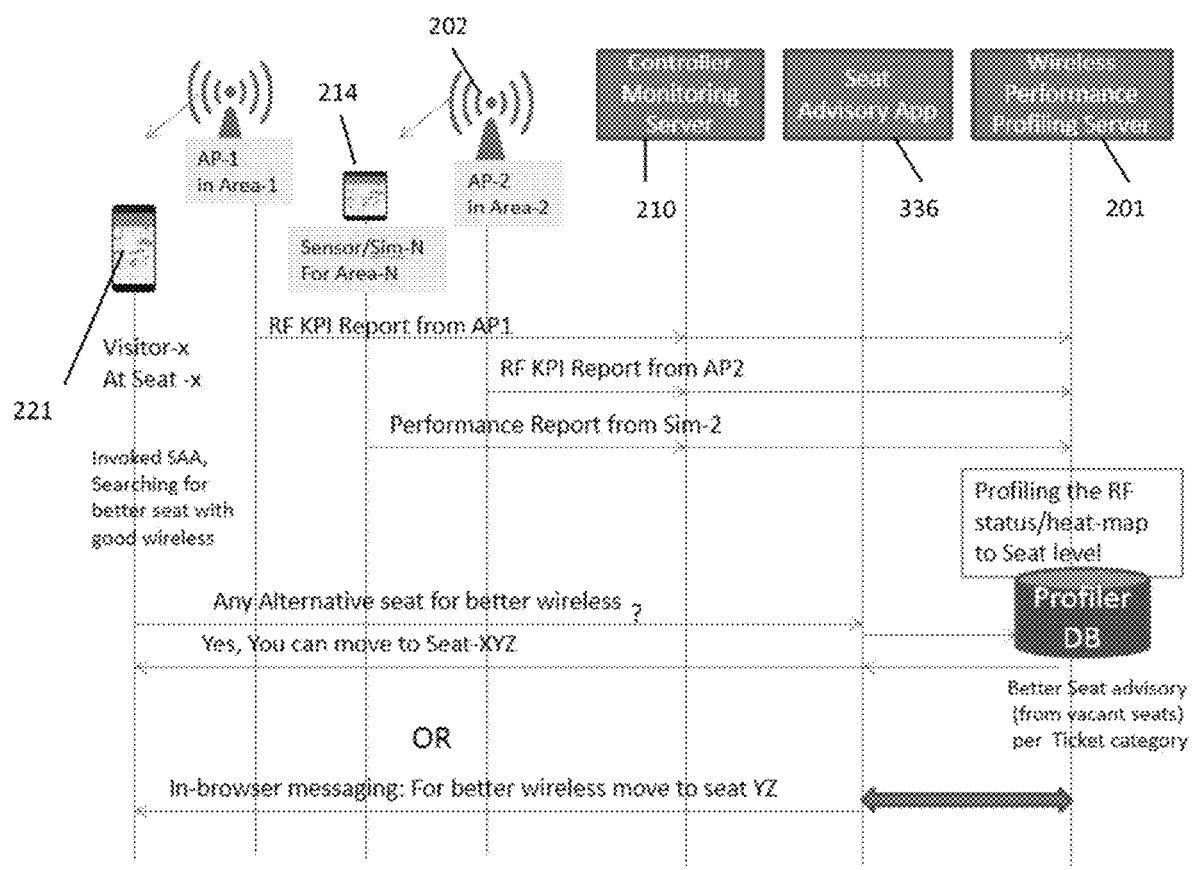
FIG. 3b is a graphical representation of exemplary signal flow between entities of the network of FIG. 2, according to the method of FIG. 3.

FIG. 3b is a ladder diagram illustrating one particular implementation of the methodology 300 of FIG. 3. In this implementation, the controller 210 dynamically monitors a wireless network, and the centralized server 201 (Wireless Performance Profiling Server) advises seating with better wireless coverage to one or more users of one or more respective client devices upon request sent from a computer application 221 disposed on the client device and in communication with a Seat Advisory App" (SAA) function 336, which may be operative to run on e.g., the controller 210 or the central server 201.

Referring now to FIG. 4, an exemplary embodiment of a method 400 implemented by the controller 210 and/or centralized server 201 to monitor a wireless network, and provide optimal location allocations to an event organizer, is described.

At step 402 of the method, the venue identity is determined, such as via a stored unique venue identifier. This identifier may be unique to the venue instance (e.g., a particular structure), or merely unique to a class of similar venues (e.g., non-domed elliptical football stadiums).

At step 404, the event type is identified. Again, either specific or class-specific identifiers may be used in describing the event (e.g., concert by Band X, or rock music concert, respectively).

Per step 406, the identification data from steps 402 and 404 is used to enter the profile DB 203 (FIG. 2) to attempt to identify similar events and/or venues. If a matching entry or entries is/are found per step 408, the data associated with those entries is utilized per step 410 to determine a seat allocation for the incipient event, such as one based on category or class of user or subscriber (e.g., silver/gold/platinum level ticket, or MSO customer/non-MSO customer, etc.). As an aside, since an empty venue (e.g., auditorium/conference hall) is free from most man made noise and/or interference sources, the empty environment likely produces the best wireless coverage and user experience. Accordingly, in the exemplary embodiments of the methods disclosed herein, the in situ information (e.g., RF KPI and performance reports) from the AP's 202, 204, 206, 208 and/or sensors 214, 216, 218 is ideally collected during the pre-staging phase (i.e., before performance/main event occurs; e.g., band setup/sound checks). By equipping the venue with the necessary items to organize and ultimately conduct the event, the RF conditions more closely resemble the RF conditions during the event. However, the presence of humans and their client devices will also present various (typically) negative characteristics for wireless propagation. Therefore, in one variant, per step 408, the controller 210 and/or centralized server 201 accesses the profiling database 203 for historical data relating to past events similar to the current event (step 308) taken at the time of the event (or immediately pre-event), so as to identify the most relevant data. However, if the data present in the DB 203 is merely "empty environment" data, it's relevance is questionable, and hence the algorithm 400 enables confirmation via current data (presumably obtained during or immediately before the event occurs) per step 412 described below.

If no matching entries are found in the profile DB per step 408, then per step 412, the APs 202, 204, 206, 208 and sensors 214, 216, 218 are solicited to transmit KPI reports and performance data, respectively, to the controller 210 and/or centralized server 201, such as via queries or polling messages issued from the controller 210 and/or centralized server 201 to the AP's and the sensors for their respective information.

Additionally, the controller 210 and/or centralized server 201 may optionally store the information (e.g., RF KPI and performance reports) from the APs 202, 204, 206, 208 and/or sensors 214, 216, 218 in the profiling database 203 for future planning, especially if the gathered data was obtained under representative conditions as described above.

Per step 414, the monitored information is then processed to generate heat maps and other desired data which can be utilized to determine seating allocations (step 416), as previously described.

In some variants, the processing comprises utilizing computer-based dynamic RF modeling to correlate the present (real-time) information with the historic information, including to find past events/venues similar to the present event/venue (e.g., where there is no precise match for the venue/event per steps 406 and 408). Once one or more "similar" past events is/are found, the controller 210 and/or centralized server 201 then utilizes the present performance data and/or the historic information to select and allocate seating arrangements, such e.g., based on classes. For example, in one embodiment past data/historical reports (such as KPI built during "base-lining" the venue staging) captured during one or more of a similar type of event as the incipient event and conducted in the same venue, is used as input to one or more modeling algorithms in order to characterize the incipient event. For an exemplary concert, while audience seating distribution, ancillary display placement (e.g., large-screen HDTVs disposed within the venue and visible to certain parts of the audience which do not have a good/direct view of the stage), and musical instrument placement under the prior art might be driven solely by other factors such as acoustics, aesthetics (stage appearance), visibility of the performers to the audience, etc., characterization of the environment using the methods of the present disclosure provides additional data which can be used in determining seating configuration and instrument placement (in conjunction with the foregoing factors). Placement of e.g., metallic elements such as tables, instruments, scaffolding or support structures in areas where Wi-Fi AP coverage impacted (due to reflection/multi-path) can advantageously be avoided (or at least the effects of such placements mitigated in cases where the placement options are limited or controlled by other factors).

In one implementation, the aforementioned algorithmic analyses are conducted in effect transparently to the end user, using computerized 3D modeling algorithms operative to run on the controller 210 and/or the centralized server, depending on the particular architecture chosen. Specifically, the software is coded to model 3D WLAN wave propagation within an indoor (or outdoor, such as for "open air" events or those held in largely open-top venues) with the frequency bands of interest, including e.g., 2.4 GHz and 5 GHz.

In one embodiment, the modeling software is configured to analyze RF propagation and loss mechanisms including one or more of: (i) reflection, which occurs when an RF signal encounters a surface that is large relative to the wavelength of the signal; (ii) diffraction, which typically occurs at the edge of an (RF) impenetrable body, such as one that is large compared to wavelength of the RF signal of interest; and (iii) scattering, which occurs when an RF signal encounters an object whose size is on the order of the wavelength of the RF signal or less.

Hence, in an exemplary indoor environment such as a venue, reflection may occur at large obstacles, such as where plane waves are incident on a surface having dimensions that are very large relative compared to the wavelength. In the present case, $c=\lambda f$, so for 2.4 GHz, the wavelength ($\lambda$) is (3 E+8 m/s)/2.4 E+9 Hz)=⅛ m or 12.5 cm, while for 5 GHz, the wavelength is roughly 6 cm. Hence, anything within the venue having a size much greater than such dimensions is a potential WLAN reflector.

Likewise, scattering occurs at smaller obstacles or structures, including when the plane waves are incident upon an object whose dimensions are on the order of a wavelength or less (e.g., a half-foot or less in the exemplary bands), which clearly may exist in any number of structures and their components (e.g., metallic brackets, supports), musical instruments, seats, display devices, etc. Such scattering causes energy to be redirected in many directions, in effect diffusing the intensity of the incident signal upon reflection.

RF wave diffraction at e.g., edges may occurs (according to Huygen's principle) when there is an obstruction between the transmitter and receiver antennas, and secondary waves are generated behind the obstructing body. Notably, the higher the RF signal frequency, the less such diffraction occurs.

RF wave penetration of objects will allow propagation of waves when there is an obstruction(s) between the transmitter and receiver, with varying levels of absorption of the penetrating signals based on the particular properties of the object(s).

In terms of wireless (data) channel performance, path losses and "shadowing" are considered, as are self-interference mechanisms. Specifically, multipath (Rayleigh) fading and Doppler shift (for moving objects, if applicable) can result in so-called "delay spread", in effect producing inter-symbol interference (ISI) due to blurring of the arrival times of the radio waves. Path losses are generally a function of transmission-to-receiver distance, and may vary over a comparatively longer time frame. Similarly, shadowing (attenuation due to structures or objects) may be largely time-invariant or long term in nature and large in terms of area scale, and is often modeled in terms of a log-normal distribution. Fading, in contrast, can have smaller time scale variations (e.g., as a user walks with their mobile device), and may be modeled using e.g., Rayleigh or Ricean distributions.

Other effects on channel quality may result from background noise (e.g., low SNR), as well as other users (including effects due to common channel interference (CCI) and adjacent-channel interference (ACI)).

Exemplary techniques for evaluating WLAN and other RF signals and modeling environments and which may bus used consistent with certain aspects of the present disclosure are described in U.S. Pat. No. 9,648,466 issued May 9, 2017 and entitled "Generating a model for positioning", U.S. Pat. No. 9,115,997 issued Aug. 25, 2015 and entitled "Modeling characteristics of a venue," and U.S. Pat. No. 9,609,617 issued Mar. 28, 2017 and entitled "Locating electromagnetic signal sources", each of the foregoing incorporated herein by reference in its entirety. Likewise, exemplary commercial RF indoor heat-mapping software which may be adapted for use consistent with the present disclosure includes the "Wireless InSite" software offered by Remcom Corporation of State College, Pa., although others may be readily substituted, such as the CINDOOR tool described in "CINDOOR: An engineering tool for planning and design of wireless systems in enclosed spaces," F. P Tones, et al., IEEE Antennas Propagat. Meg., vol. 41, no. 4, pp. 11-22, September 1999. Incorporated herein by reference in its entirety.

It will also be appreciated that, based on channel quality, varying types of operations can or cannot be performed at a prescribed range. For example, within a "transmission" range, communication over the channel with comparatively low error rate is possible. At greater ranges (from the transmitter), detection of the transmitted signal by one or more receivers is possible, but data communication over the channel may not be possible (or at least it is severely degraded in terms of throughput due to high BER/PER/FER associated with the received and decoded data). At yet greater ranges from the transmitter (a so-called "interference" range), a transmitted signal may not be detected by the receiver, such as where it is below the detection threshold prescribed by the receiver device's air interface and associated protocols, such as −80 dBm).

It will be appreciated, however, that certain implementations of the invention may utilize purely a "similarity" analysis (as opposed to modeling per se) to at least identify the expected performance of a given venue under certain conditions. For example, in the simple case of an incipient musical act which will be positioned on a fixed stage within a venue, and fixed venue seating, and no other salient structural additions to the venue or stage, the RF performance obtained during such an event may substantially replicate that of a prior musical act on the same stage (and generally in the same position), especially at generally similar audience attendance, since the prior (historical) act can be presumed to have generally similar types of electrical/electronic instruments, wireless microphones, etc., and the audience can be presumed to be generally laden with mobile wireless device users with wireless devices generally presumed to have WLAN, Bluetooth, and cellular (e.g., CDMA or LTE-based) interfaces. Therefore, without any a priori knowledge or modeling, the heat map generated for the incipient musical event can be used as the basis for the seat allocation or similar functionality described elsewhere herein.

The foregoing approach can also include a "verification" function, such as where the heat map data obtained during the prior event is verified during the incipient event (when it occurs) using indigenous sensors, APs, etc. within the venue as described with respect to FIG. 2 above. For example, in one implementation, the software is configured to, once a sufficiently similar event/venue has been identified, perform heat map generation during the event to confirm general data correspondence at certain prescribed "test" locations within the venue, in order to validate the selected prior model/data.

Returning again to the method 400 of FIG. 4, at step 418, the seating allocations are then provided to (or otherwise coordinated with) the event organizer.

Figure 4A:
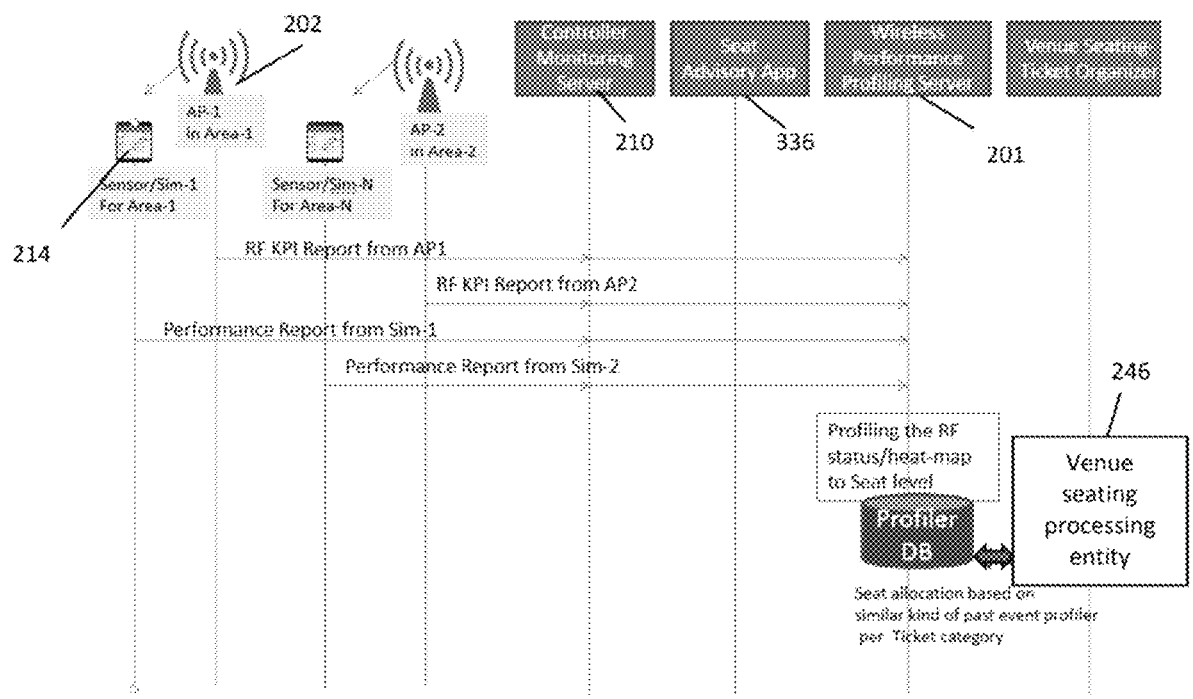
FIG. 4a is a graphical representation of exemplary signal flow between entities of the network of FIG. 2, according to the method of FIG. 4.

FIG. 4a is a ladder diagram illustrating one particular implementation of the methodology 400 of FIG. 4.

Figure 4B:
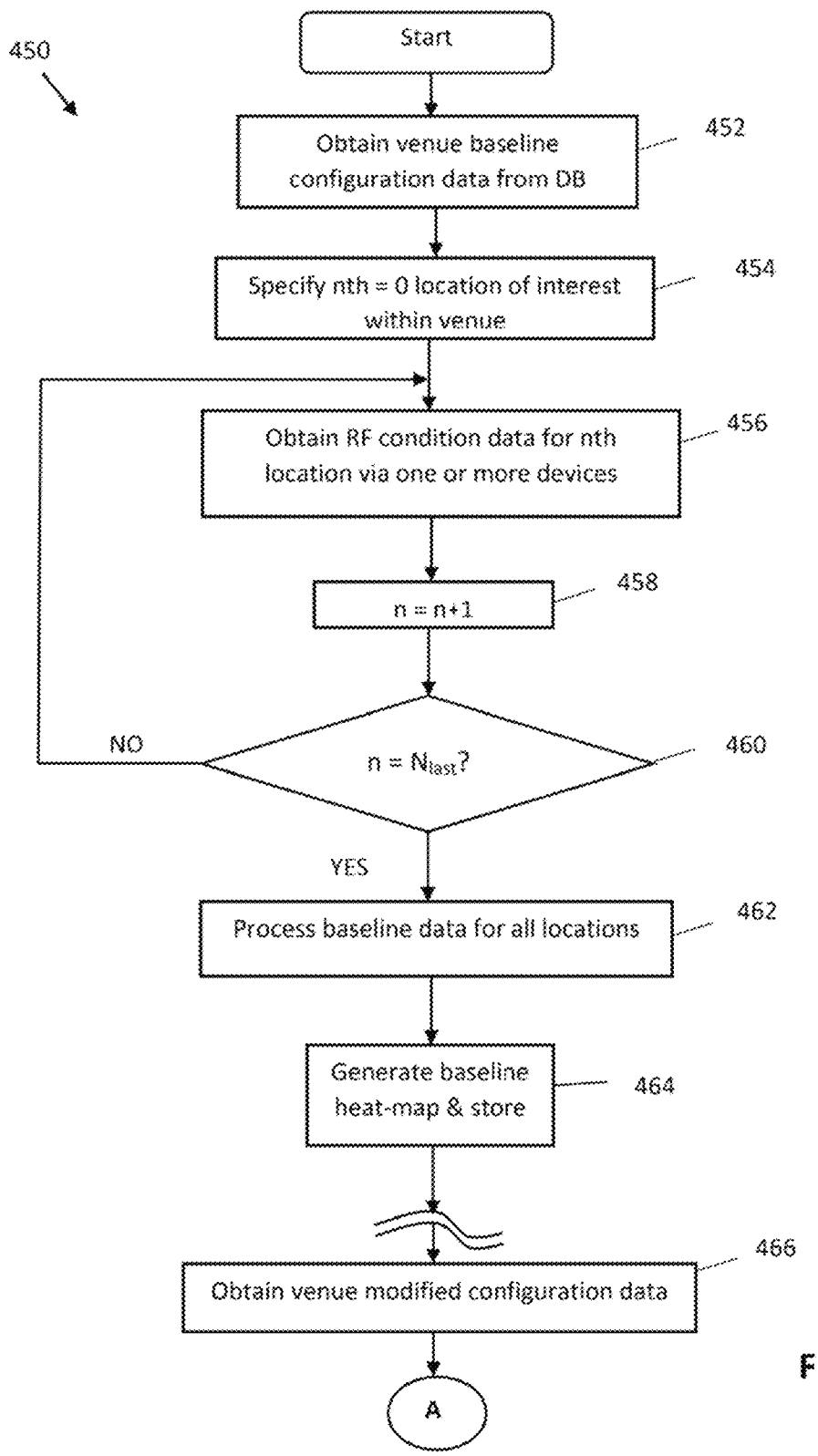
FIG. 4b is a logical flow diagram of an exemplary method for characterizing the wireless performance of a venue as a function of configuration changes thereto (e.g., in preparation for an event), according to the present disclosure.
Figure 4B:
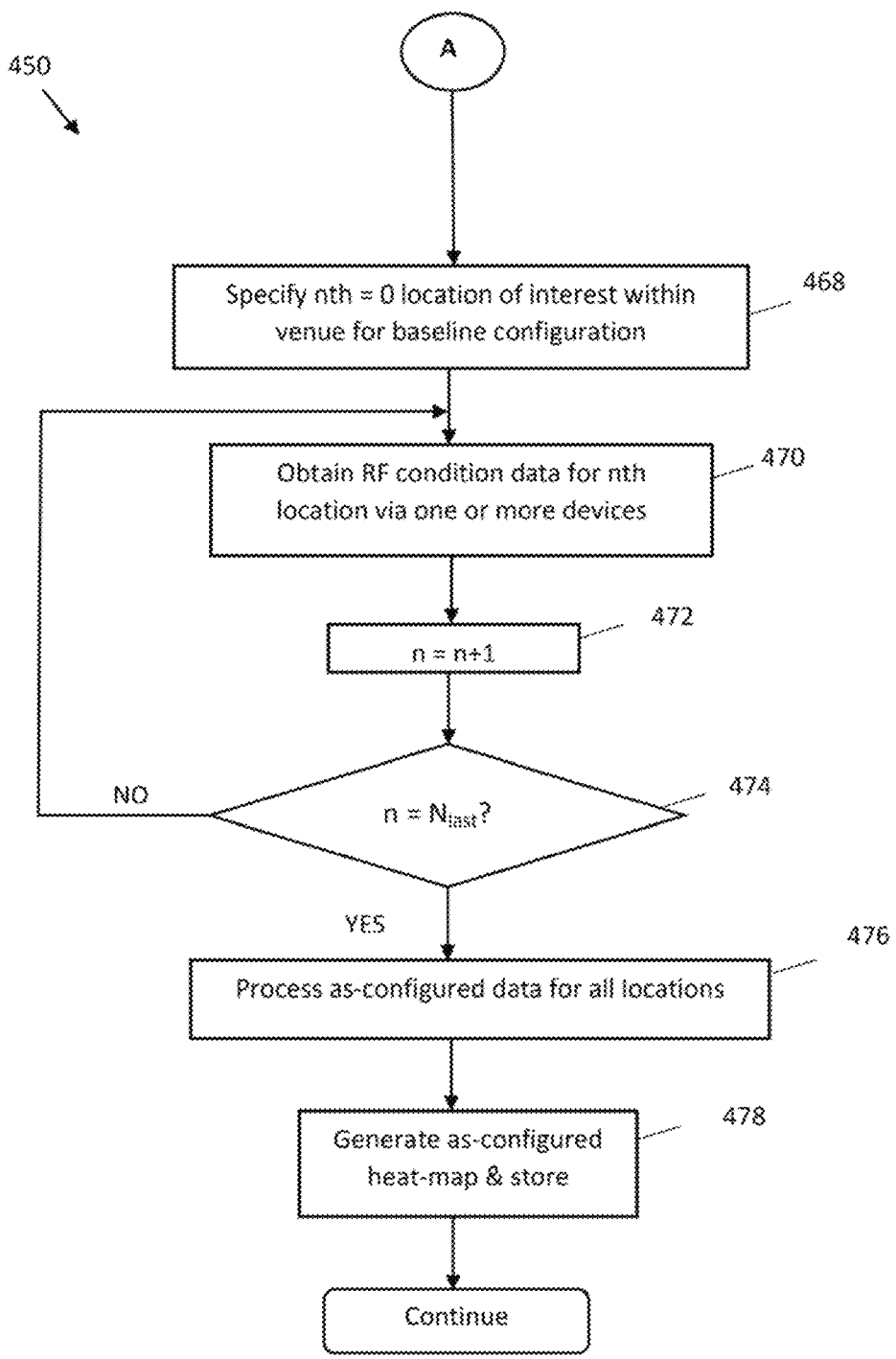

FIG. 4b is a logical flow diagram of an exemplary method for characterizing the wireless performance of a venue as a function of configuration changes thereto (e.g., in preparation for an event), according to the present disclosure. As shown, the method 450 includes first obtaining venue baseline configuration data, such as from the profile DB 203 or other such source (step 452). Next, per step 454, the first (zero-th) location of interest within the venue is specified. This may be for example a large subsection of the venue, smaller portion, or even a specific seat, depending on the desired granularity.

Next, per step 456, the RF performance and operational data for the selected location are obtained from one or more relevant sensors 214, 216, 218 and APs 202, 204, 206, 208, as previously described herein.

Per step 458, the location index is incremented, and the next location within the venue evaluated per step 456, and the data collected recorded. When the last location has been characterized (step 460), the baseline data for all locations is processed, e.g., into a spatial 2-D or 3-D heat map (step 464), and the processed data stored.

Next, after the configuration of the venue has been modified (e.g., for setup of a band), the relevant configuration data for the modifications is obtained (step 466). This data may include for example locations of walls or partitions, setup of the stage, placement of musical instruments, alteration of the location of the APs, sensor locations, etc.

Then, per steps 468 through 478, the above-described baseline characterization is repeated, only for the new configuration. A new heat map is generated and stored, and the two heat maps (baseline and altered) can be algorithmically compared and correlated to the configuration change data, which can then be used to, for instance, extrapolate performance data for similar changes to other venues (e.g., installation of a metal framed stage of equivalent size in another, different music hall).

It will be further appreciated that the methods and apparatus described herein may be configured so as to avoid "hunting" or unduly frequent communications to the client device (whether via installed client app, browser app, or other messaging context such as SMS). Specifically, in that RF spatial performance parameters potentially may vary significantly within extremely short temporal windows under certain scenarios (e.g., very mobile performers, movement of the audience and their client devices, changes in EMI due to unshielded lighting cable emissions under different lighting "sets", etc.), it is desirable to smooth what may be otherwise choppy user experience by e.g., temporal averaging of KPI and/or performance data, and/or selective filtering of anomalous data. For example, seating evaluations for a given client device may be limited to occur only during certain temporal windows, and/or with only a maximum prescribed frequency. In this manner, users are not "seat hopping" at excessive frequency.

Similarly, trend analysis may be utilized, such that anticipatory analysis of the venue and its conditions may occur in environments which exhibit detectable trends (e.g., degradation of general RF performance due to e.g., incipient weather events, solar radiation, increased incidence of air traffic, etc.), such that the affected users can be advised or migrated to better coverage or performance areas before user experience is significantly impacted. Consider the case of multi-day event such as a trade show within a convention center; if a known interferer, outage, etc. is incipient, the user might be advised to relocate their display, booth, etc. to avoid a service interruption.

Figure 6:
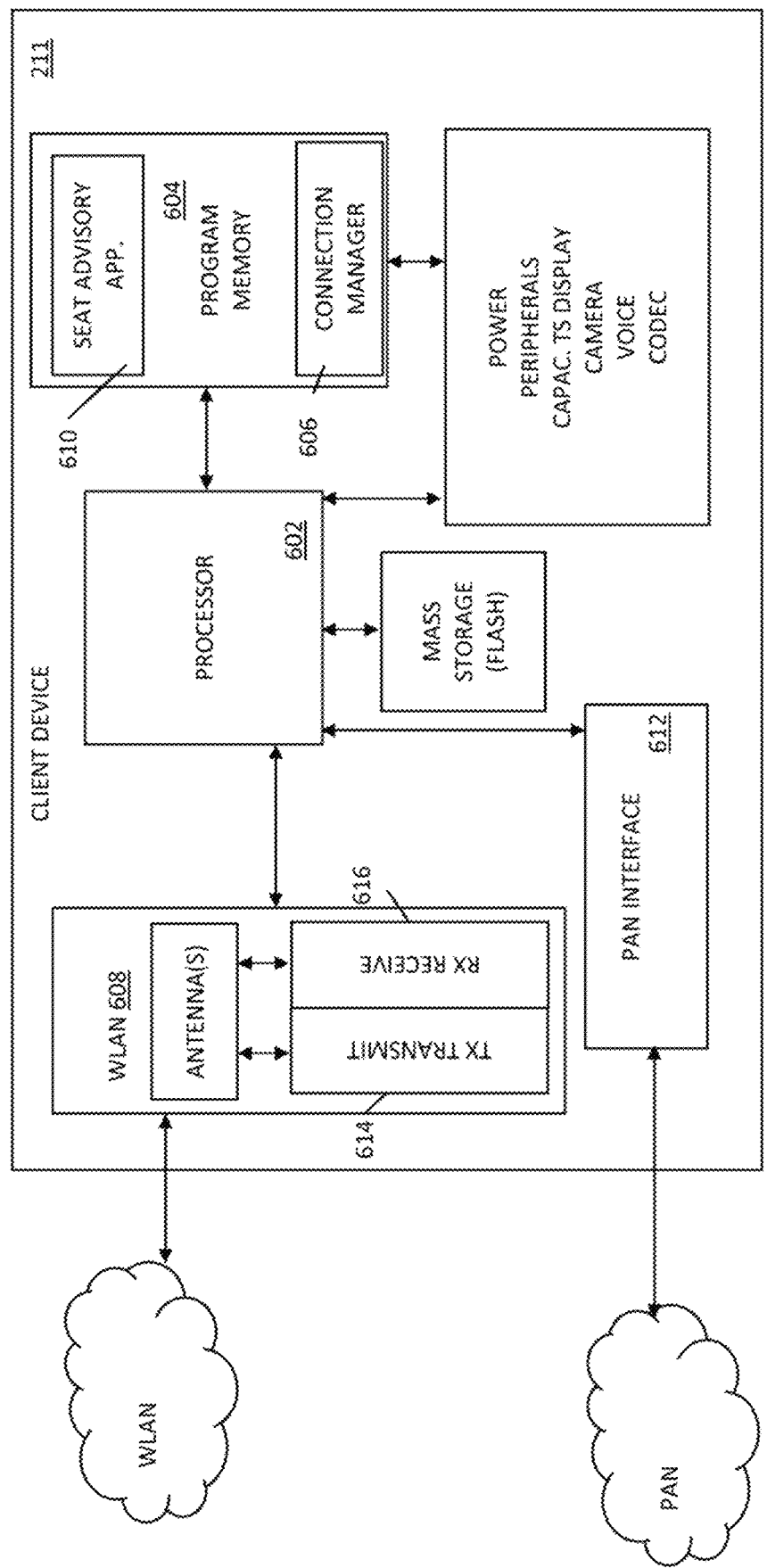
FIG. 6 is a functional block diagram of an exemplary embodiment of a client device apparatus according to the present disclosure.

Client Device—FIG. 6 illustrates an exemplary wireless client device 211 according to the present disclosure. As shown, the client device 211 includes, inter alia, a processor subsystem 602, a memory module 604, connection manager 606, a WLAN radio frequency (RF) network interface 608, a location advisory module (application) 610, PAN module 612, a WLAN transmit module 614, and a WLAN receive module 616.

In one exemplary embodiment, the processor 602 may include one or more of a digital signal processor, microprocessor, field-programmable gate array, or plurality of processing components mounted on one or more substrates (e.g., printed circuit board). The processor subsystem 602 may also comprise an internal cache memory. The processor subsystem is in communication with a memory subsystem 604, the latter including memory which may for example comprise SRAM, flash, and/or SDRAM components. The memory subsystem may implement one or more of DMA-type hardware, so as to facilitate data accesses as is well known in the art. The memory subsystem of the exemplary embodiment contains computer-executable instructions which are executable by the processor subsystem.

In this and various embodiments, the processor subsystem 602 is configured to execute at least one computer program stored in memory 604 (e.g., a non-transitory computer readable storage medium).

In one embodiment, the location advisory application 610 is a software module (application) operative to run on the processor 602. The location advisory module 610 is configured to receive messages (e.g., notifications that a location or seat with better wireless connectivity is available) via the WLAN interface 608 or the PAN interface 612 (or even a cellular data connection if present, such as an LTE/LTE-A interface, not shown), and perform various functions related to display of information (such as display of a graphic of the venue).

In one or more embodiments, the seat advisory manager includes an internal cache or memory configured to hold data associated with one or more messages. In some cases, the processor 602 or the seat advisory manager 610 may not be able to be interpret certain messages (at least immediately). For instance, in some cases, the received messages may have incomplete information (e.g., with respect to content fragmented across multiple subsequent frames), or be encrypted or scrambled with a scheme unknown to the client device. In one variant, messages that have shown no correlation with any known information or with other signals may be discarded from memory immediately or after a period of time. In some embodiments, application program interfaces (APIs) such as those included in an MSO-provided mobile application or those natively available on the client device 600 (e.g., as part of the computer program noted supra) may also be stored in memory 604. Such APIs may include common network protocols or programming mechanisms configured to enable communication with other network entities, such as for data requests or provision of data to the controller 210 or other network entity. For example, the location manager app 610 on the client may be configured to make an API call to a stored API URL or address to obtain data relating to the map or extant seating within the current venue.

The WLAN radio/modem subsystem of the client device 600 comprises a TX transmit module 614 and RX receive module 616. The WLAN network interface 608 generally incorporates an assembly of filters, low noise amplifiers (LNAs), power amplifiers (PAs), and antenna assemblies that are configured to transmit a modulated waveform via the OFDM air interface. The radio/modem subsystem may be configured to support MIMO (multiple input, multiple output) antenna technology in which multiple antennas are used to transmit and receive signaling. With MIMO, multiple independent data streams can be transmitted in parallel using the same time-frequency resource. To distinguish the data streams sharing this same time-frequency resource, spatial division multiplexing is applied. Those of ordinary skill in the related arts will readily appreciate that SISO (single in, single out), SIMO (single in, multiple out), and MISO (multiple in, single out) antenna schemes may be substituted with equivalent success.

The client device 600 of the present disclosure is primarily directed to mobile consumer electronics devices, such as, but not limited to mobile devices such as handheld computers, PDAs, personal media devices (PMDs), smartphones, tablets, and "phablets," vehicle infotainment or similar systems, and personal computers (PCs), and minicomputers, whether desktop, laptop, or otherwise. Artisans of ordinary skill will readily appreciate that consumer electronics devices may incorporate various other assorted components necessary to support typical functions of such devices, including power modules, peripherals modules, display modules (associated with, e.g., a display screen, UI, GUI), camera modules, voice codec modules, etc.

It will also be appreciated that in some implementations of the present disclosure, the WLAN or other modem of one or more client devices may be used as the RF sensors described above. For example, in one such implementation, the controller 210 may establish data communication with the client device(s) of interest via a WLAN data channel with the serving AP within the venue, over which the controller 210 can transmit commands (or even firmware updates or configuration changes) to reconfigure the WLAN modem of the client device to operate as a sensor and collect/report data. This approach may be as benign as configuring the client device modem to simply report data to the control which may already be collected as part of the extant WLAN protocol (e.g., RSSI measurements made by the client modem) while continuing data operations between the client and the AP, or more pervasive changes such as where the WLAN data connection is suspended or dropped for a period of time in order to permit the client modem to collect and store data regarding the prevailing RF environment in one or more frequency bands of interest, such collection which may be inconsistent with (or require resources that are necessary for) normal data communications. The changes in configuration may also include a sensitivity analysis or prescribed algorithm or routine to sample the prevailing RF environment at the location of the client, such as where e.g., client WLAN Tx power in increased/reduced, then MCS is changed and then returned to original state, then beamforming/spatial diversity is changed then returned, etc., with the data obtained by the modem during such changes recorded and sent to the controller 210 via the AP.

In another implementation, the aforementioned beacon-stuffing approach can be used by the controller 210 (via the communicative AP) to transmit "side channel" data relating to configuration changes or reports which enable and/or cause the client device to function as a sensor (at least incidentally or intermittently) as previously described.

Controller Apparatus—

Figure 7:
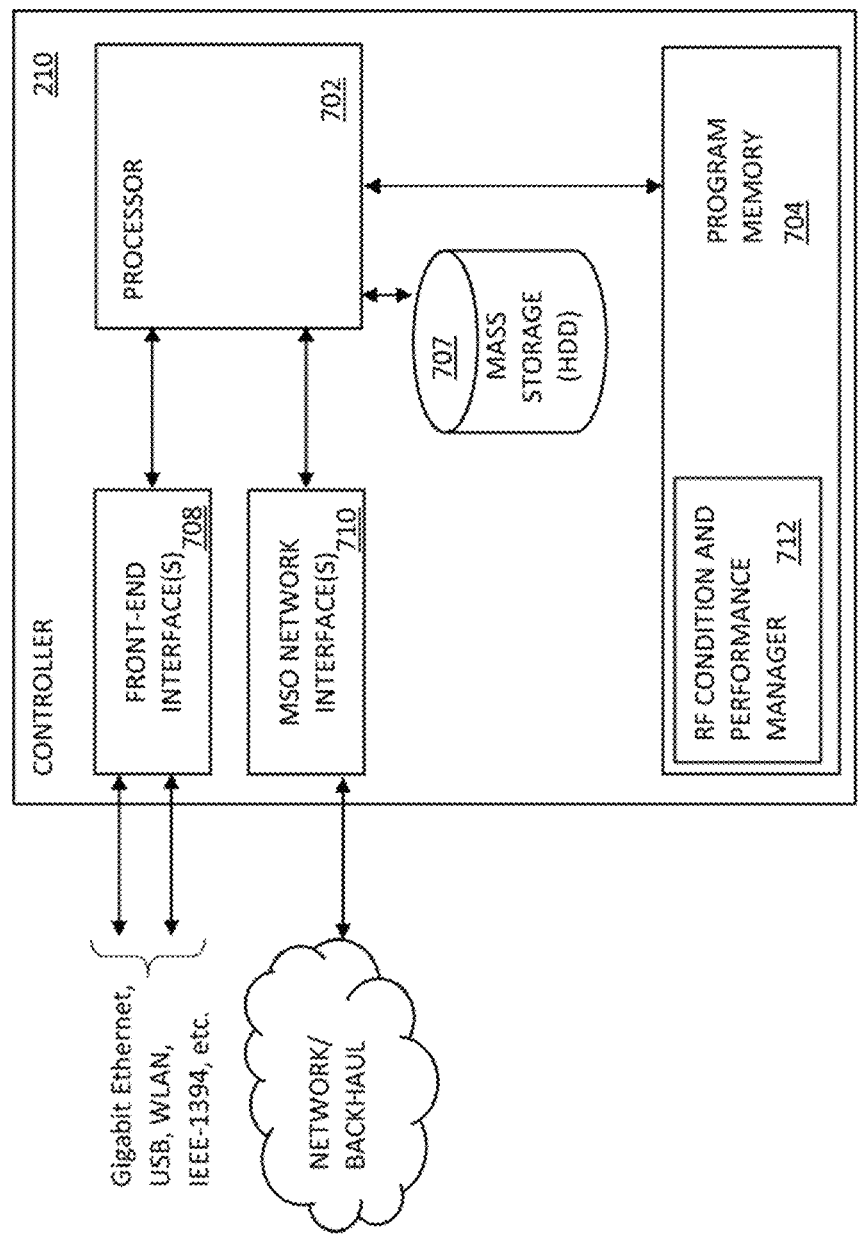
FIG. 7 is a functional block diagram of an exemplary embodiment of a controller apparatus according to the present disclosure.

FIG. 7 illustrates an exemplary embodiment of a controller apparatus 210 according to the present disclosure. As shown, the controller includes, inter alia, a processor 702, a memory module 704, a backend MSO (e.g., headend, backhaul) network interface 710, and a front-end network (e.g., LAN, WLAN) interface 708. Although the exemplary controller 210 may be used as described within the present disclosure, those of ordinary skill in the related arts will readily appreciate, given the present disclosure, that the controller apparatus may be virtualized and/or distributed within other core network entities (thus having ready access to power for continued operation), and hence the foregoing apparatus 210 is purely illustrative.

More particularly, the exemplary controller 210 can be located within near or at the centralized manager, e.g., MSO; an intermediate entity, e.g., within a data center, such as an AP controller; and/or within "cloud" entities or other portions of the infrastructure of which the rest of the wireless network (as discussed supra) is a part. In some embodiments, the controller 210 may be one of several controllers, each having equivalent effectiveness or different levels of use, e.g., within a hierarchy (e.g., controller 210 may be under a "parent" controller that manages multiple slave or subordinate controllers, such as those serving individual venues or portions of a particular venue).

In one embodiment, the processor 702 may include one or more of a digital signal processor, microprocessor, field-programmable gate array, or plurality of processing components mounted on one or more substrates. The processor 702 may also comprise an internal cache memory. The processing subsystem is in communication with a memory subsystem 704, the latter including memory which may for example comprise SRAM, flash, and/or SDRAM components. The memory subsystem may implement one or more of DMA type hardware, so as to facilitate data accesses as is well known in the art. The memory subsystem of the exemplary embodiment contains computer-executable instructions which are executable by the processor subsystem. A mass storage device (e.g., HDD) 707 may also be included for e.g., non-volatile storage of data files, programs, etc.

The processing apparatus 702 is configured to execute at least one computer program stored in memory 704. The computer program of the exemplary embodiment shown includes a RF condition and performance manager application program 712. The RF condition and performance manager 712 is software or firmware module that executes on the processor 702 to implement (or facilitate implementation of) the methods described above with respect to FIGS. 3-4b, as applicable. The RF condition and performance manager is configured to manage signals or messages received upstream (sent from, e.g., an AP such as one utilizing the architecture 200 of FIG. 2) that contain, inter alia, (i) information that allows the controller (or other network devices that receive and/or relay the signal upstream) to ascertain that the RF conditions of the AP, (ii) information about the origin/routing of the signal, and/or (iii) instructions on handling of the signal.

In some embodiments, application program interfaces (APIs) such as those included in an MSO-provided applications 712, installed with other proprietary software, or natively available on the controller apparatus (e.g., as part of the computer program noted supra or exclusively internal to the RF condition and performance manager module logic 712) may also reside in the internal cache or other memory 704. Such APIs may include common network protocols or programming languages configured to enable communication with other network entities as well as receipt and transmit signals that a receiving device (e.g., AP) may interpret.

In one embodiment, the controller 210 is configured to register known downstream devices, other backend devices, and wireless client devices (remotely located or otherwise), and centrally control the broader wireless network (and any constituent sub-networks). Such configuration include, e.g., providing network identification (e.g., to APs, CMs and other downstream devices, or to upstream devices), managing network congestion, and managing capabilities supported by the wireless network.

In one embodiment, the backend interface 710 is configured to transact one or more network address packets with other networked devices, particularly backend apparatus necessary to communicate with the centralized server 201 (e.g., CMTS, Layer 3 switch, network monitoring center, MSO) according to a network protocol. Common examples of network routing protocols include for example: Internet Protocol (IP), Internetwork Packet Exchange (IPX), and Open Systems Interconnection (OSI) based network technologies (e.g., Asynchronous Transfer Mode (ATM), Synchronous Optical Networking (SONET), Synchronous Digital Hierarchy (SDH), Frame Relay). In one embodiment, the backend network interface 710 operates in signal communication with the backbone of the content delivery network (CDN), such as that of FIGS. 1-2. These interfaces might comprise, for instance, GbE (Gigabit Ethernet) or other interfaces of suitable bandwidth capability.

It will also be appreciated that the two interfaces 708, 710 may be aggregated together and/or shared with other extant data interfaces, such as in cases where a controller function is virtualized within another component, such as an MSO network server performing that function.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. This description is in no way meant to be limiting, but rather should be taken as illustrative of the general principles of the disclosure. The scope of the disclosure should be determined with reference to the claims.

It will be further appreciated that while certain steps and aspects of the various methods and apparatus described herein may be performed by a human being, the disclosed aspects and individual methods and apparatus are generally computerized/computer-implemented. Computerized apparatus and methods are necessary to fully implement these aspects for any number of reasons including, without limitation, commercial viability, practicality, and even feasibility (i.e., certain steps/processes simply cannot be performed by a human being in any viable fashion).

What is claimed is:

1. A computerized method of dynamically and automatically providing venue location assignments to a user within a venue using a computerized system, the computerized method comprising:

obtaining, at the computerized system, data representative of a request for evaluation from a computerized mobile device of the user, the computerized mobile device located at a first location within the venue;

based at least on the request, obtaining first data relating to radio frequency (RF) signal performance within the venue under a then-current configuration of the venue;

based at least on the first data, generating a computer spatial model of the venue, the computer spatial model identifying variations in said RF signal performance as a function of at least two dimensions;

based at least on the computer spatial model, identifying at least one second location of the venue with a predicted level of RF signal performance greater than that of the first location, wherein the identifying of the at least second location is further based at least on a target spatial distribution of bandwidth demand within the venue;

transmitting notification data, via the computerized system, to the computerized mobile device, the notification data configured to notify the computerized mobile device of the at least one second location, the transmitting of the notification data based on both the predicted level of RF signal performance being greater than that of the first location and the target spatial distribution;

based on a physical change to the then-current configuration, generating an updated computer spatial model;

based at least on the updated computer spatial model, identifying at least one third location of the venue with a predicted level of RF signal performance greater than that of the at least one second location; and transmitting second notification data, via the computerized system, to the computerized mobile device, the second notification data configured to notify the computerized mobile device of the at least one third location.

2. The computerized method of claim 1, wherein the obtaining of the first data relating to the radio frequency (RF) signal performance within the venue under the then-current configuration of the venue comprises utilizing at least a plurality of wireless access points disposed at respective prescribed locations within the venue to report, in real time, data relating to at least one RF performance parameter.

3. The computerized method of claim 2, wherein the identifying of the at least one second location of the venue with the predicted level of the RF signal performance greater than that of the first location based at least on the computer spatial model, comprises correlating at least the prescribed locations to respective locations of seating within the venue.

4. The computerized method of claim 1, wherein the identifying of the at least one second location of the venue with the predicted level of the RF signal performance greater than that of the first location based at least on the computer spatial model, comprises correlating the at least one second location to a seat within a seating area of the venue, and the computerized method further comprises:

requesting an automated seat management process, via an application programming interface (API) call, to provide data indicative of a current availability of the seat.

5. The computerized method of claim 1, wherein the obtaining of the first data relating to the radio frequency (RF) signal performance within the venue under the then-current configuration of the venue comprises:

utilizing at least a plurality of wireless access points disposed at prescribed locations within the venue to report, in real time, data relating to at least one RF-related operational parameter; and utilizing one or more RF sensors disposed at one or more respective locations in the venue to report, in real time, data relating to one or more RF performance parameters sensed by the one or more RF sensors.

6. The computerized method of claim 5, wherein at least one of the one or more RF sensors is disposed on a mobile apparatus within the venue, the mobile apparatus having a respective location changing as a function of time.

7. The computerized method of claim 5, wherein the generating of the computer spatial model comprises utilizing at least one computer program to model RF signal propagation within the venue in at least one prescribed frequency band according to one or more three-dimensional propagation models, the modeling of the RF signal propagation based at least in part on data representative of a proposed physical configuration of at least a portion of the venue.

8. The computerized method of claim 7, wherein the modeling of the RF signal propagation based at least in part on the data representative of the proposed physical configuration of at least the portion of the venue comprises categorizing a plurality of portions of the venue according to physical configurations for different types of RF interference or attenuation modalities.

9. The computerized method of claim 8, wherein the categorizing the plurality of portions of the venue according to the physical configuration for the different types of the RF interference or attenuation modalities comprises categorizing at least with respect to: (i) fading; (ii) absorption; and (iii) interferer density.

10. The computerized method of claim 7, wherein the modeling of the RF signal propagation based at least in part on the data representative of the proposed physical configuration of at least the portion of the venue comprises categorizing at least portions of the venue as modified compared to a baseline configuration, and the computerized method further comprises estimating one or more signal propagation effects within the at least portions based on data descriptive of structural modifications made thereto.

11. The computerized method of claim 1, wherein the target spatial distribution is configured to minimize clustering of computerized mobile devices at certain ones of individual locations of the venue, the minimization of clustering reducing wireless signal interference between at least the computerized mobile device of the user and one other computerized mobile device within the venue.

12. The computerized method of claim 11, wherein:
the user comprises a subscriber of a managed content network; and
the target spatial distribution is selectively applied to only the computerized mobile device of the user and computerized mobile devices of one or more other subscribers of the managed content network.

13. The computerized method of claim 1, wherein:
the user comprises a subscriber of a managed content network; and
the target spatial distribution is selectively applied to only the computerized mobile device of the user and computerized mobile devices of one or more other subscribers of the managed content network.

14. The computerized method of claim 1, wherein the target spatial distribution is configured to minimize adjacent channel interference (ACI) between the computerized mobile device of the user and at least one other computerized mobile device within the venue, the minimization based at least on respective one or more radio frequency carriers utilized to service the computerized mobile device of the user and the at least one other computerized mobile device within the venue.

15. Computerized network apparatus configured to enable dynamic user-specific location allocation to obtain a desired level of wireless LAN (WLAN) performance, the computerized network apparatus comprising:

computerized controller apparatus configured to control operation of a plurality of WLAN access points (APs) operative within a venue so as to obtain location-specific WLAN operating data from the plurality of WLAN APs; and computerized processing apparatus in data communication with the computerized controller apparatus and configured to:
(i) obtain the location-specific WLAN operating data;
(ii) correlate the location-specific WLAN operating data to one or more prescribed locations within the venue;

(iii) estimate WLAN performance at a plurality of other locations within the venue based at least on the location-specific WLAN operating data and the correlation;

(iv) evaluate the estimated WLAN performance associated with at least one of the plurality of other locations against a current location of a computerized user mobile device; and (v) based at least on the evaluation, cause transmission of data to the computerized user mobile device, the transmitted data relating to the estimated WLAN performance associated with the at least one other location;

wherein the computerized processing apparatus is further configured to:

repeat at least (i)-(iv) above based on a modification to a physical configuration of the venue; and cause transmission of second data to the computerized user mobile device, the second data relating to the estimated WLAN performance associated with the at least one other location, the causation of the transmission based at least on the estimated WLAN performance associated with the at least one other location being greater than WLAN performance associate with the current location of the computerized user mobile device;

wherein the transmission comprises transmission of a data structure to the computerized user mobile device, the data structure configured to enable extraction of the data therefrom without establishment of an attachment by the computerized user mobile device, the data comprising API (application programming interface) data which a computer application program of the computerized user mobile device may utilize to obtain the second data.

16. The computerized network apparatus of claim f, wherein:

the computerized controller apparatus is further configured to control operation of a plurality of radio frequency sensors operative within the venue so as to obtain location-specific RF parametric data from the plurality of radio frequency sensors; and the computerized processing apparatus is further configured to utilize the location-specific RF parametric data as part of said estimation of the WLAN performance.

17. The computerized network apparatus of claim 16, wherein the obtained location-specific RF parametric data from the plurality of radio frequency sensors comprises at least a received signal strength indication (RSSI) for each of the plurality of radio frequency sensors.

18. The computerized network apparatus of claim 15, wherein the data structure comprises a Wi-Fi beacon frame, and the extraction of the data from the data structure comprises extraction of information bit-stuffed into the Wi-Fi beacon frame.

19. Computer readable apparatus, the computer readable apparatus comprising a storage medium having at least one computer program disposed thereon, the at least one computer program comprising a plurality of instructions which are configured to, when executed on a digital processing apparatus:

receive first data representative of a request for service from a computerized mobile device of a user, the computerized mobile device located at a first location within a venue;

based at least on the first data, receive second data relating to at least radio frequency (RF) signal performance associated with the first location;

identify at least one second location of the venue, the at least one second location having a predicted level of RF signal performance greater than the RF signal performance of the first location, wherein the identification of the at least second location is based at least on a target spatial distribution of bandwidth demand within the venue; and transmit notification data to the computerized mobile device, the notification data configured to notify the computerized mobile device of the second location.

20. The computer readable apparatus of claim 19, wherein the receipt of the second data relating to the RF signal performance associated with the first location comprises utilization of at least one wireless access point disposed at the first location to report, in real time, data relating to at least one RF performance parameter.

21. The computer readable apparatus of claim 20, wherein:

the identification of the at least one second location comprises a correlation of the first location to a seat within the venue; and the plurality of instructions are further configured to, when executed on the digital processing apparatus:

cause execution of an automated seat management process, via an application programming interface (API) call, to provide to the computerized mobile device data indicative of a current availability of the seat.

22. The computer readable apparatus of claim 19, wherein:

the receipt of the second data relating to the RF signal performance associated with the first location comprises:

utilization of at least a plurality of wireless access points disposed at prescribed locations within the venue to report, in real time, data relating to at least one RF-related operational parameter; and utilization of one or more RF sensors disposed at one or more respective locations in the venue to report, in real time, data relating to one or more RF performance parameters sensed by the one or more RF sensors; and at least one of the one or more RF sensors is disposed on a mobile apparatus within the venue, the mobile apparatus having a respective location changing as a function of time.

23. The computer readable apparatus of claim 19, wherein the plurality of instructions are further configured to, when executed on the digital processing apparatus:

based at least on the second data, generate a computer spatial model of the venue, the computer spatial model indicative of variations in RF signal performance associated with a plurality of respective locations within the venue as a function of at least two dimensions.

24. The computer readable apparatus of claim 19, wherein:

the generation of the computer spatial model comprises utilization of the at least one computer program to model the RF signal performance associated with the plurality of respective locations within the venue in at least one prescribed frequency band according to one or more three-dimensional propagation models; and the modeling of the RF signal performance associated with the plurality of respective locations within the venue is based at least in part on data representative of a proposed physical configuration of at least a portion of the venue, the data representative of the proposed physical configuration of at least the portion of the venue being one of a plurality of portions of the venue categorized according to physical configurations for different types of RF interference or attenuation modalities.

25. The computer readable apparatus of claim 24, wherein the categorization of the plurality of portions of the venue according to the physical configurations for the different types of the RF interference or attenuation modalities comprises categorization at least with respect to: (i) fading; (ii) absorption; and (iii) interferer density.

26. The computer readable apparatus of claim 24, wherein:
- the categorization of the plurality of portions of the venue according to the physical configurations for the different types of the RF interference or attenuation modalities comprises categorization of one or more of the plurality of portions of the venue as modified compared to a baseline configuration; and
- the plurality of instructions are further configured to, when executed on the digital processing apparatus:
  - estimate one or more signal propagation effects within the one or more of the plurality of portions of the venue based on data descriptive of structural modifications made thereto.

\* \* \* \* \*